US012249611B2

(12) United States Patent
Saito et al.

(10) Patent No.: US 12,249,611 B2
(45) Date of Patent: Mar. 11, 2025

(54) IMAGING DEVICE, ELECTRONIC DEVICE, AND SIGNAL PROCESSING METHOD WITH PIXEL ARRAY AND MEMORY ARRAY RESPECTIVELY ON FIRST AND SECOND SUBSTRATES

(71) Applicant: Sony Semiconductor Solutions Corporation, Kanagawa (JP)

(72) Inventors: Daisuke Saito, Kanagawa (JP); Katsuhiko Hanzawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/263,042

(22) PCT Filed: Jan. 18, 2022

(86) PCT No.: PCT/JP2022/001540
§ 371 (c)(1),
(2) Date: Jul. 26, 2023

(87) PCT Pub. No.: WO2022/190644
PCT Pub. Date: Sep. 15, 2022

(65) Prior Publication Data
US 2024/0088175 A1 Mar. 14, 2024

(30) Foreign Application Priority Data
Mar. 8, 2021 (JP) .................. 2021-036638

(51) Int. Cl.
*H01L 27/146* (2006.01)
*G06F 17/15* (2006.01)
(Continued)

(52) U.S. Cl.
CPC ...... *H01L 27/14605* (2013.01); *G06F 17/153* (2013.01); *H01L 27/14634* (2013.01);
(Continued)

(58) Field of Classification Search
CPC ......... H01L 27/14605; H01L 27/14634; H01L 27/14636; H01L 27/14641; G06F 17/153;
(Continued)

(56) References Cited

U.S. PATENT DOCUMENTS 5,742,086 A   4/1998 Rostoker
6,043,436 A   3/2000 Folberth
(Continued)

FOREIGN PATENT DOCUMENTS

JP   2020-113809 A   7/2020
JP   2021-005846 A   1/2021
(Continued)

OTHER PUBLICATIONS

"Considerations of Integrating Computing-In-Memory and Processing-In-Sensor into Convolutional Neural Network Accelerators for Low-Power Edge Devices", 2019 Symposium on VLSI Technology, IEEE, Jul. 29, 2019, DOI: 10.23919/VLSIC.2019.8778074 (Year: 2019).*

(Continued)

*Primary Examiner* — Jennifer D Bennett
(74) *Attorney, Agent, or Firm* — Michael Best & Friedrich LLP

(57) ABSTRACT

Image processing with reduced power consumption is disclosed. In one example, an imaging device includes a first substrate with a pixel array that outputs a pixel signal obtained by photoelectrically converting incident light in a first direction. A second substrate includes a memory array that outputs a convolution signal indicating a result of a product-sum operation of an input signal based on the pixel signal in a second direction. The first substrate and the second substrate at least partially overlap each other.

18 Claims, 46 Drawing Sheets

(51) Int. Cl.
- *H04N 25/77* (2023.01)
- *H04N 25/771* (2023.01)
- *H04N 25/772* (2023.01)
- *H04N 25/778* (2023.01)
- *H04N 25/78* (2023.01)
- *H04N 25/79* (2023.01)

(52) U.S. Cl.
CPC .. *H01L 27/14636* (2013.01); *H01L 27/14641* (2013.01); *H04N 25/77* (2023.01); *H04N 25/771* (2023.01); *H04N 25/772* (2023.01); *H04N 25/778* (2023.01); *H04N 25/78* (2023.01); *H04N 25/79* (2023.01)

(58) Field of Classification Search
CPC ... G06F 3/0659; G06F 15/7821; H04N 25/77; H04N 25/771; H04N 25/772; H04N 25/778; H04N 25/78; H04N 25/79; G06N 3/063

See application file for complete search history.

(56) References Cited

U.S. PATENT DOCUMENTS

| | | | |
|---|---|---|---|
| 2012/0120293 A1* | 5/2012 | Mabuchi | H04N 25/78 |
| | | | 348/E5.031 |
| 2019/0035154 A1* | 1/2019 | Liu | H04N 25/00 |
| 2019/0053406 A1 | 2/2019 | Tezuka | |
| 2019/0074319 A1 | 3/2019 | Itonaga | |
| 2020/0243590 A1* | 7/2020 | Yamagishi | H01L 27/14636 |
| 2020/0412982 A1* | 12/2020 | Haneda | H04N 25/772 |

FOREIGN PATENT DOCUMENTS

| | | |
|---|---|---|
| WO | 2017209221 A1 | 12/2017 |
| WO | WO-2020145142 A1 | 7/2020 |

OTHER PUBLICATIONS

International Search Report (PCT/ISA/210), International Application No. PCT/JP2022/001540, dated Mar. 29, 2022.

\* cited by examiner

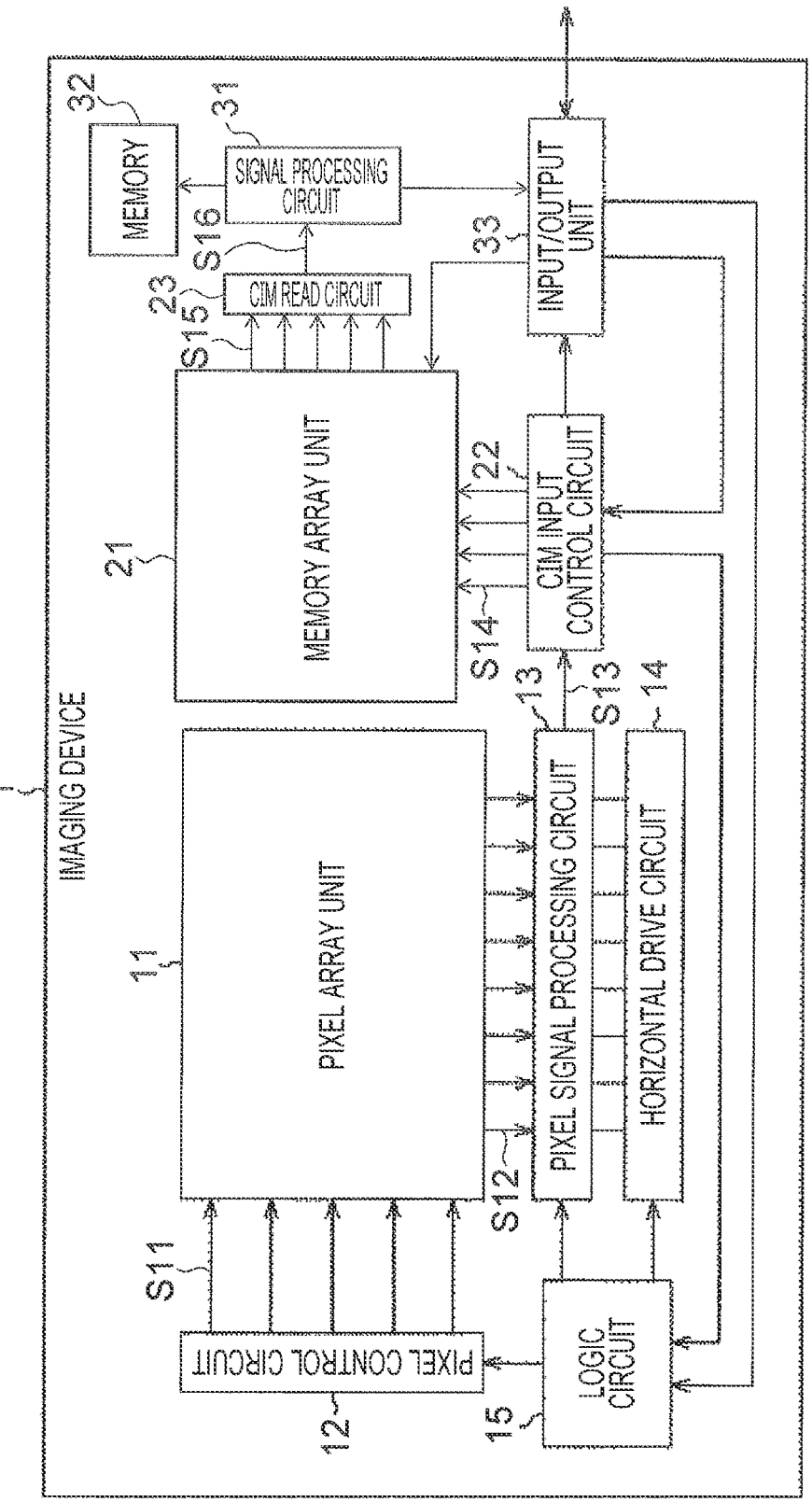

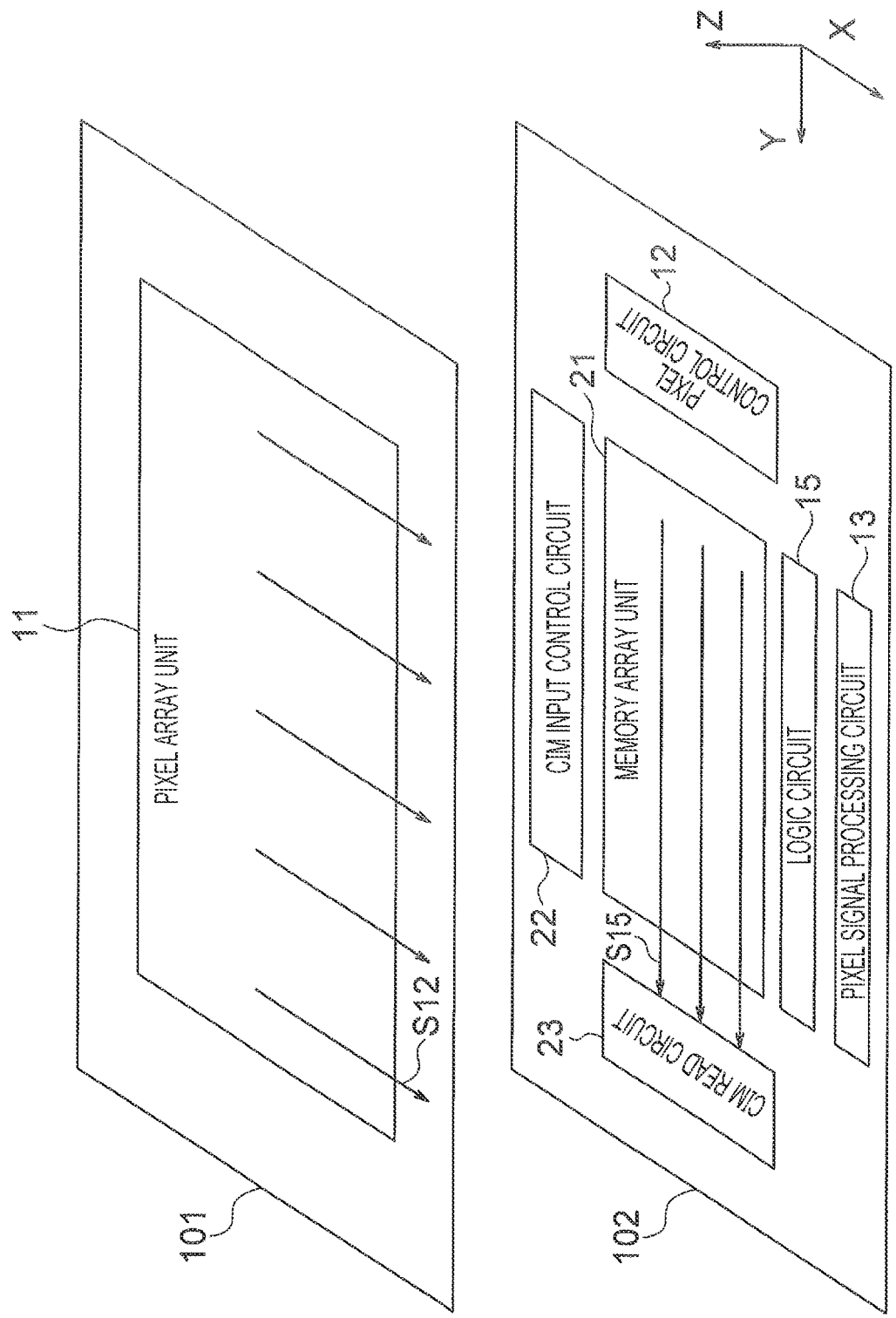

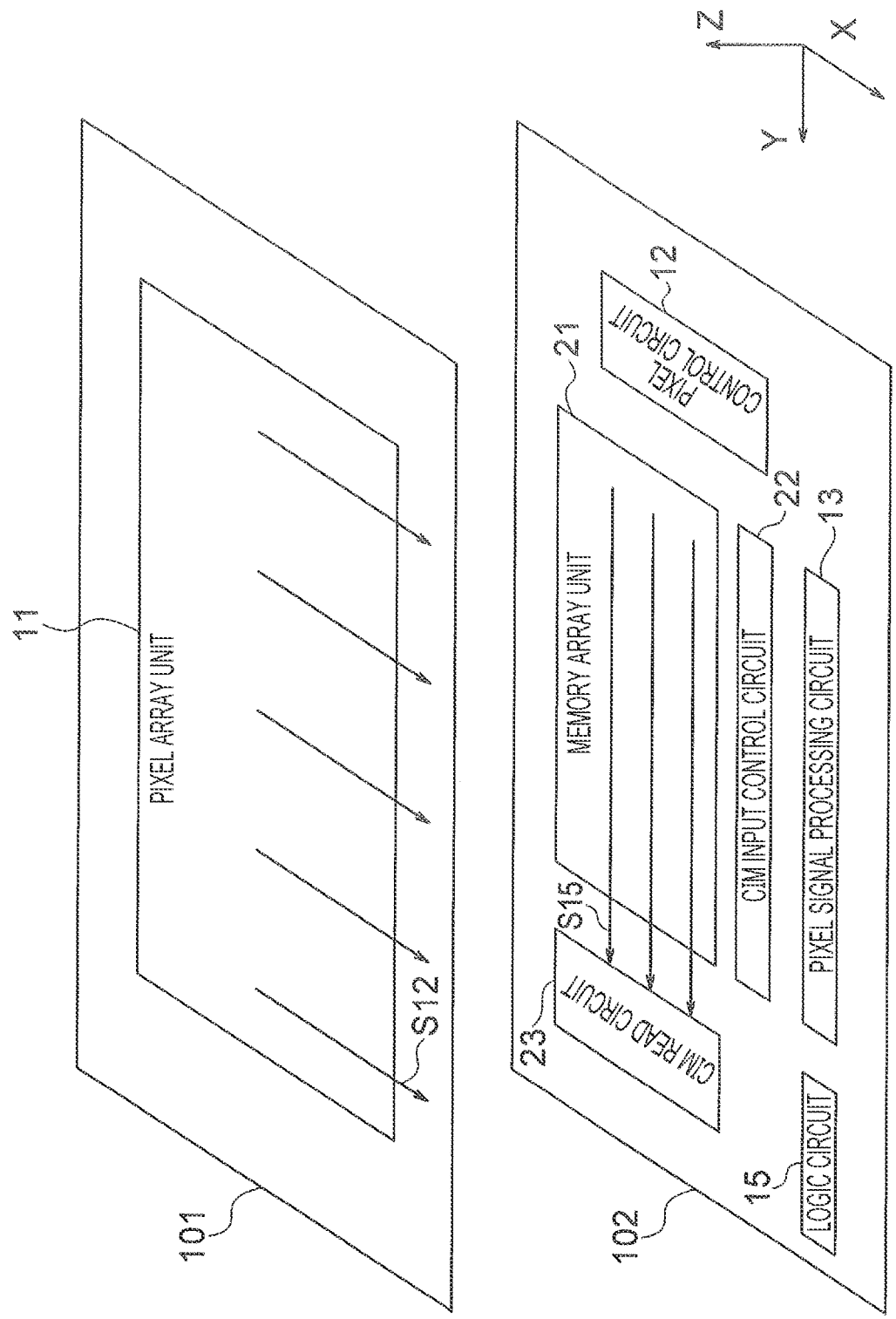

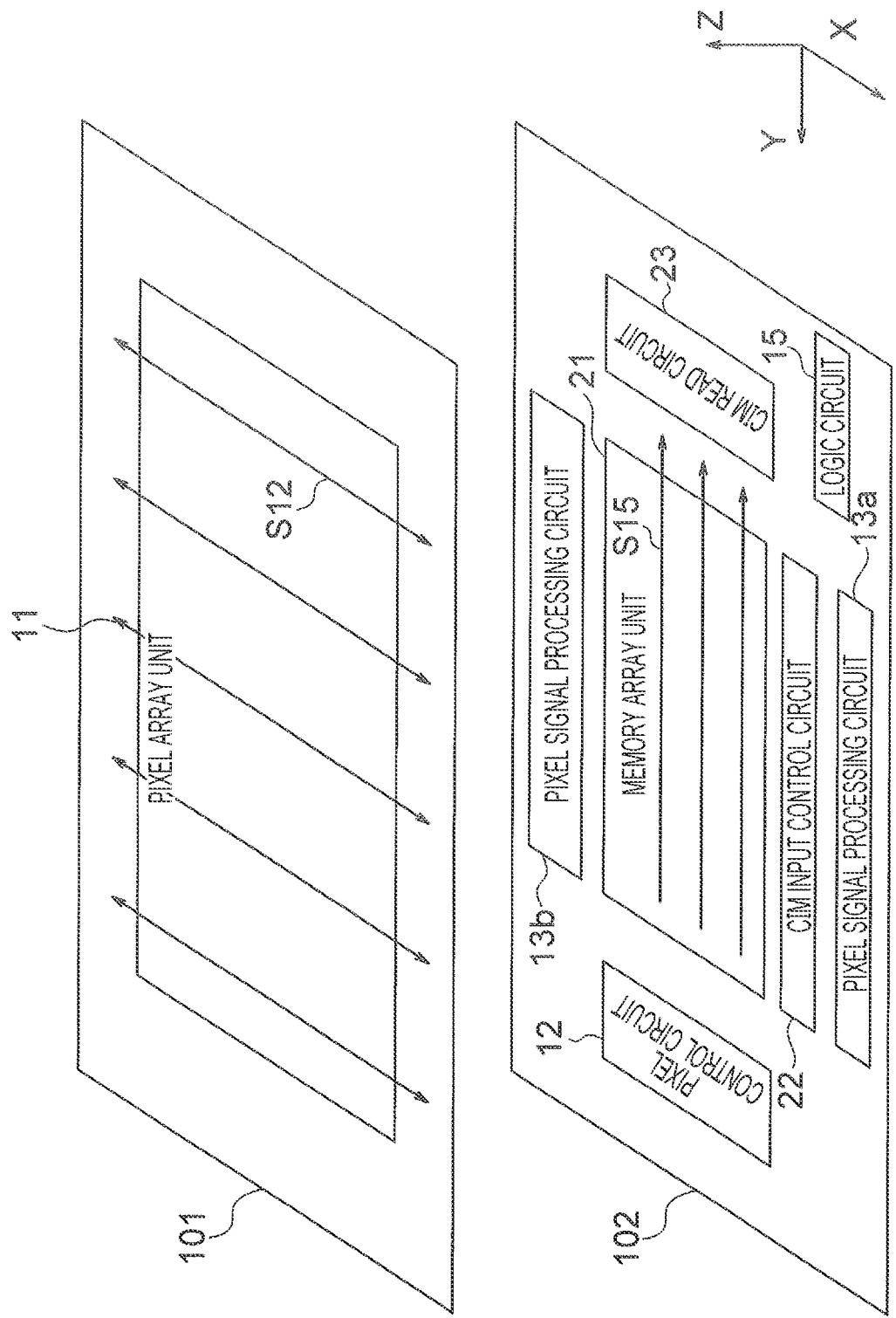

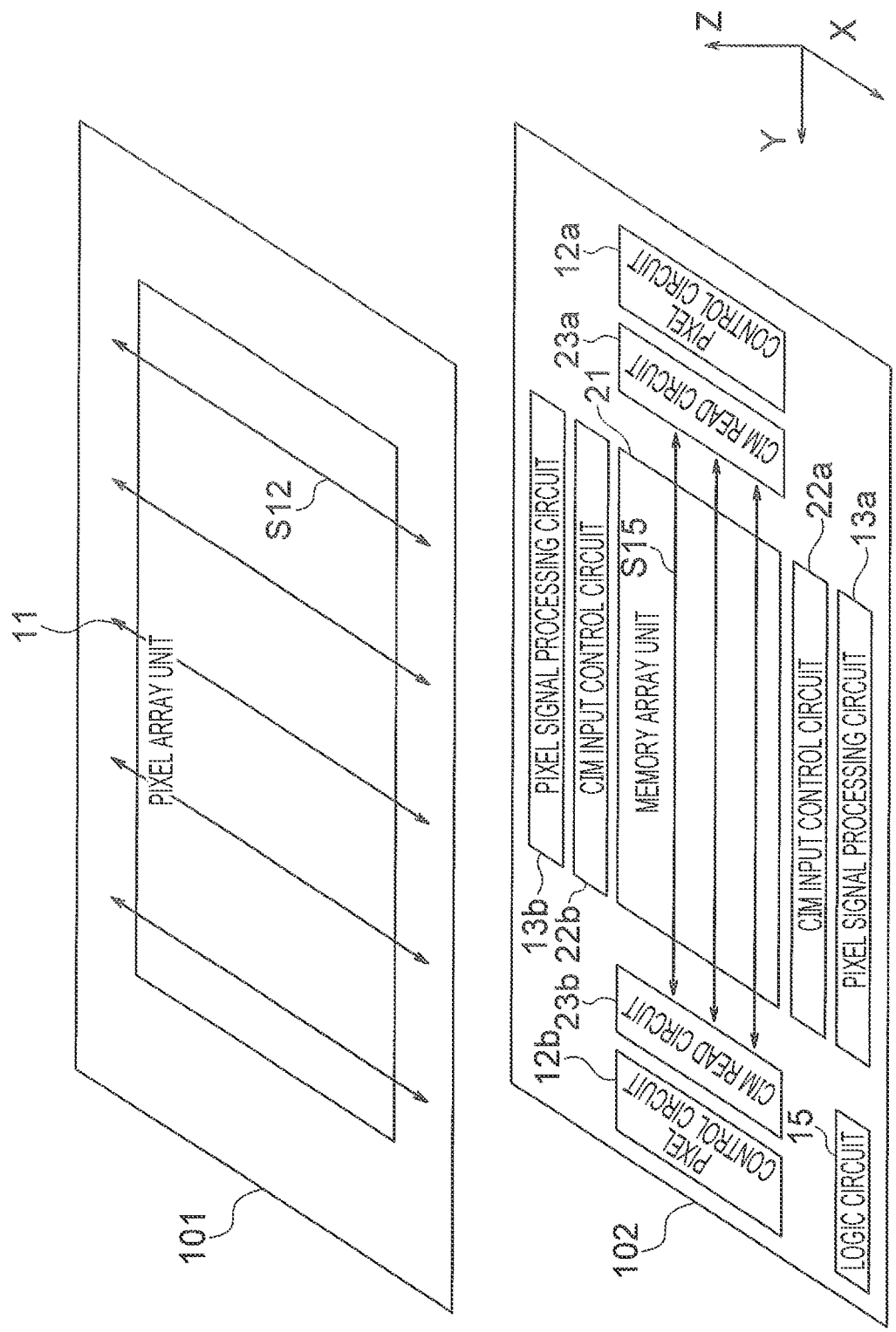

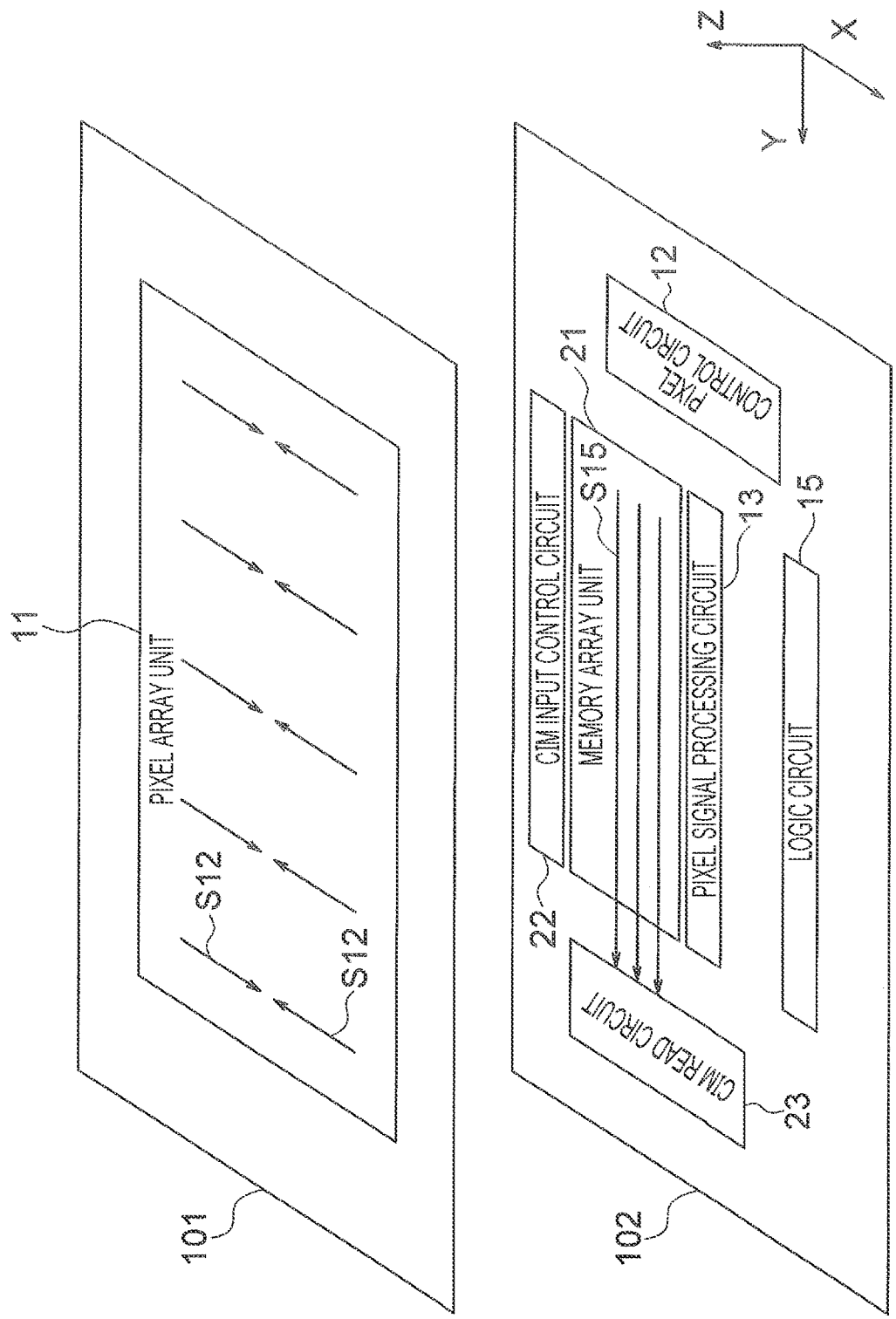

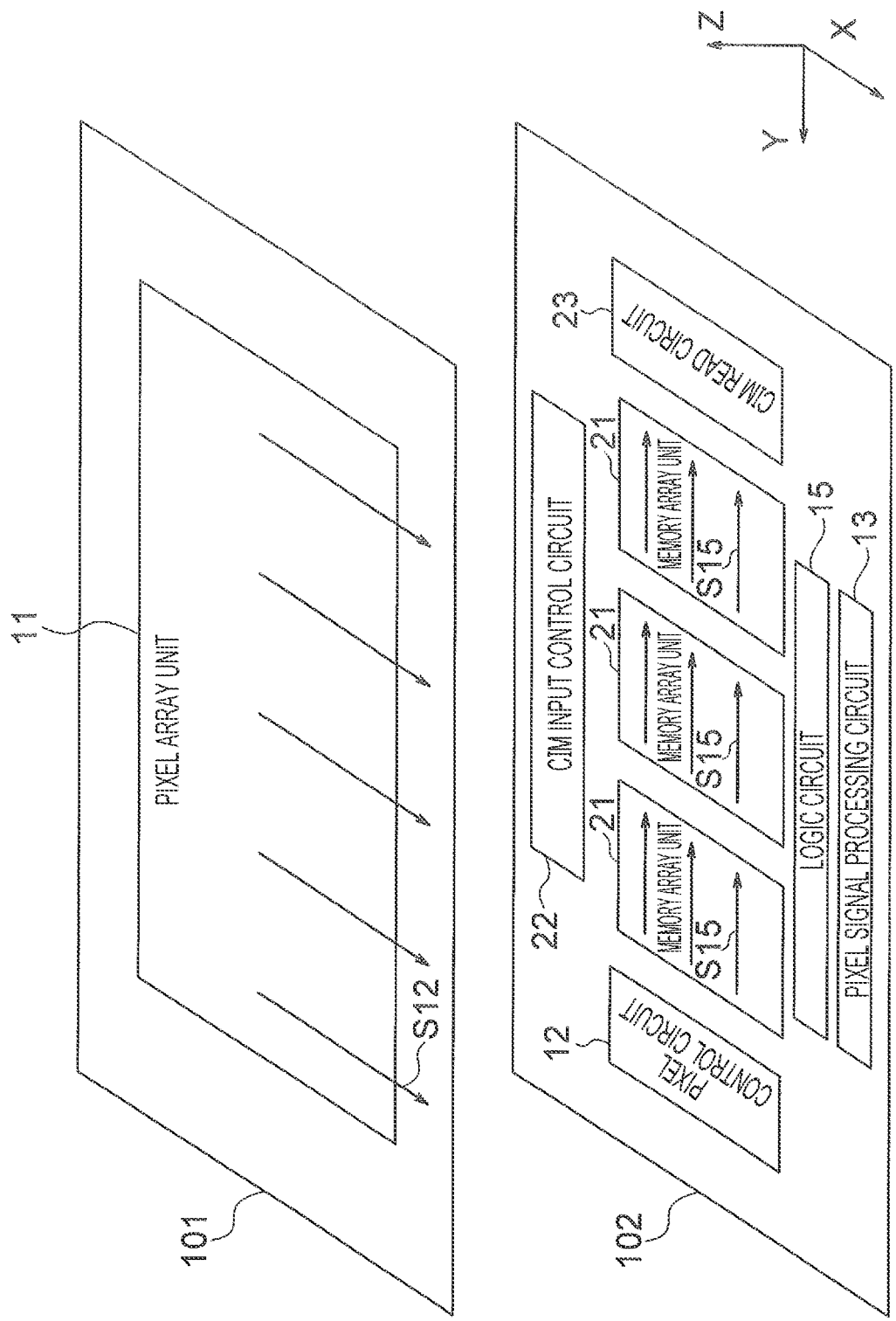

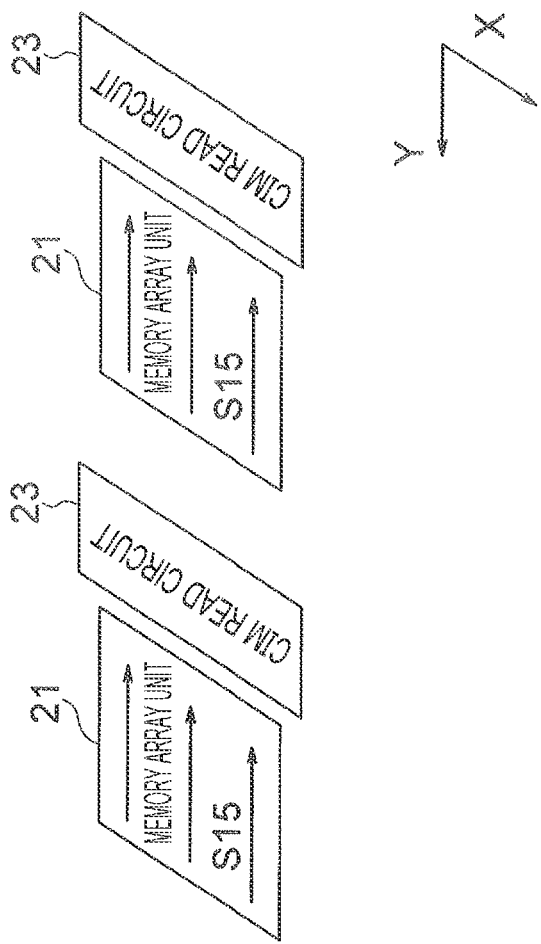
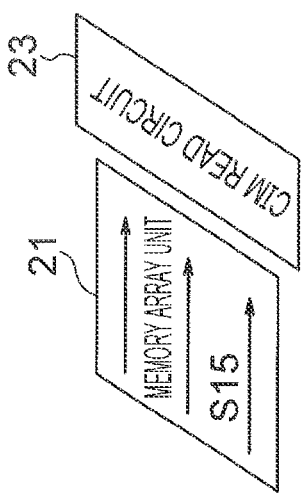
FIG. 3B

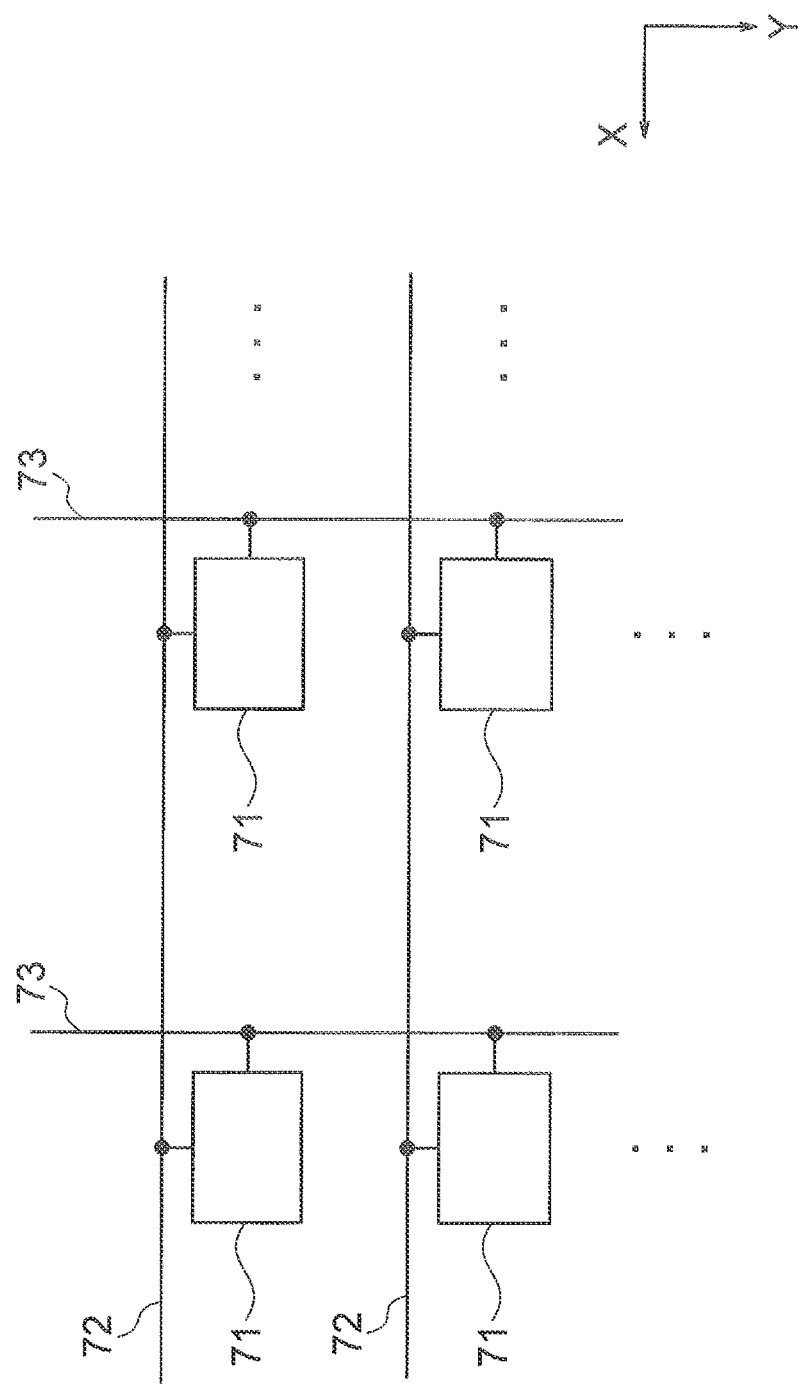

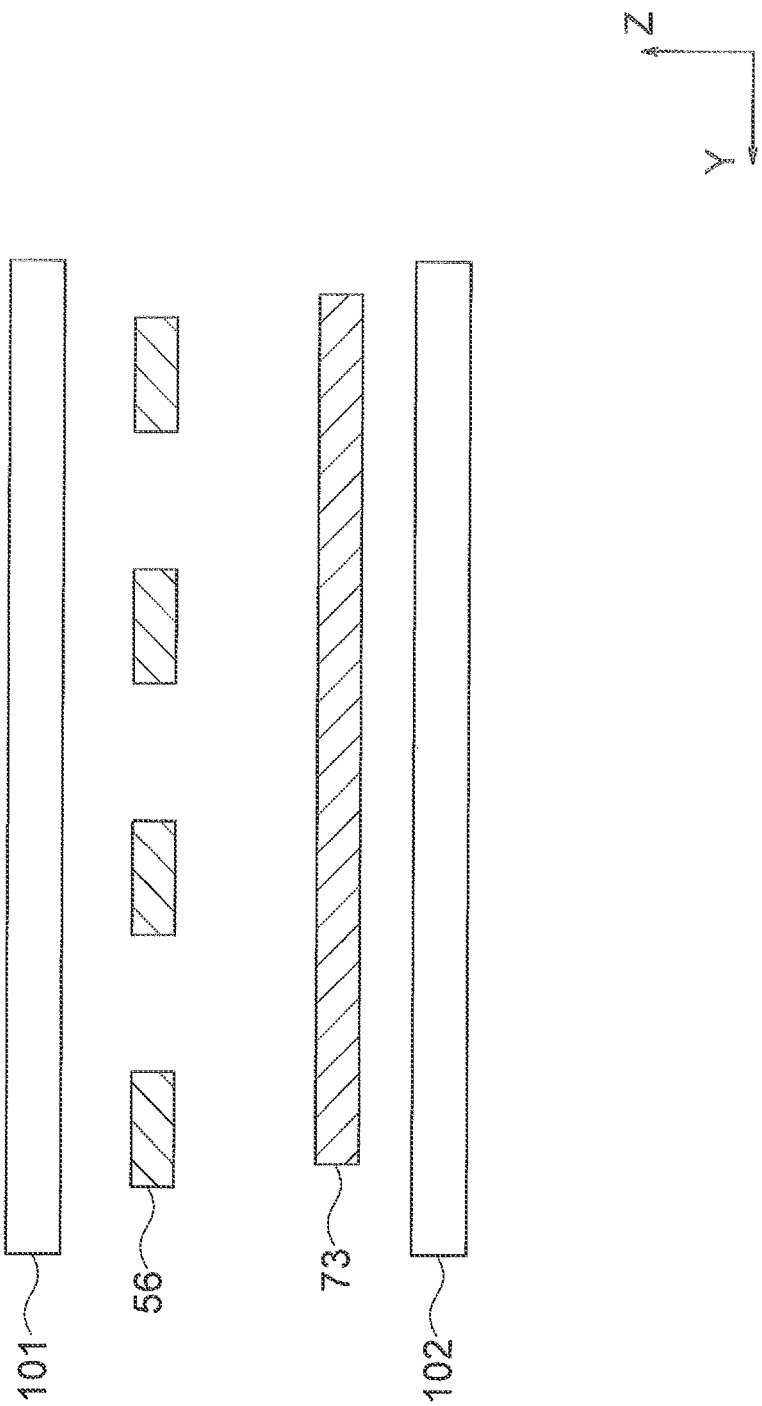

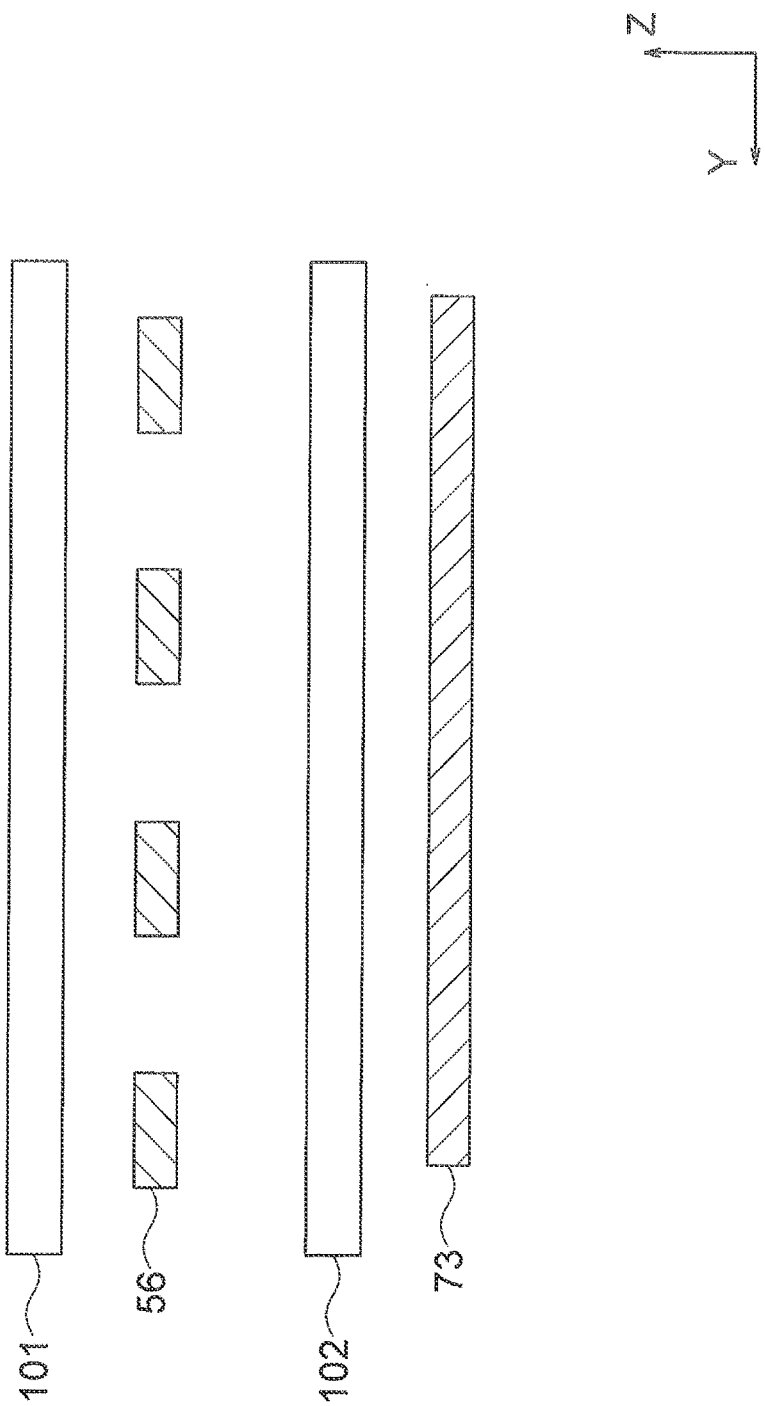

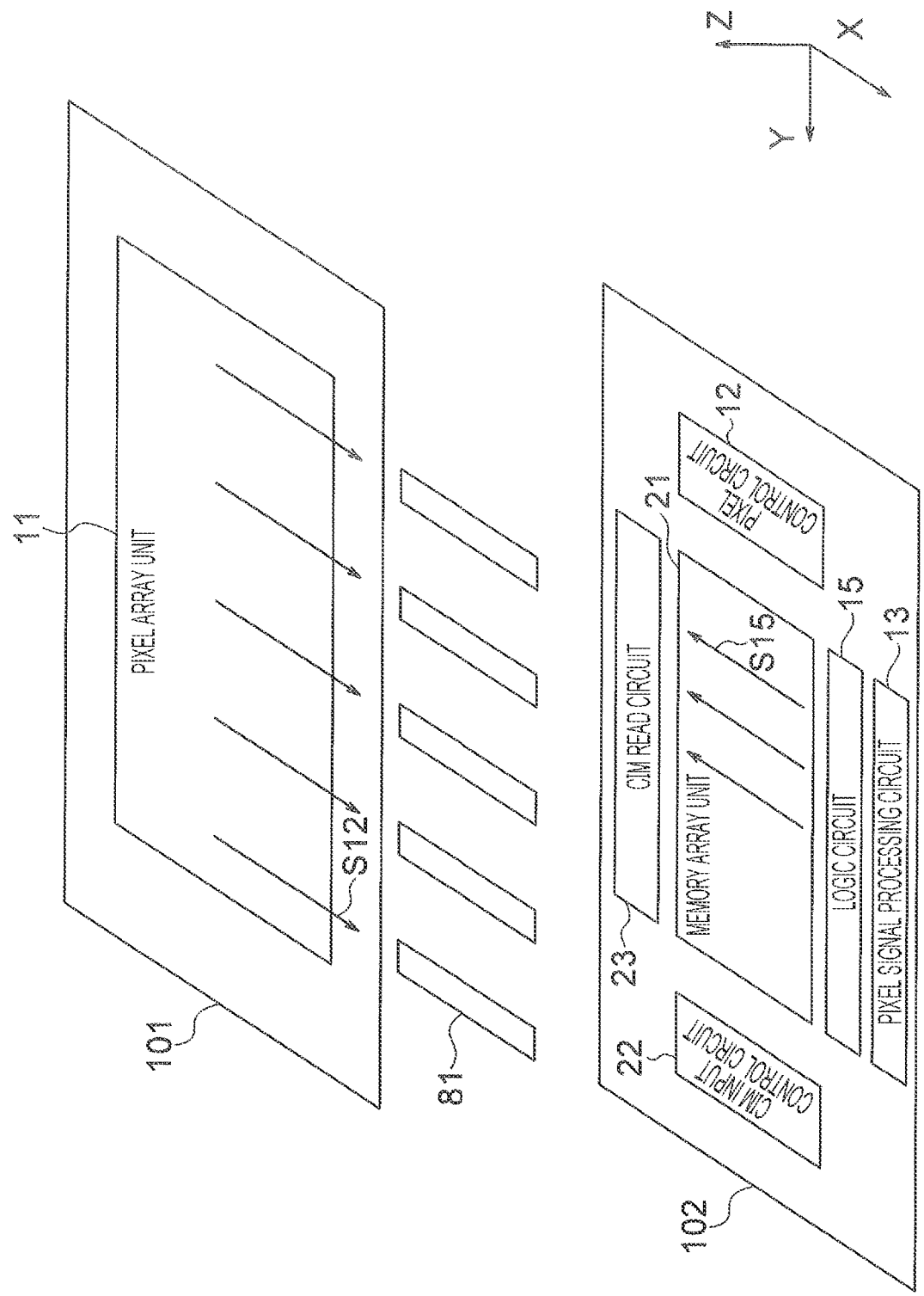

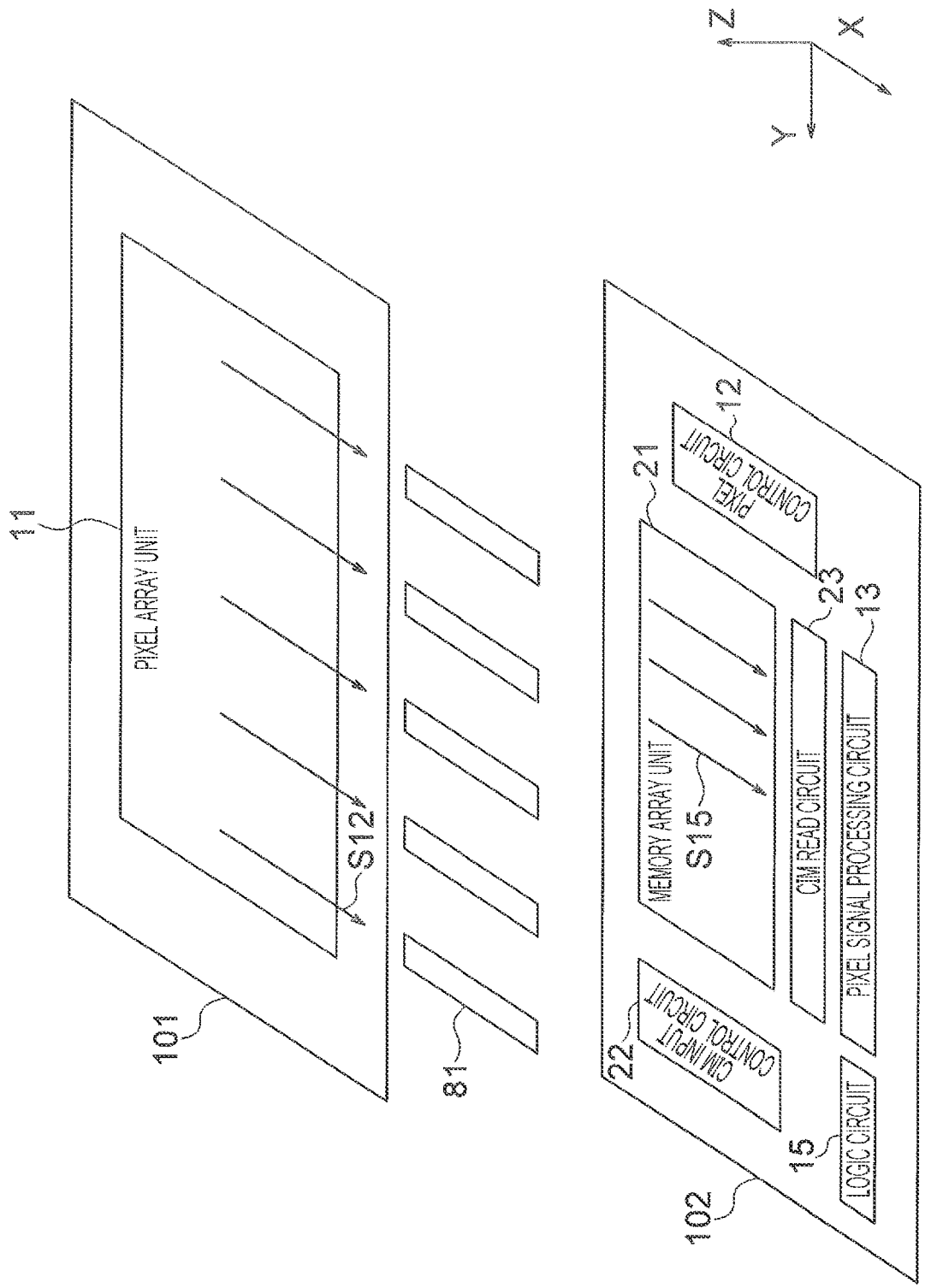

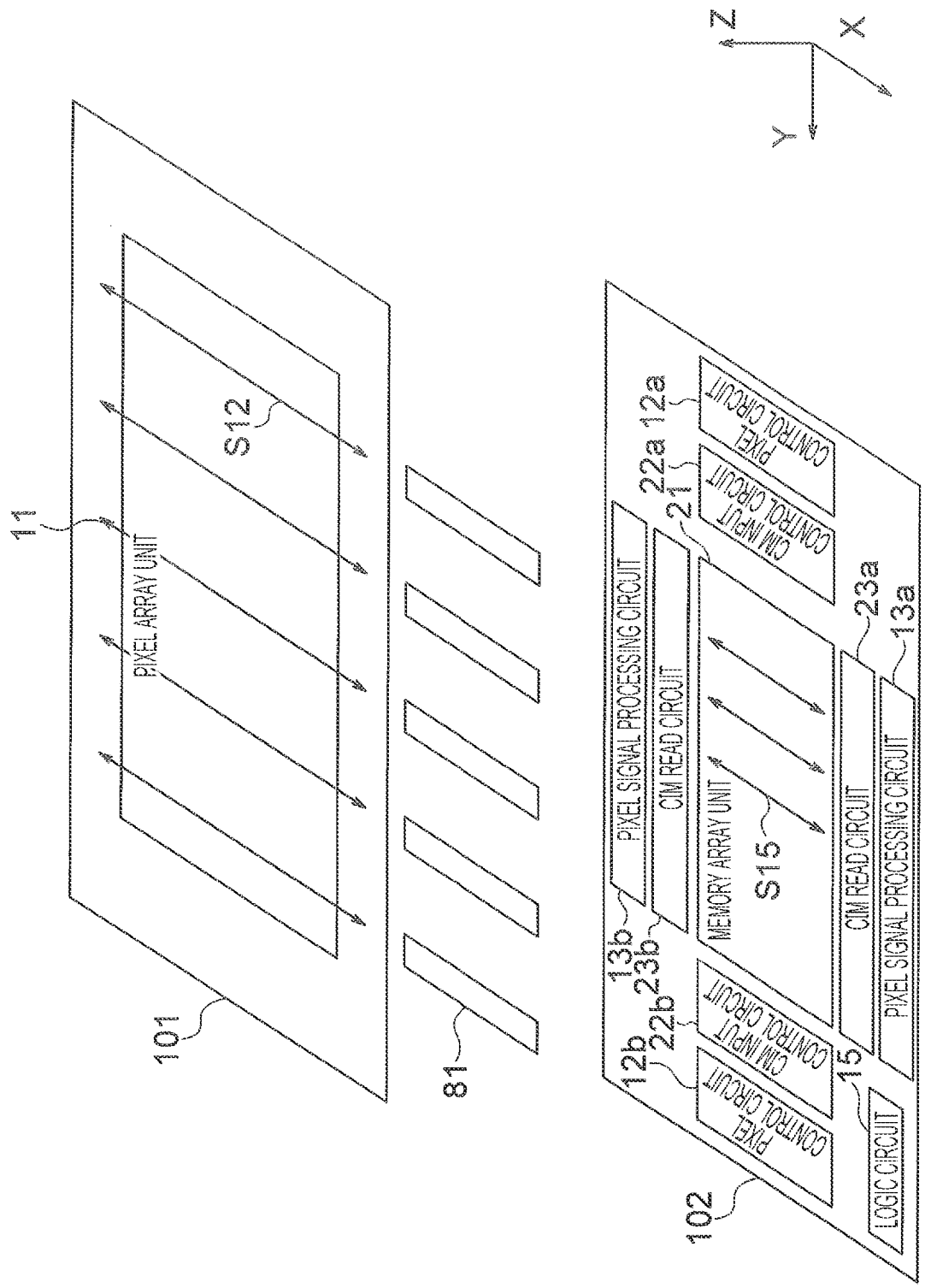

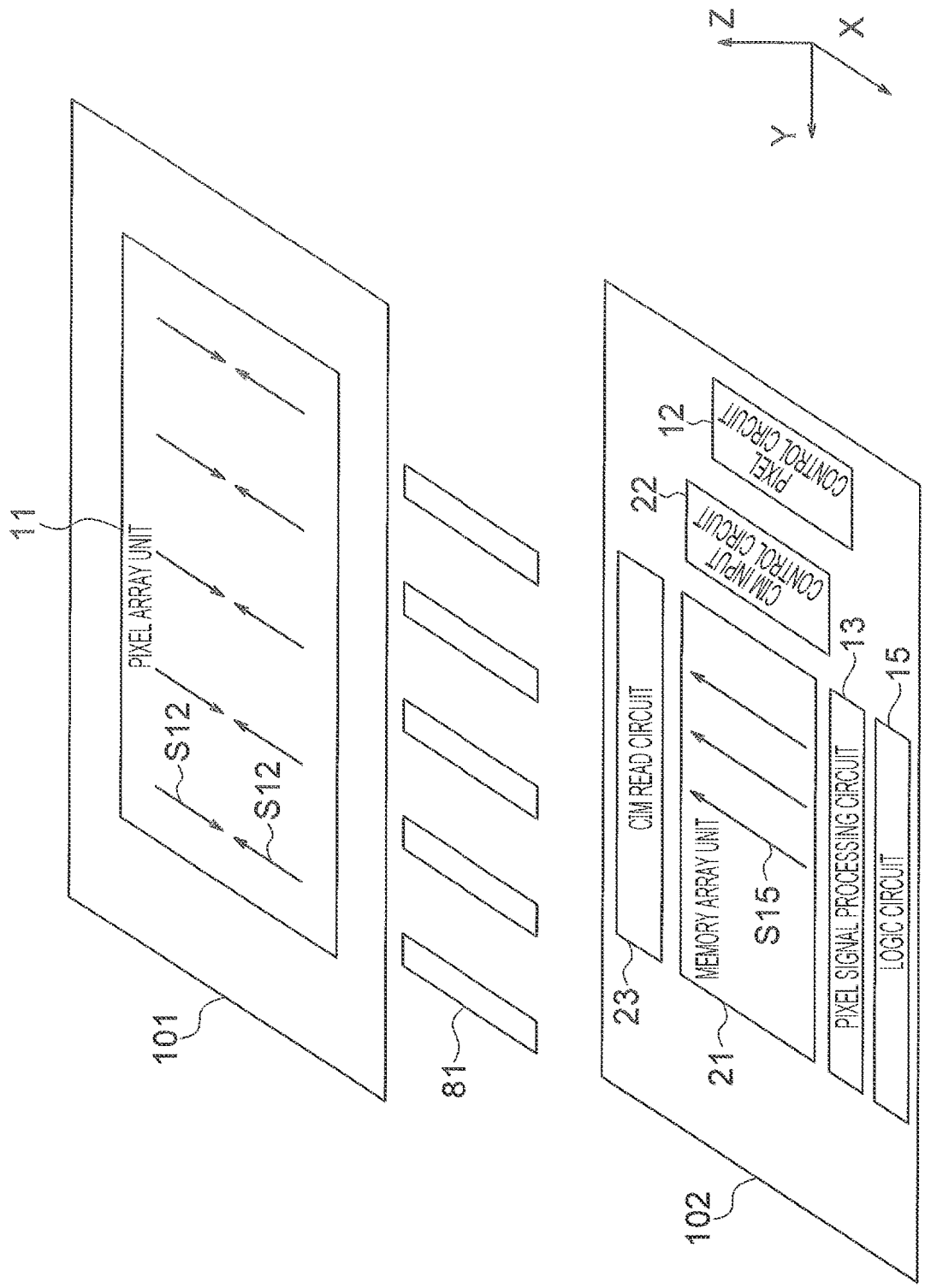

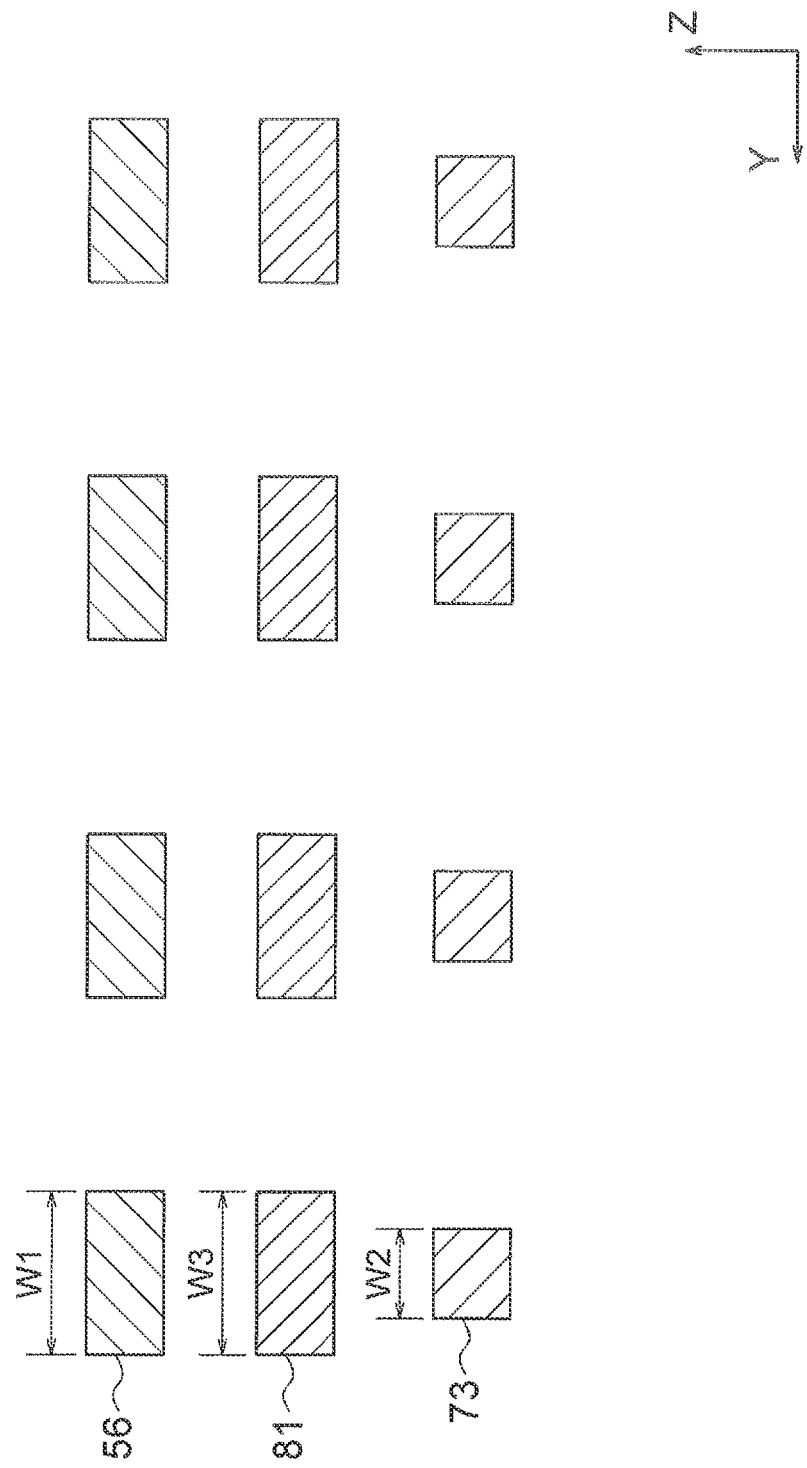

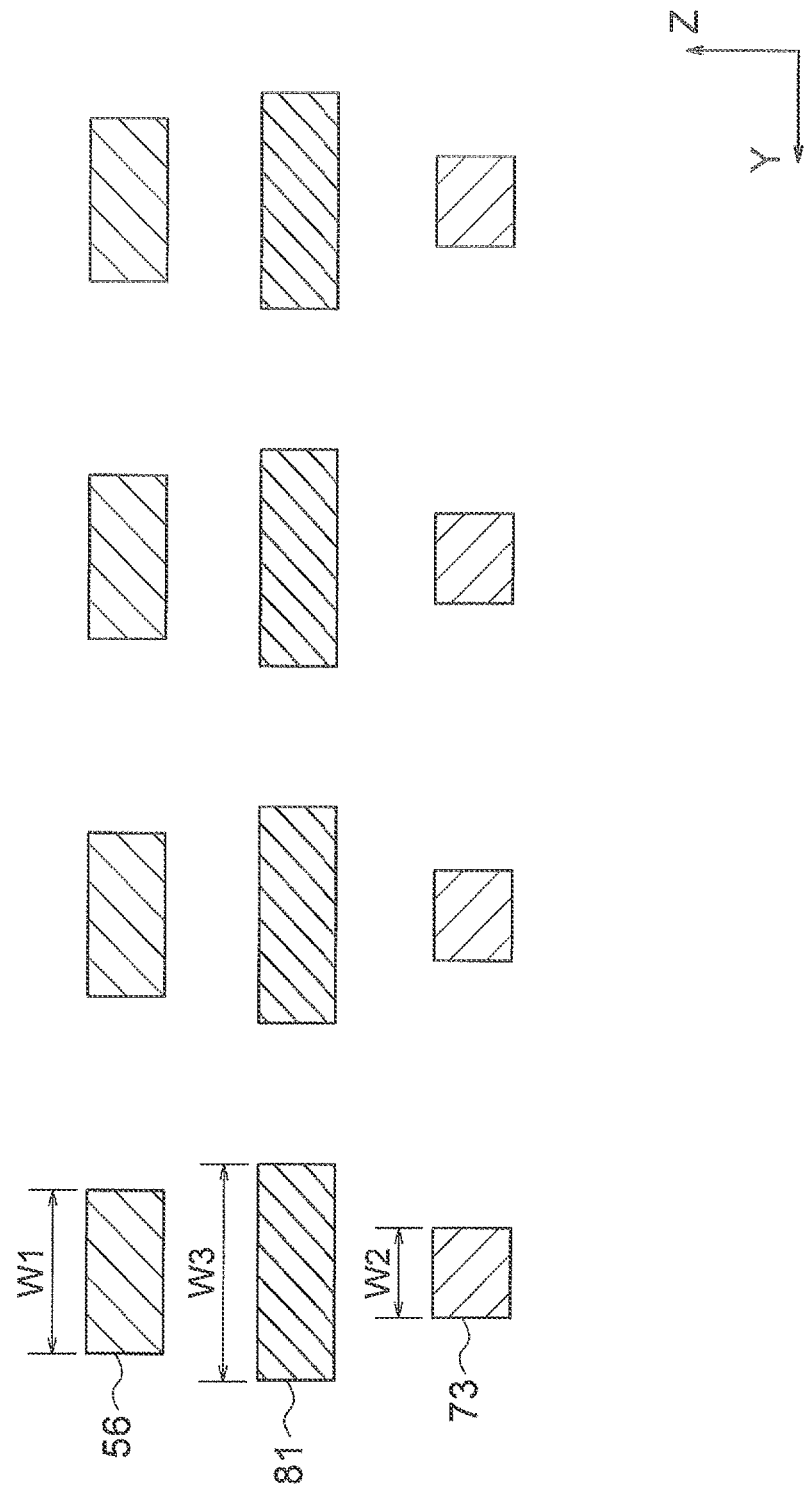

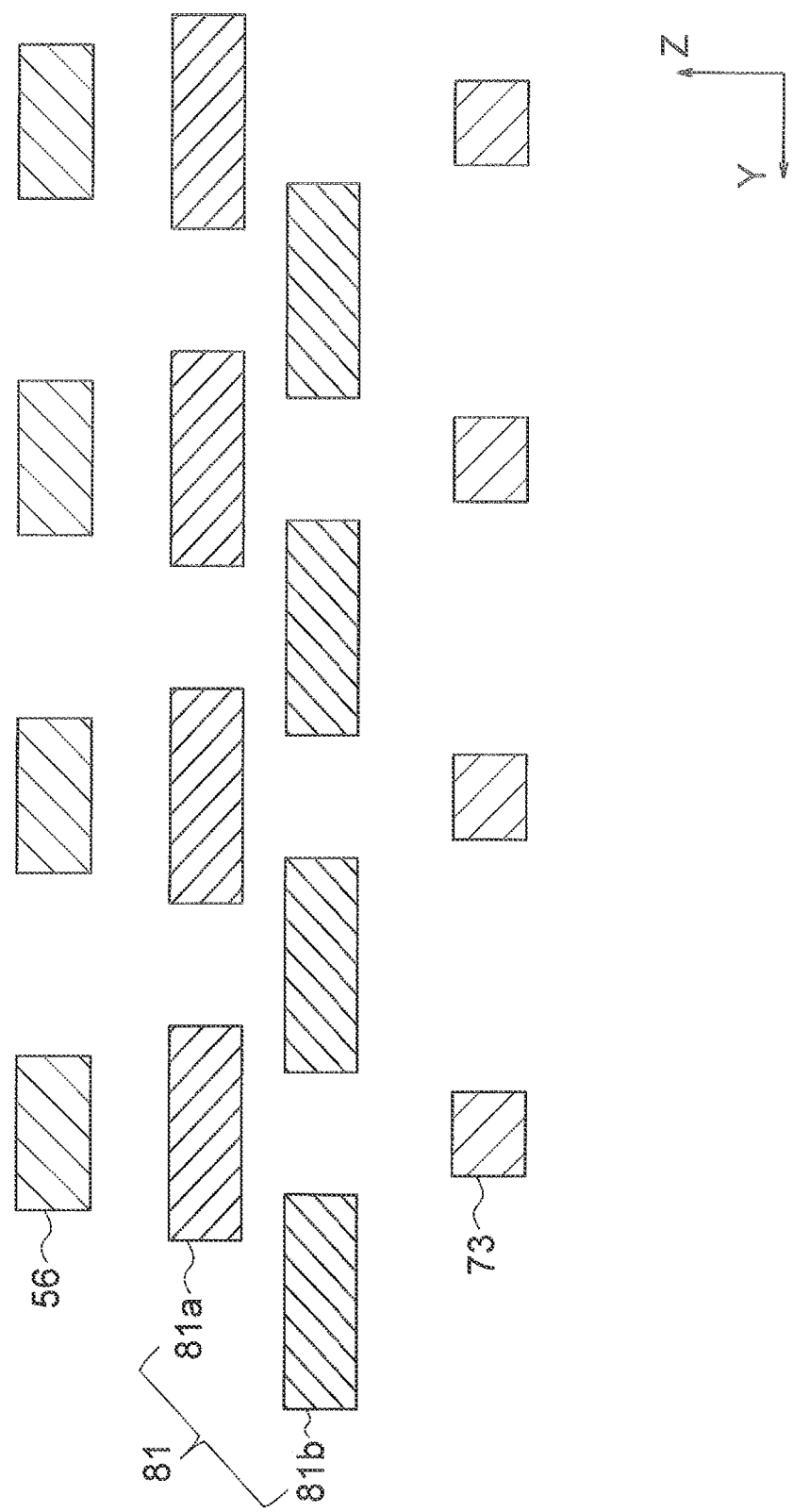

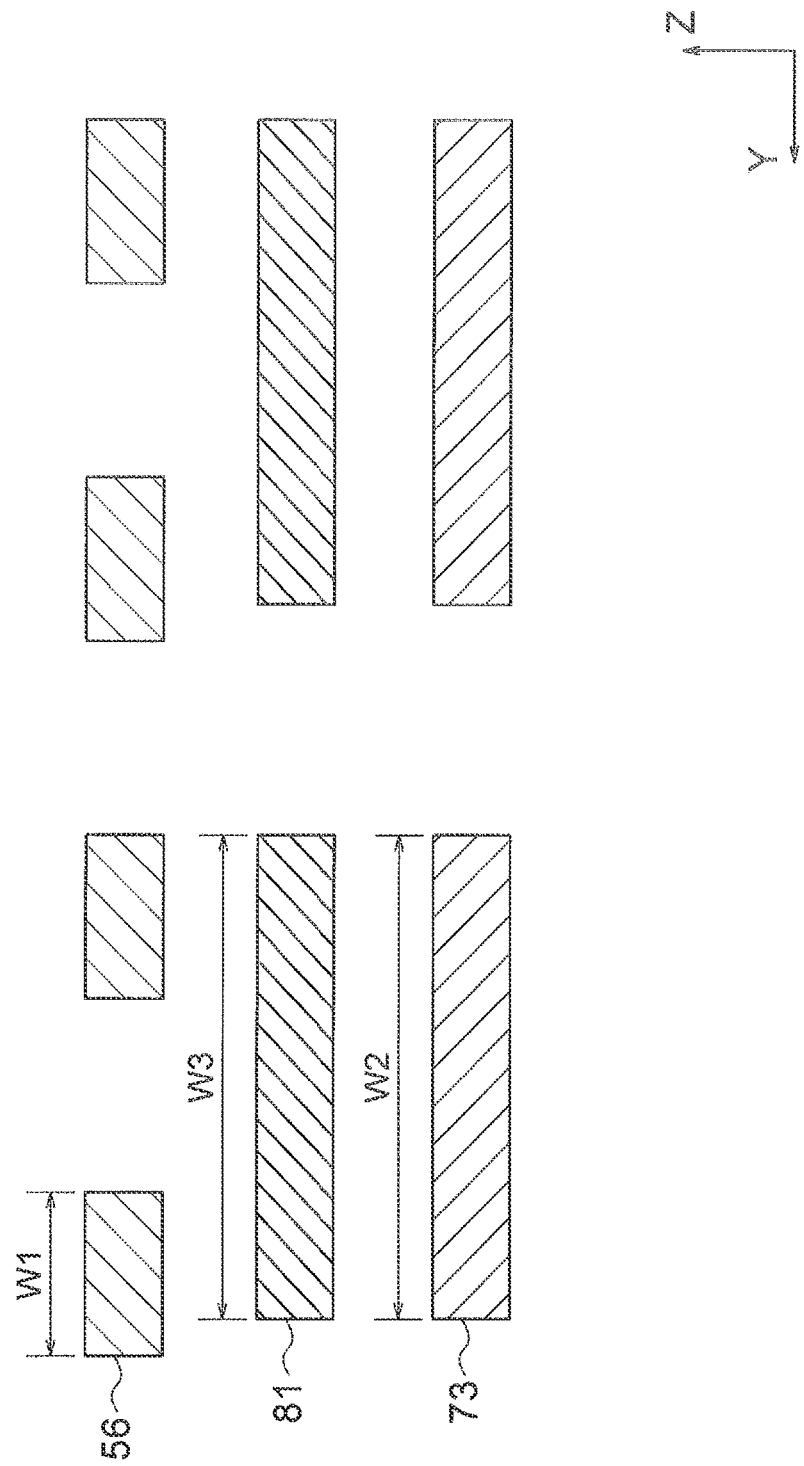

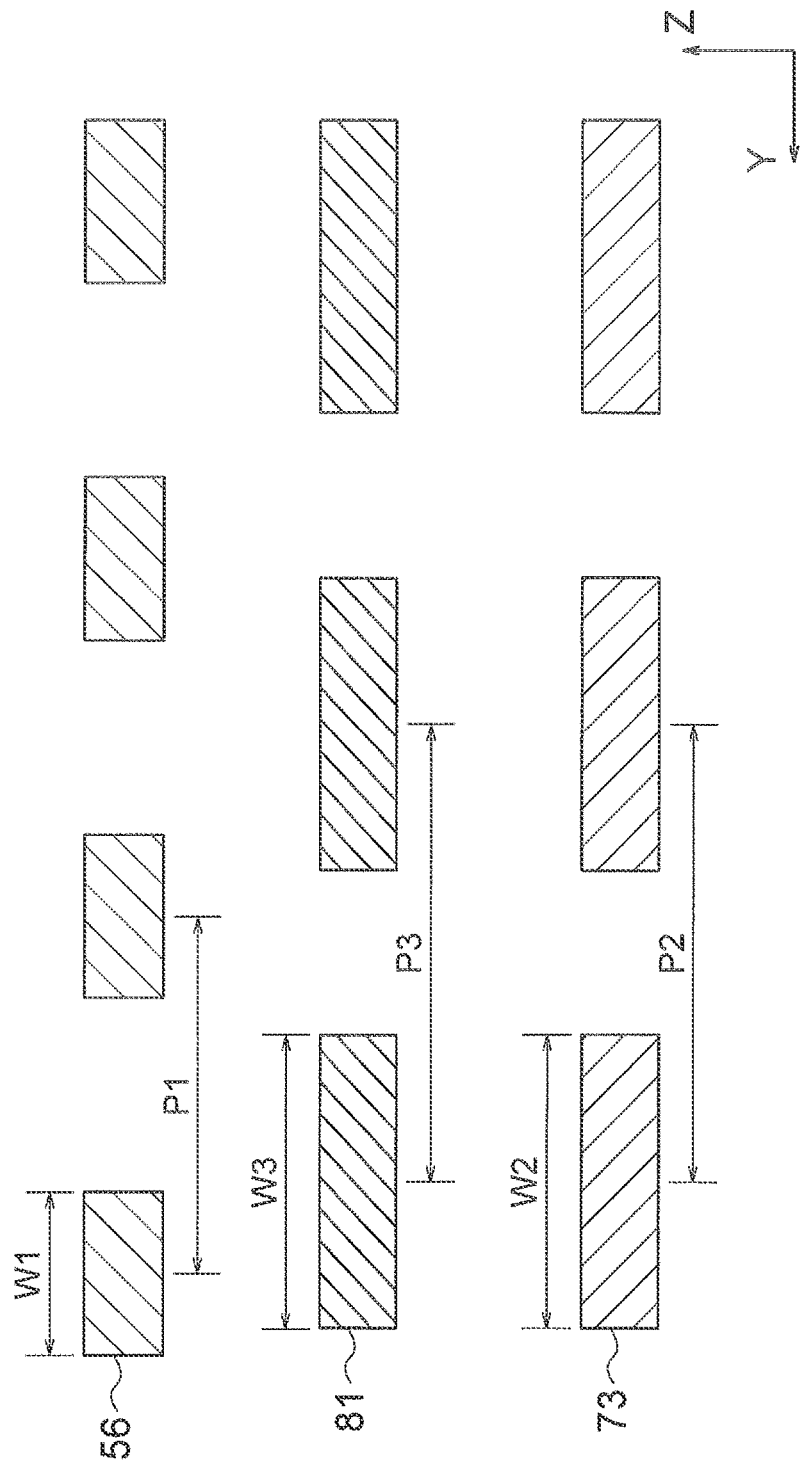

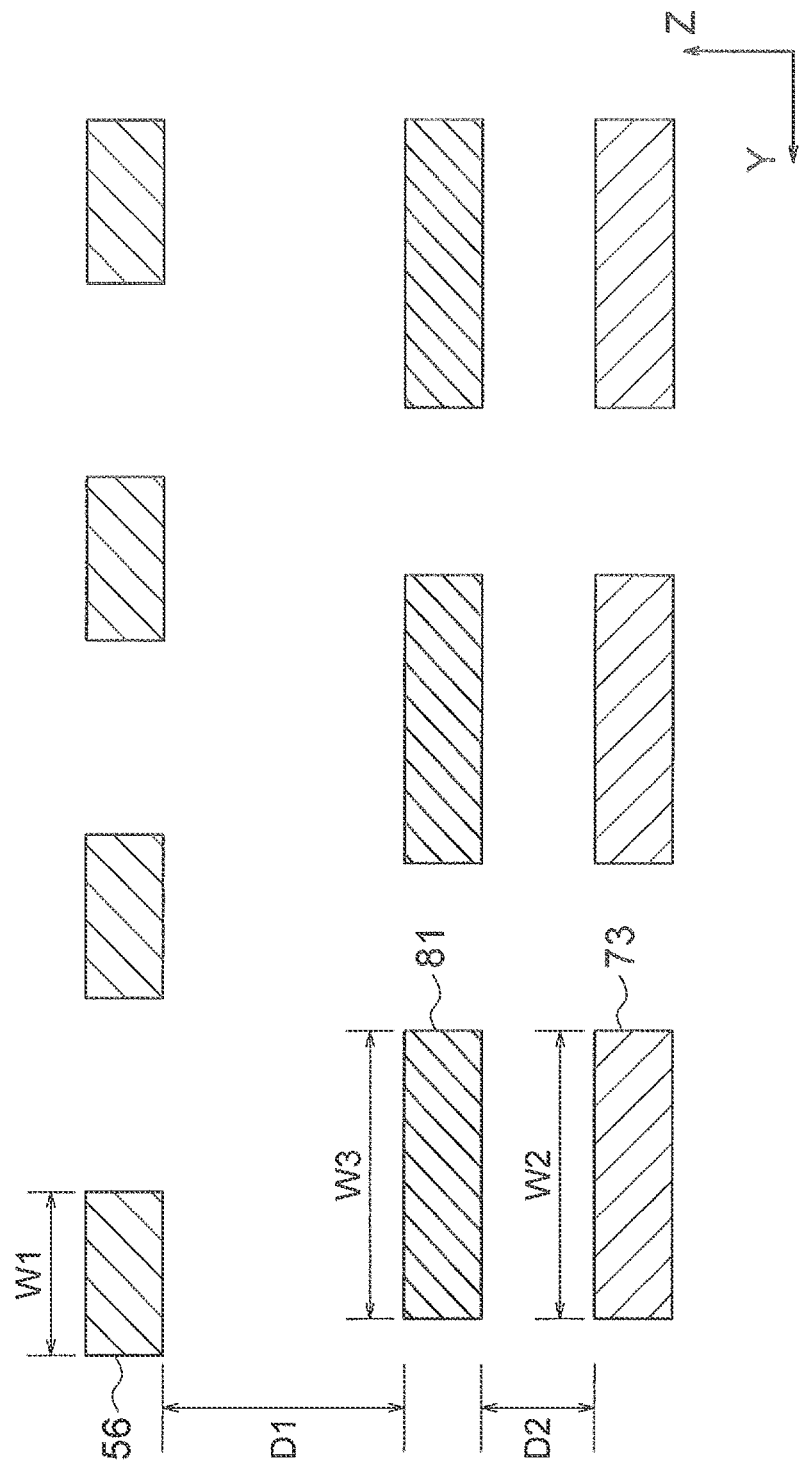

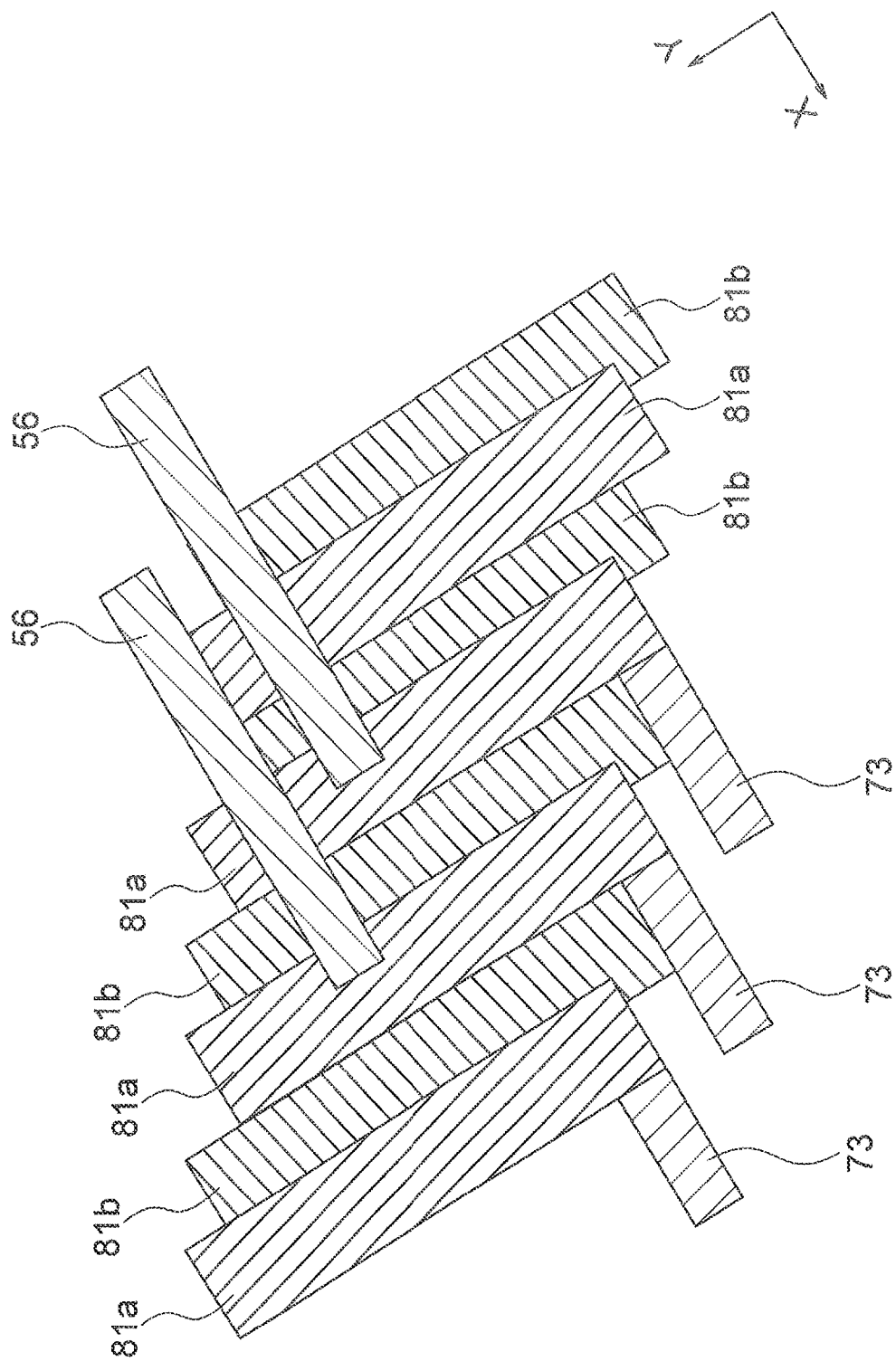

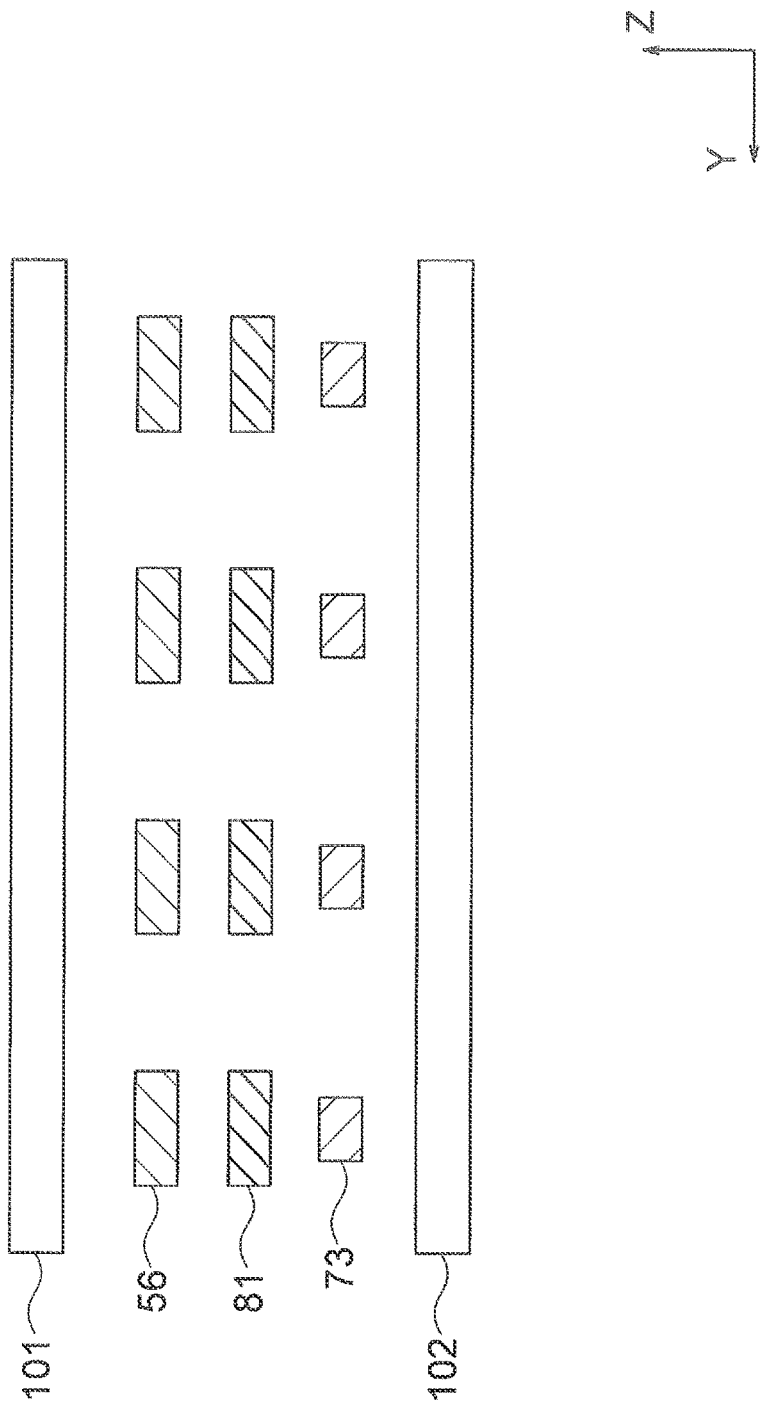

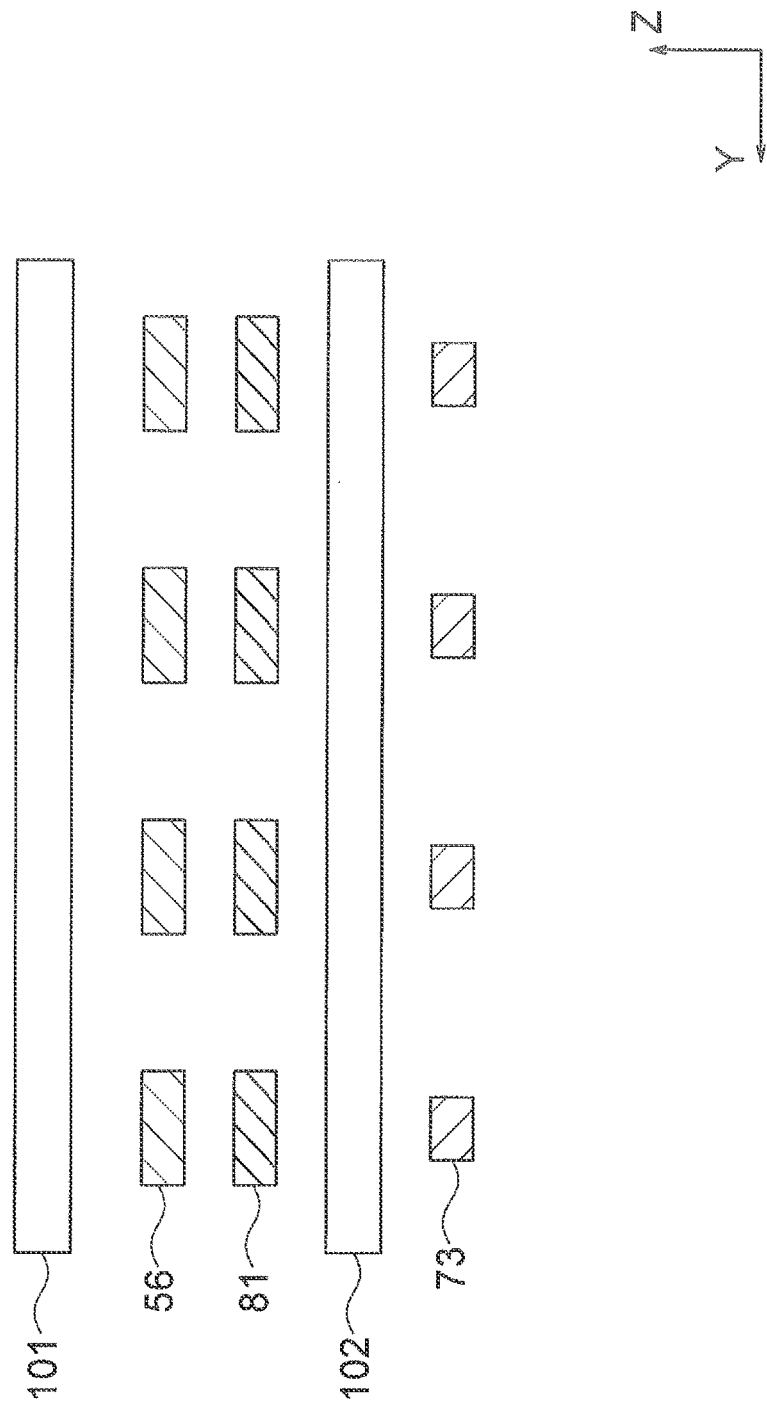

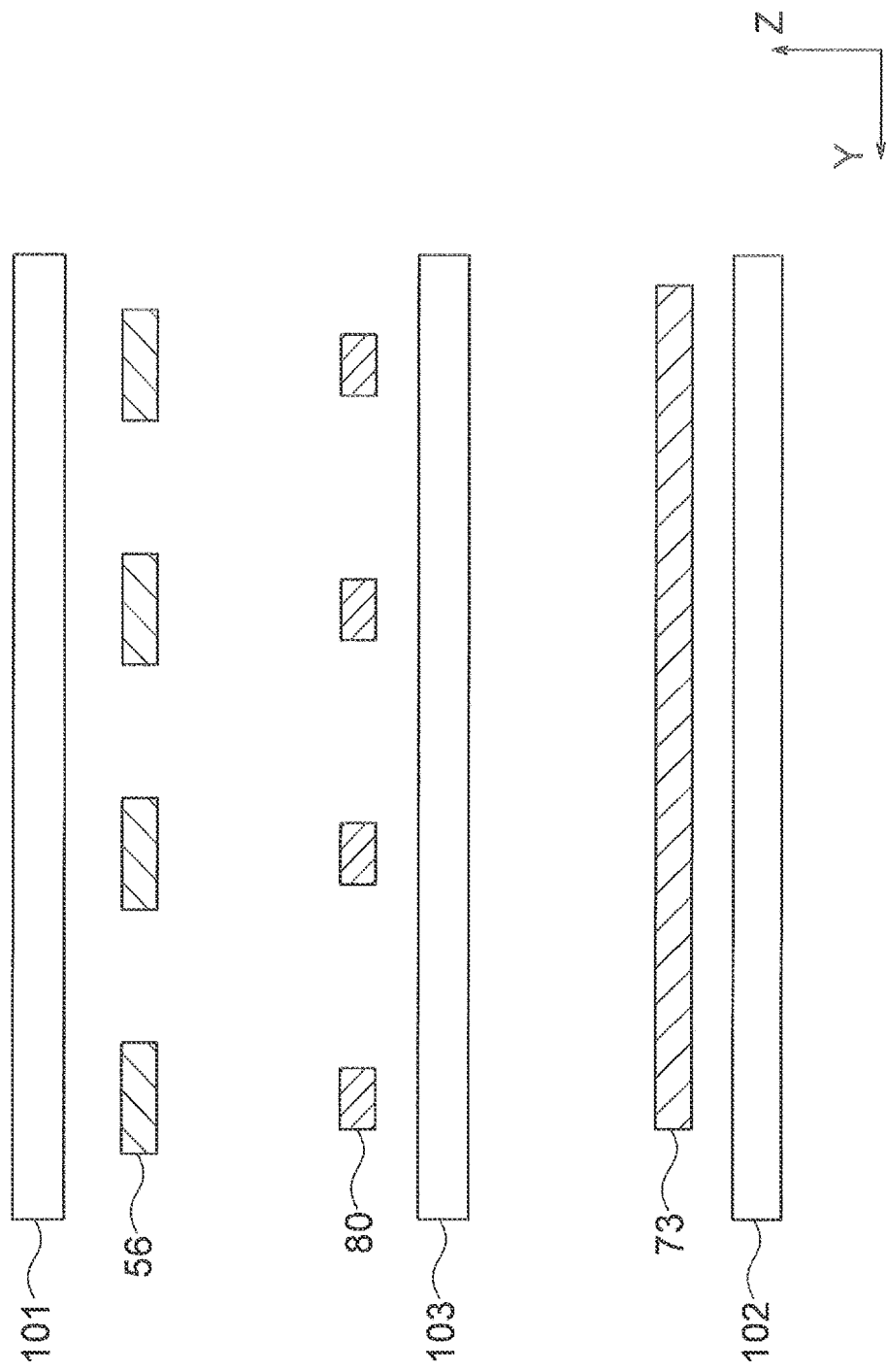

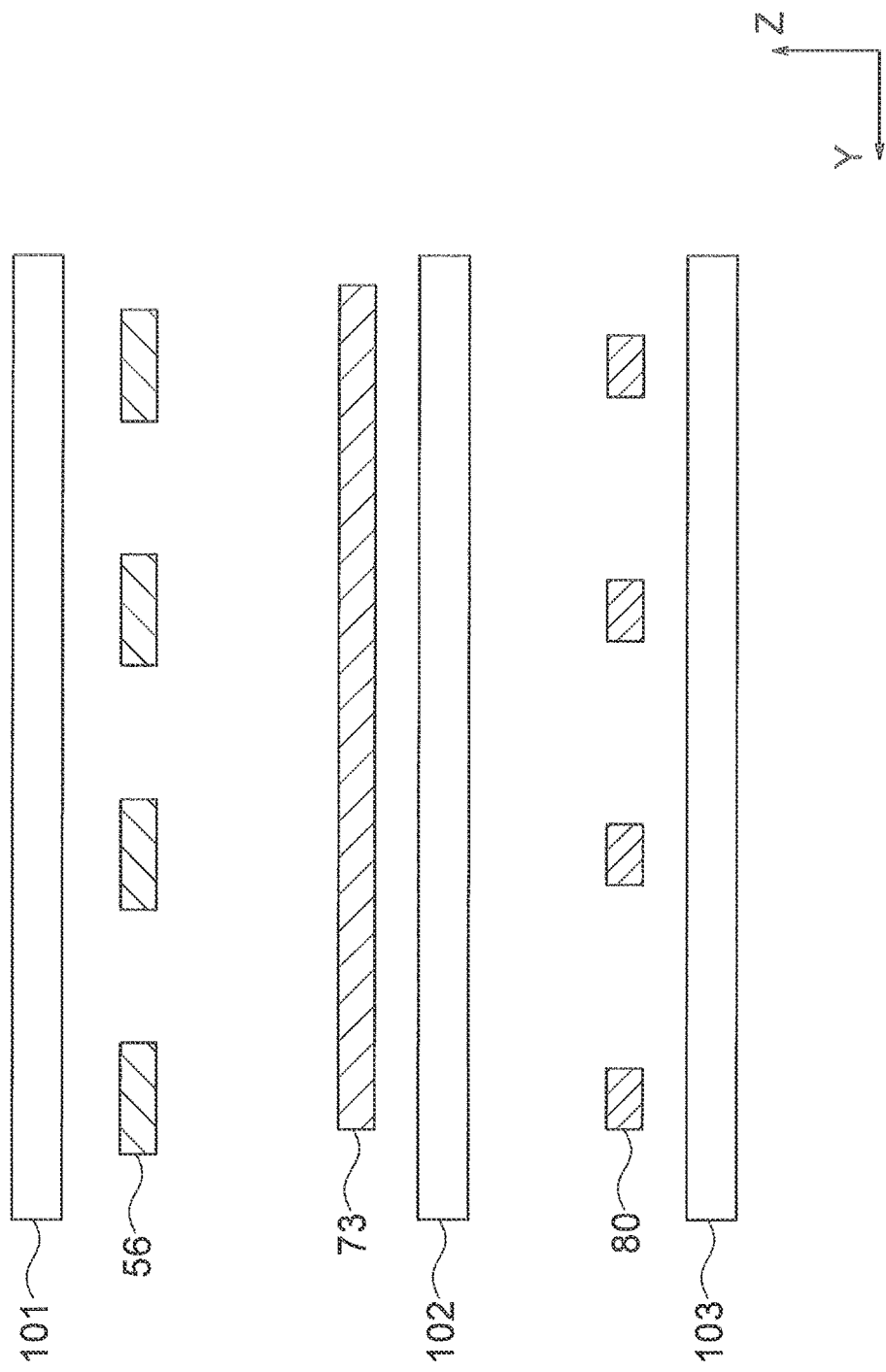

IMAGING DEVICE, ELECTRONIC DEVICE, AND SIGNAL PROCESSING METHOD WITH PIXEL ARRAY AND MEMORY ARRAY RESPECTIVELY ON FIRST AND SECOND SUBSTRATES

TECHNICAL FIELD

The present disclosure relates to an imaging device, an electronic device, and a signal processing method.

BACKGROUND ART

In recent years, in order to implement advanced tasks such as image recognition and object position detection, a processor that performs an operation while implementing a deep neural network (DNN) on hardware has been put into practical use. As a DNN operation method, computing in memory (CIM) that performs an operation on a memory array, which is a non-Neumann type computer has attracted attention.

CITATION LIST

Patent Document

Patent Document 1: Japanese Patent Application Laid-Open No. 2020-113809

SUMMARY OF THE INVENTION

Problems to be Solved by the Invention

In a case where DNN in which a pixel array having an imaging function and a memory array having a product-sum operation function are combined is performed, power consumption increases when a signal transmission distance from the pixel array to the memory array is long.

The present disclosure provides an imaging device, an electronic device, and a signal processing method capable of reducing power consumption.

Solutions to Problems

An imaging device according to an embodiment of the present disclosure includes a first substrate on which a pixel array unit that outputs a pixel signal obtained by photoelectrically converting incident light in a first direction is arranged, and a second substrate on which a memory array unit that outputs a convolution signal indicating a result of a product-sum operation of an input signal based on the pixel signal in a second direction is arranged. The first substrate and the second substrate at least partially overlap each other.

The first direction may intersect the second direction.

The first direction may be parallel to the second direction, and metal shield wiring arranged between the first substrate and the second substrate may be further included.

At least one of the pixel signal or the convolution signal may be an analog signal.

A pixel control circuit that controls the pixel array unit,
a pixel signal processing circuit that processes the pixel signal read from the pixel array unit,
a CIM input control circuit that controls the memory array unit, and
a CIM read circuit that processes the convolution signal read from the memory array unit may be further included.

The pixel control circuit may be arranged in a direction parallel to the first direction,
the pixel signal processing circuit may be arranged in a direction perpendicular to the first direction,
the CIM input control circuit may be arranged in a direction parallel to the second direction, and
the CIM read circuit may be arranged in a direction perpendicular to the second direction.

A third substrate on which the pixel control circuit and the pixel signal processing circuit are arranged may be further included.

The third substrate may be arranged between the first substrate and the second substrate, or the second substrate may be arranged between the first substrate and the third substrate.

On the second substrate, the pixel control circuit and the CIM read circuit may be arranged so as to be opposed to each other with the memory array unit interposed between the pixel control circuit and the CIM read circuit, and the pixel signal processing circuit and the CIM input control circuit may be arranged so as to be opposed to each other with the memory array unit interposed between the pixel signal processing circuit and the CIM input control circuit.

A plurality of the memory array units may be arrayed in at least one of the first direction or the second direction.

A plane region of the memory array unit may be a rectangle, and the second direction may be a long side direction of the rectangle.

A plane region of the memory array unit may be a rectangle, and the second direction may be a short side direction of the rectangle.

The pixel array unit and the pixel signal processing circuit may be electrically connected to each other at a central portion of the first substrate and a central portion of the second substrate, respectively.

A width of first read wiring for reading the pixel signal may be different from a width of second read wiring for reading the convolution signal, and
a width of the metal shield wiring may be the same as or wider than a width of wider read wiring between the first read wiring and the second read wiring.

The metal shield wiring may be multilayer wiring, and each metal shield wiring may partially overlap with each metal shield wiring.

The metal shield wiring may be arranged near wider read wiring between the first read wiring and the second read wiring.

The metal shield wiring may be perpendicular to the first read wiring and the second read wiring.

An input/output unit that inputs and outputs a signal, and
a switch that switches an output destination of an image signal generated by the pixel signal processing circuit to the CIM input control circuit or the input/output unit may be further included.

An electronic device according to an embodiment of the present disclosure includes an imaging device including a first substrate on which a pixel array unit that outputs a pixel signal obtained by photoelectrically converting incident light in a first direction is arranged, and a second substrate on which a memory array unit that outputs a convolution signal indicating a result of a product-sum operation of an input signal based on the pixel signal in a second direction is arranged, in which the first substrate and the second substrate at least partially overlap each other.

A signal processing method according to an embodiment of the present disclosure includes:
outputting a pixel signal obtained by photoelectrically converting incident light in a first direction by a pixel array unit arranged on a first substrate; and
outputting a convolution signal indicating a result of a product-sum operation of an input signal based on the pixel signal in a second direction by a memory array unit arranged on a second substrate at least partially overlapping the first substrate.

BRIEF DESCRIPTION OF DRAWINGS

FIG. 1 is a block diagram illustrating a configuration of an imaging device according to a first embodiment.

FIG. 2A is a diagram illustrating an example of a circuit layout of the imaging device according to the first embodiment.

FIG. 2C is a diagram illustrating an example of a circuit layout of the imaging device according to the first embodiment.

FIG. 2D is a diagram illustrating an example of a circuit layout of the imaging device according to the first embodiment.

FIG. 2E is a diagram illustrating an example of a circuit layout of the imaging device according to the first embodiment.

FIG. 2F is a diagram illustrating an example of a circuit layout of the imaging device according to the first embodiment.

FIG. 2G is a diagram illustrating an example of a circuit layout of the imaging device according to the first embodiment.

FIG. 3B is a diagram illustrating still another example of the tiling structure.

FIG. 7 is a diagram illustrating a schematic circuit configuration of a memory array unit.

FIG. 8A is a cross-sectional view illustrating an example of an arrangement relationship between read wiring and read wiring according to the first embodiment.

FIG. 8B is a cross-sectional view illustrating another example of an arrangement relationship between read wiring and read wiring according to the first embodiment.

FIG. 9A is a diagram illustrating an example of a circuit layout of the imaging device according to a second embodiment.

FIG. 9C is a diagram illustrating an example of a circuit layout of the imaging device according to the second embodiment.

FIG. 9E is a diagram illustrating an example of a circuit layout of the imaging device according to the second embodiment.

FIG. 9F is a diagram illustrating an example of a circuit layout of the imaging device according to the second embodiment.

FIG. 10A is a cross-sectional view illustrating an example of an arrangement relationship of metal shield wiring with respect to read wiring.

FIG. 10B is a cross-sectional view illustrating an example of an arrangement relationship of read wiring and metal shield wiring.

FIG. 10C is a cross-sectional view illustrating an example of an arrangement relationship of read wiring and metal shield wiring.

FIG. 10D is a cross-sectional view illustrating an example of an arrangement relationship of read wiring and metal shield wiring.

FIG. 10E is a cross-sectional view illustrating an example of an arrangement relationship of read wiring and metal shield wiring.

FIG. 10F is a cross-sectional view illustrating an example of an arrangement relationship of read wiring and metal shield wiring.

FIG. 11 is a plane view illustrating another example of the arrangement relationship of read wiring and metal shield wiring.

FIG. 12A is a cross-sectional view illustrating an example of an arrangement relationship between read wiring and read wiring according to the second embodiment.

FIG. 12B is a cross-sectional view illustrating another example of an arrangement relationship between read wiring and read wiring according to the second embodiment.

FIG. 14A is a cross-sectional view illustrating an example of an arrangement relationship between read wiring and read wiring according to the third embodiment.

FIG. 14B is a cross-sectional view illustrating another example of an arrangement relationship between read wiring and read wiring according to the third embodiment.

MODE FOR CARRYING OUT THE INVENTION

First Embodiment

Figure 2B:
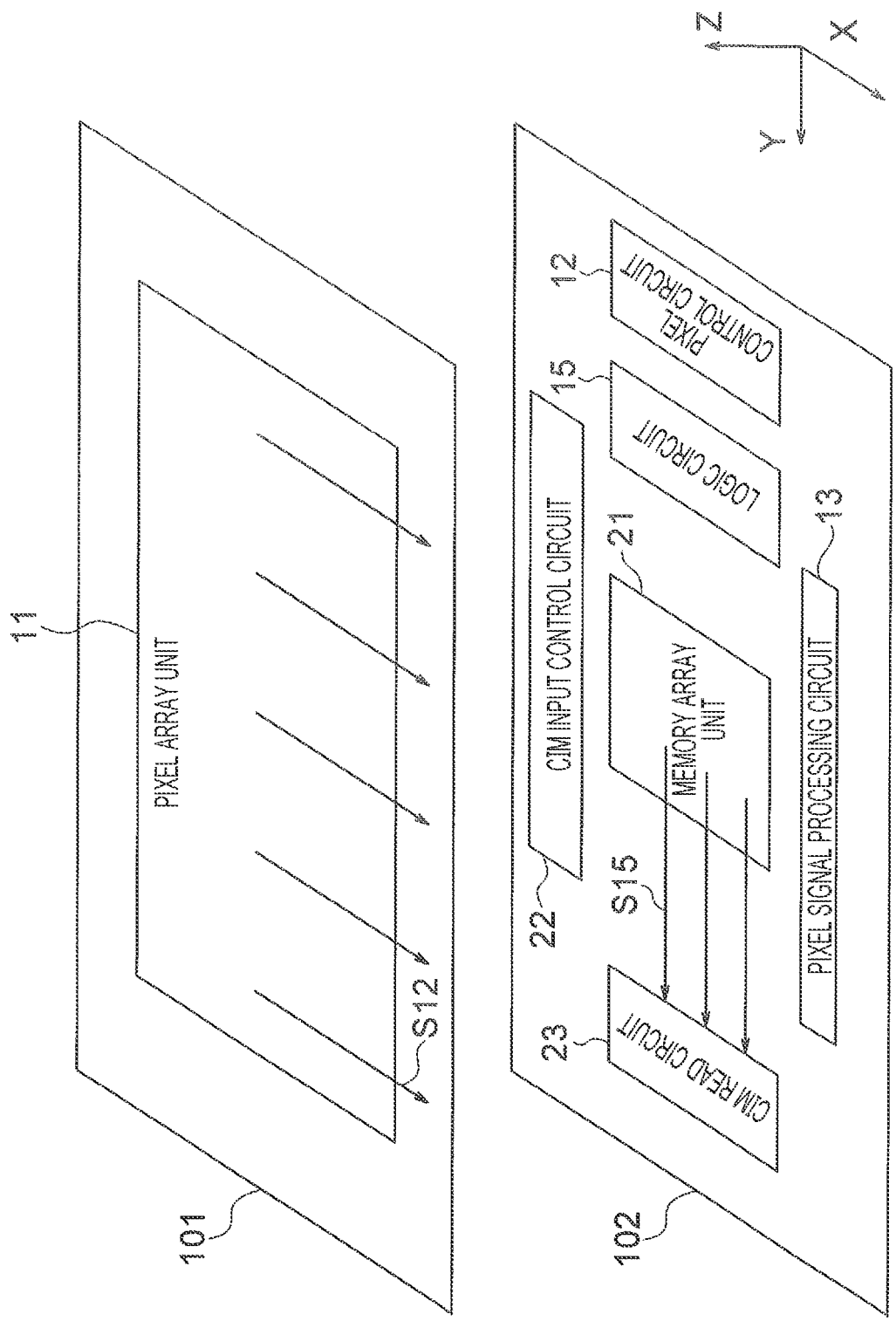
FIG. 2B is a diagram illustrating an example of a circuit layout of the imaging device according to the first embodiment.

FIG. 1 is a block diagram illustrating a configuration of an imaging device according to a first embodiment. An imaging device 1 illustrated in FIG. 1 is provided with a pixel array unit 11, a pixel control circuit 12, a pixel signal processing circuit 13, a horizontal drive circuit 14, a logic circuit 15, a memory array unit 21, a CIM input control circuit 22, a CIM read circuit 23, a signal processing circuit 31, a memory 32, and an input/output unit 33.

In the pixel array unit 11, a plurality of pixels is arranged in a two-dimensional manner. Each pixel generates a pixel signal S12 obtained by photoelectrically converting incident light on the basis of a plurality of types of pixel control signals S11 from the pixel control circuit 12. Furthermore, each pixel outputs the pixel signal S12 to the pixel signal processing circuit 13 in one direction. A circuit configuration example of the pixel will be described later.

The pixel control circuit 12 includes, for example, a shift register, and inputs the pixel control signal S11 to each pixel of the pixel array unit 11 via pixel drive wiring (not illustrated in FIG. 1). By the pixel control signal S11, the pixel control circuit 12 sequentially selects and scans the pixels of the pixel array unit 11, and outputs the pixel signal S12 of each pixel to the pixel signal processing circuit 13.

The pixel signal processing circuit 13 performs correlated double sampling (CDS) processing for removing pixel-specific fixed pattern noise and analog to digital (AD) conversion processing on the pixel signals S12 read from the pixel array unit 11. An image signal S13 processed by the pixel signal processing circuit 13 is input to the CIM input control circuit 22.

The horizontal drive circuit 14 includes, for example, a shift register, and sequentially outputs horizontal scan pulses to the pixel signal processing circuit 13. Therefore, for example, the image signals S13 held in the pixel signal processing circuit 13 are sequentially output toward the CIM read circuit 23.

The logic circuit 15 receives an externally input clock signal and data indicating an operation mode and the like, and controls an operation of an entire imaging device 1. For example, the logic circuit 15 generates a vertical synchronization signal, a horizontal synchronization signal and the like on the basis of the input clock signal, and supplies the signals to the pixel control circuit 12, the pixel signal processing circuit 13, the horizontal drive circuit 14, the CIM input control circuit 22, the CIM read circuit 23 and the like.

In the memory array unit 21, a plurality of memory cells is arranged in a two-dimensional manner. The memory array unit 21 outputs a convolution signal S15 indicating a result of a product-sum operation by an analog method or a digital method using the plurality of memory cells to the CIM read circuit 23 in one direction. A circuit configuration example of the memory array unit 21 will be described later.

The CIM input control circuit 22 includes, for example, a shift register, and inputs a memory cell control signal S14 associated with the image signal S13 to each memory cell of the memory array unit 21 via memory cell drive wiring (not illustrated in FIG. 1). By the memory cell control signal S14, the CIM input control circuit 22 sequentially or collectively selects and scans the memory cells of the memory array unit 21, and outputs the convolution signal S15 obtained by a product-sum operation using memory values of the respective memory cells to the CIM read circuit 23.

The CIM read circuit 23 performs AD conversion processing and the like on the convolution signal S15 read from the memory array unit 21. A convolution signal S16 processed by the CIM read circuit 23 is input to the signal processing circuit 31. The convolution signal S16 may be intermediate data at an intermediate stage of image recognition.

The signal processing circuit 31 performs conversion processing by an activation function, pooling processing and the like on the convolution signal S16 input from the CIM read circuit 23, and outputs a processing result to the input/output unit 33. Note that, some processing may be performed by the memory array unit 21 or by the CIM read circuit 23. Furthermore, in a case where the signal processing is performed a plurality of times, the CIM read circuit 23 may perform the signal processing of several times, and thereafter the signal processing circuit 31 may perform the signal processing of the remaining number of times. In this manner, by sharing the signal processing by the CIM read circuit 23 and the signal processing circuit 31, concentration of processing loads may be avoided.

Moreover, the signal processing circuit 31 may cause the memory 32 to store parameters and the like input from an external image processing device via the input/output unit 33, and may appropriately select and execute signal processing on the basis of an instruction from the external image processing device.

The memory 32 stores data such as parameters required for signal processing performed by the signal processing circuit 31. Furthermore, the memory 32 may include, for example, a frame memory for storing an image signal in processing such as demosaic processing.

The input/output unit 33 outputs signals sequentially input from the signal processing circuit 31 to the external image processing device, for example, a subsequent image signal processor (ISP) and the like. Furthermore, the input/output unit 33 supplies signals and parameters input from the external image processing device to the signal processing circuit 31 and the logic circuit 15. Moreover, the input/output unit 33 may write a data value indicating an externally provided learning result to the memory cell of the memory array unit 21, and may update the learning result via the input/output unit 33 by reflecting a result calculated by the signal processing circuit 31.

FIGS. 2A to 2G are diagrams illustrating an example of a circuit layout of the imaging device 1. In this embodiment, the pixel array unit 11 is arranged on a first substrate 101, and the memory array unit 21 is arranged on a second substrate 102. Each circuit of the imaging device 1 is also arranged on the second substrate 102. The first substrate 101 and the second substrate 102 are, for example, silicon substrates, and are stacked so as to overlap each other. In order to minimize a substrate area, the first substrate 101 and the second substrate 102 do not need to entirely overlap each other; they are only required to at least partially overlap each other.

Note that, in FIGS. 2A to 2G, two directions parallel to the first substrate 101 and the second substrate 102 and orthogonal to each other are defined as an X direction and a Y direction, respectively. Furthermore, a direction orthogonal to the X direction and the Y direction, in other words, a stacking direction of the first substrate 101 and the second substrate 102 is defined as a Z direction. Furthermore, only the pixel control circuit 12, the pixel signal processing circuit 13, the logic circuit 15, the CIM input control circuit 22, and the CIM read circuit 23 are illustrated on the second substrate 102 in each drawing for convenience of space, and other circuits are not illustrated.

In this embodiment, as illustrated in FIGS. 2A to 2G, the pixel signal S12 is output from the pixel array unit 11 in the X direction, and the convolution signal S15 is output from the memory array unit 21 in the Y direction perpendicular to the X direction. That is, read wiring (output wiring) of the pixel signal S12 is perpendicular to read wiring (output wiring) of the convolution signal S15. Note that, it is only required that the output direction of the pixel signal S12 is a direction intersecting the output direction of the convolution signal S15.

In FIG. 2A, the pixel signal processing circuit 13 is arranged in a direction perpendicular to the output direction of the X pixel signal S12, and the pixel control circuit 12 is arranged in a direction parallel to the output direction of the X pixel signal S12. That is, the pixel signal processing circuit 13 and the pixel control circuit 12 are arranged in directions perpendicular to each other. Furthermore, the CIM input control circuit 22 is arranged in a direction parallel to the output direction of the convolution signal S15, and the CIM read circuit 23 is arranged in a direction perpendicular to the output direction of the convolution signal S15. That is, the CIM input control circuit 22 and the CIM read circuit 23 are also arranged in directions perpendicular to each other. The logic circuit 15 is arranged between the pixel signal processing circuit 13 and the memory array unit 21.

In FIG. 2B, the position of the logic circuit 15 is different from that in the layout illustrated in FIG. 2A. In this layout, the logic circuit 15 is arranged between the pixel control circuit 12 and the memory array unit 21. However, the position of the logic circuit 15 is not limited to the position illustrated in FIGS. 2A and 2B, and this is only required to be appropriately arranged in a space in the second substrate 102.

Furthermore, in FIG. 2B, a shape of a plane region of the memory array unit 21 is different from that in the layout illustrated in FIG. 2A. In FIG. 2A, the plane region of the memory array unit 21 is a rectangle with a short side in the X direction and a long side in the Y direction. In contrast, regarding the plane region illustrated in FIG. 2B, the plane region of the memory array unit 21 is a rectangle with a long side in the X direction and a short side in the Y direction. The plane region of the memory array unit 21 may be a square, and is determined according to a specification of the product-sum operation. For example, in a case where the number of convolutions (additions) of the product-sum operation is large, long read wiring is required. In this case, the rectangle of the memory array unit 21 illustrated in FIG. 2A is preferable.

In FIG. 2C, the CIM input control circuit 22 is arranged between the memory array unit 21 and the pixel signal processing circuit 13. Furthermore, the memory array unit 21 is arranged in a region deviated from a central region of the second substrate 102 in the X direction. Therefore, the center of the memory array unit 21 is shifted in the X direction from the center of the pixel array unit 11. A center position of the pixel array unit 11 and a center position of the memory array unit 21 are only required to be optimized according to the layout of the signal wiring and power supply wiring. Therefore, the center position of each array unit does not need to be located on a straight line extending in the Z direction, and may be shifted in the X direction or the Y direction.

In FIG. 2D, the output direction of the pixel signal S12 is multiple directions including a +X direction and a −X direction. The −X direction is a direction rotated by 180 degrees in the X direction. Furthermore, on the second substrate 102, a pixel signal processing circuit 13a and a pixel signal processing circuit 13b are arranged so as to be opposed to each other with the memory array unit 21 interposed therebetween in the X direction. The pixel signal processing circuit 13a processes the pixel signal S12 output from the pixel array unit 11 in the +X direction. The pixel signal processing circuit 13b processes the pixel signal S12 output from the pixel array unit 11 in the −X direction.

In FIG. 2E, the output direction of the pixel signal S12 is the multiple directions including the +X direction and the −X direction, and the output direction of the convolution signal S15 is also multiple directions including a +Y direction and a −Y direction. The −Y direction is a direction rotated by 180 degrees in the Y direction. Furthermore, on the second substrate 102, a pixel control circuit 12a and a pixel control circuit 12b are arranged so as to be opposed to each other with the memory array unit 21 interposed therebetween. The pixel control circuit 12a controls the pixel that outputs the pixel signal S12 in the +X direction. The pixel control circuit 12b controls the pixel that outputs the pixel signal S12 in the −X direction.

Furthermore, on the second substrate 102, a CIM input control circuit 22a and a CIM input control circuit 22b are arranged so as to be opposed to each other with the memory array unit 21 interposed therebetween. The CIM input control circuit 22a inputs the input signal S14 associated with the image signal S13 processed by the pixel signal processing circuit 13a to the memory array unit 21. The CIM input control circuit 22b inputs the input signal S14 associated with the image signal S13 processed by the pixel signal processing circuit 13b to the memory array unit 21.

Moreover, a CIM read circuit 23a and a CIM read circuit 23b are arranged so as to be opposed to each other with the memory array unit 21 interposed therebetween. The CIM read circuit 23a processes the convolution signal S15 output from the memory array unit 21 in the −Y direction. The CIM read circuit 23b processes the convolution signal S15 output from the memory array unit 21 in the +Y direction.

In FIG. 2F, on the first substrate 101, the pixel signal S12 is transmitted toward a central portion of the pixel array unit 11, that is, toward a central portion of the first substrate 1010. Furthermore, the pixel signal processing circuit 13 is arranged in a central portion of the second substrate 102. Therefore, the pixel array unit 11 and the pixel signal processing circuit 13 are electrically connected to each other at the central portion of the first substrate 101 and the second substrate 102, respectively.

FIG. 2G is an example of a layout of a so-called tiling structure in which a plurality of memory array units 21 is arrayed in the Y direction. In this layout, the CIM read circuit 23 includes a multiplexer and is shared by the plurality of memory array units 21. Therefore, the convolution signals S15 output from the respective memory array units 21 are collectively processed by the CIM read circuit 23.

Figure 3A:
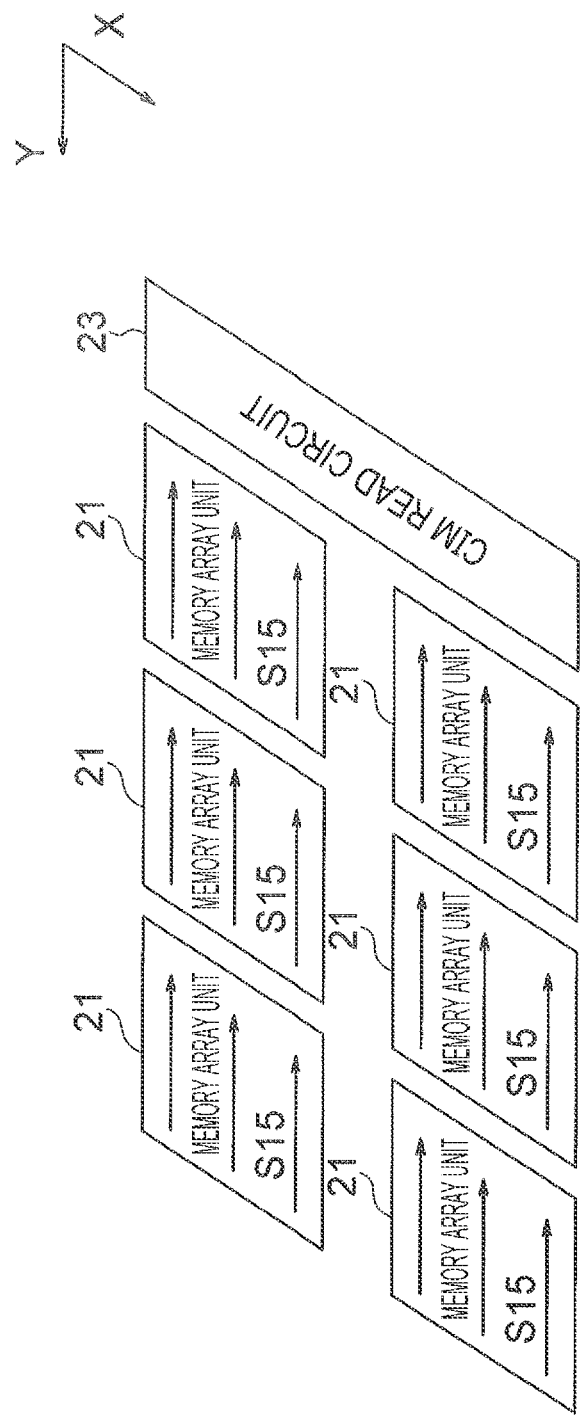
FIG. 3A is a diagram illustrating another example of a tiling structure.

FIG. 3A is a diagram illustrating another example of the tiling structure. In the tiling structure illustrated in FIG. 3A, the plurality of memory array units 21 is arrayed not only in the Y direction but also in the X direction. In other words, the plurality of memory array units 21 is arrayed in a two-dimensional manner. In this tiling structure also, the convolution signals S15 output from the respective memory array units 21 are collectively processed by the CIM read circuit 23.

FIG. 3B is a diagram illustrating still another example of the tiling structure. In the tiling structure illustrated in FIG. 3B, the CIM read circuit 23 is arranged for each of the plurality of memory array units 21. In this tiling structure, the convolution signals S15 output from the respective memory array units 21 are individually processed by a plurality of CIM read circuit 23, respectively.

Figure 4A:
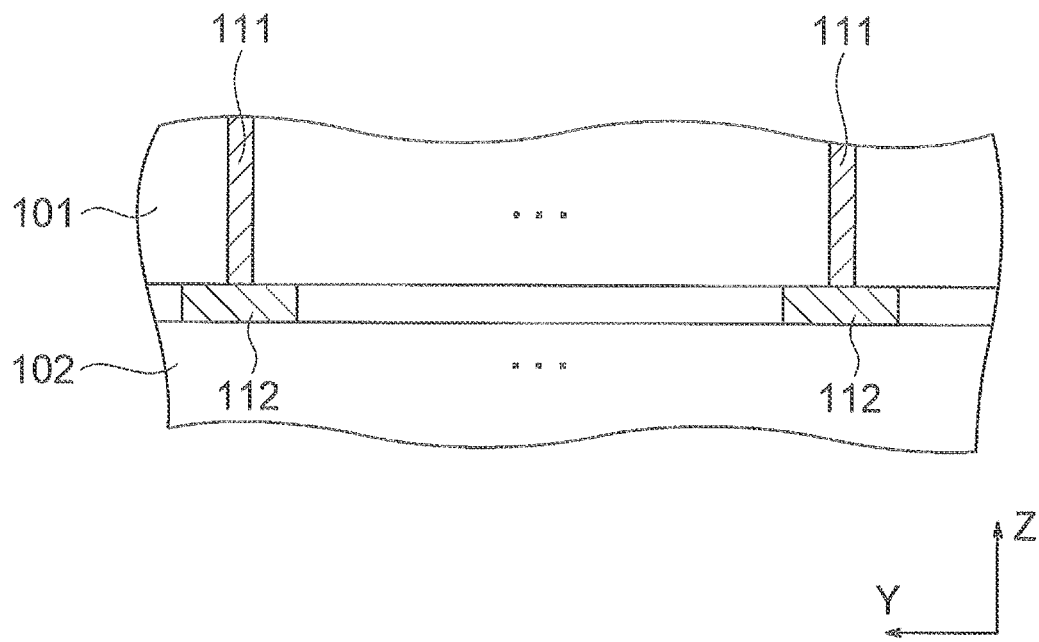
FIG. 4A is a cross-sectional view schematically illustrating a joining mode between a first substrate and a second substrate.

FIG. 4A is a cross-sectional view schematically illustrating a joining mode between the first substrate 101 and the second substrate 102. In FIG. 4A, a plurality of through electrodes 111 formed in the first substrate 101 is joined to a plurality of connection terminals 112 formed on the second substrate 102. The through electrode 111 and the connection terminal 112 may be formed by using metal such as copper, for example. Note that, a gap between the first substrate 101 and the second substrate 102 is filled with an insulating film.

The through electrode 111 penetrates the first substrate 101 and is electrically connected to the pixel array unit 11 via a wiring layer (not illustrated) including various types of wiring. The connection terminal 112 is formed on a front surface of the second substrate 102 (a joining surface to the first substrate 101). The connection terminal 112 is connected to the pixel control circuit 12 and the pixel signal processing circuit 13 arranged on the second substrate 102 via various wiring layers (not illustrated).

In the joining mode illustrated in FIG. 4A, the pixel control signal S11 of the pixel control circuit 12 is transmitted from the connection terminal 112 to each pixel of the pixel array unit 11 via the through electrode 111. Furthermore, the pixel signal S12 of each pixel is transmitted from another through electrode 111 to the pixel signal processing circuit 13 through another connection terminal 112.

Figure 4B:
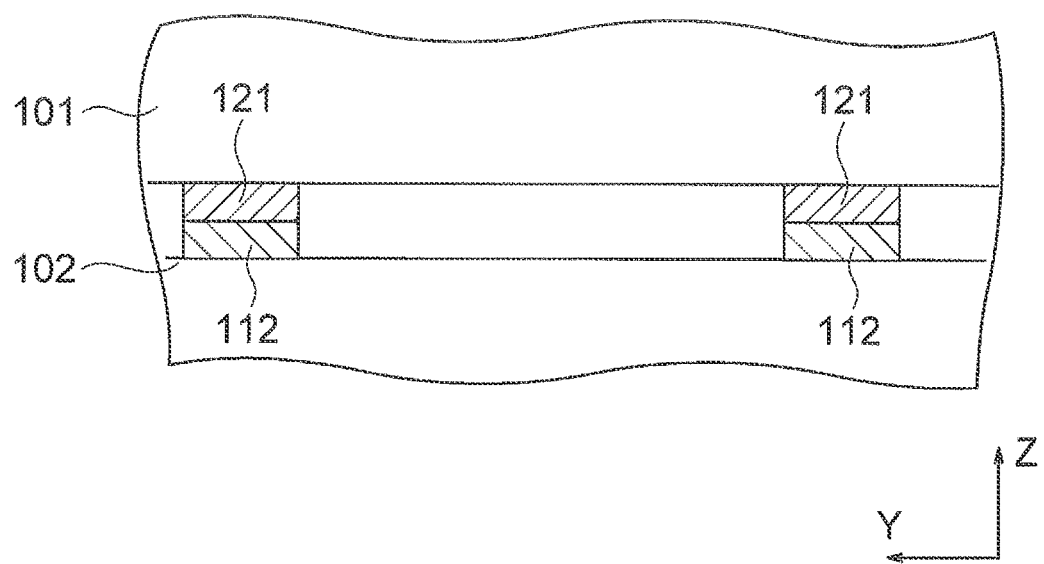
FIG. 4B is a cross-sectional view schematically illustrating another joining mode between the first substrate and the second substrate.

FIG. 4B is a cross-sectional view schematically illustrating another joining mode between the first substrate 101 and the second substrate 102. The joining mode illustrated in FIG. 4B is a so-called Cu—Cu joint in which a plurality of connection terminals 121 (first connection terminals) formed on the first substrate 101 is joined to a plurality of connection terminals 112 (second connection terminals) formed on the second substrate 102, respectively. The connection terminal 121 may be formed using metal such as copper as with the connection terminal 112, and is electrically connected to the pixel array unit 11 via wiring not illustrated. Note that, in this joining mode also, a gap between the first substrate 101 and the second substrate 102 is filled with an insulating film.

In the joining mode illustrated in FIG. 4B, the pixel control signal S11 of the pixel control circuit 12 is transmitted from the connection terminal 112 to each pixel of the pixel array unit 11 via the connection terminal 121. Furthermore, the pixel signal S12 of each pixel is transmitted from another connection terminal 121 to the pixel signal processing circuit 13 via another connection terminal 112.

Note that, although not illustrated in FIGS. 4A and 4B, the pixel array unit 11 is formed above the through electrode 111 or the connection terminal 121. Furthermore, a circuit group including the pixel control circuit 12 and the pixel signal processing circuit 13 is formed below the connection terminal 112.

FIGS. 5A to 5E are diagrams illustrating an example of an equivalent circuit diagram of pixels arrayed in the pixel array unit 11. Hereinafter, a circuit configuration of the pixel illustrated in each drawing will be described.

Figure 5A:
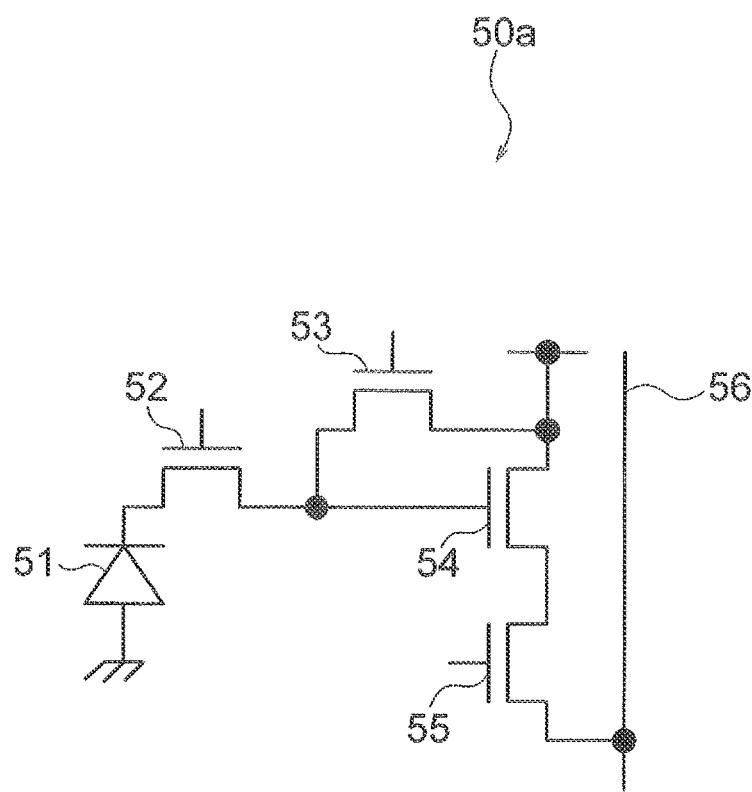
FIG. 5A is a diagram illustrating an example of an equivalent circuit diagram of pixels arrayed in a pixel array unit.

A pixel 50a illustrated in FIG. 5A includes a photodiode 51, a transfer transistor 52, a reset transistor 53, an amplification transistor 54, and a selection transistor 55.

The photodiode 51 is a photoelectric conversion unit that generates and accumulates a charge (signal charge) corresponding to a received light amount. An anode terminal of the photodiode 51 is grounded, and a cathode terminal thereof is connected to the transfer transistor 52.

When turned on by a transfer signal, which is one of the pixel control signals S11, the transfer transistor 52 reads the charge from the photodiode 51 and transfers the same to the amplification transistor 54. When turned on by a reset signal, which is one of the pixel control signals S11, the charge accumulated in the photodiode 51 is discharged to a power supply, so that the reset transistor 53 resets a potential of the photodiode 51.

The amplification transistor 54 outputs the pixel signal S12 according to an amount of charge accumulated in the photodiode 51 to the selection transistor 55. When turned on by a selection signal, which is one of the pixel control signals S11, the selection transistor 55 outputs the pixel signal S12 to read wiring 56. The pixel signal S12 is transmitted to the pixel signal processing circuit 13 via the read wiring 56.

Figure 5B:
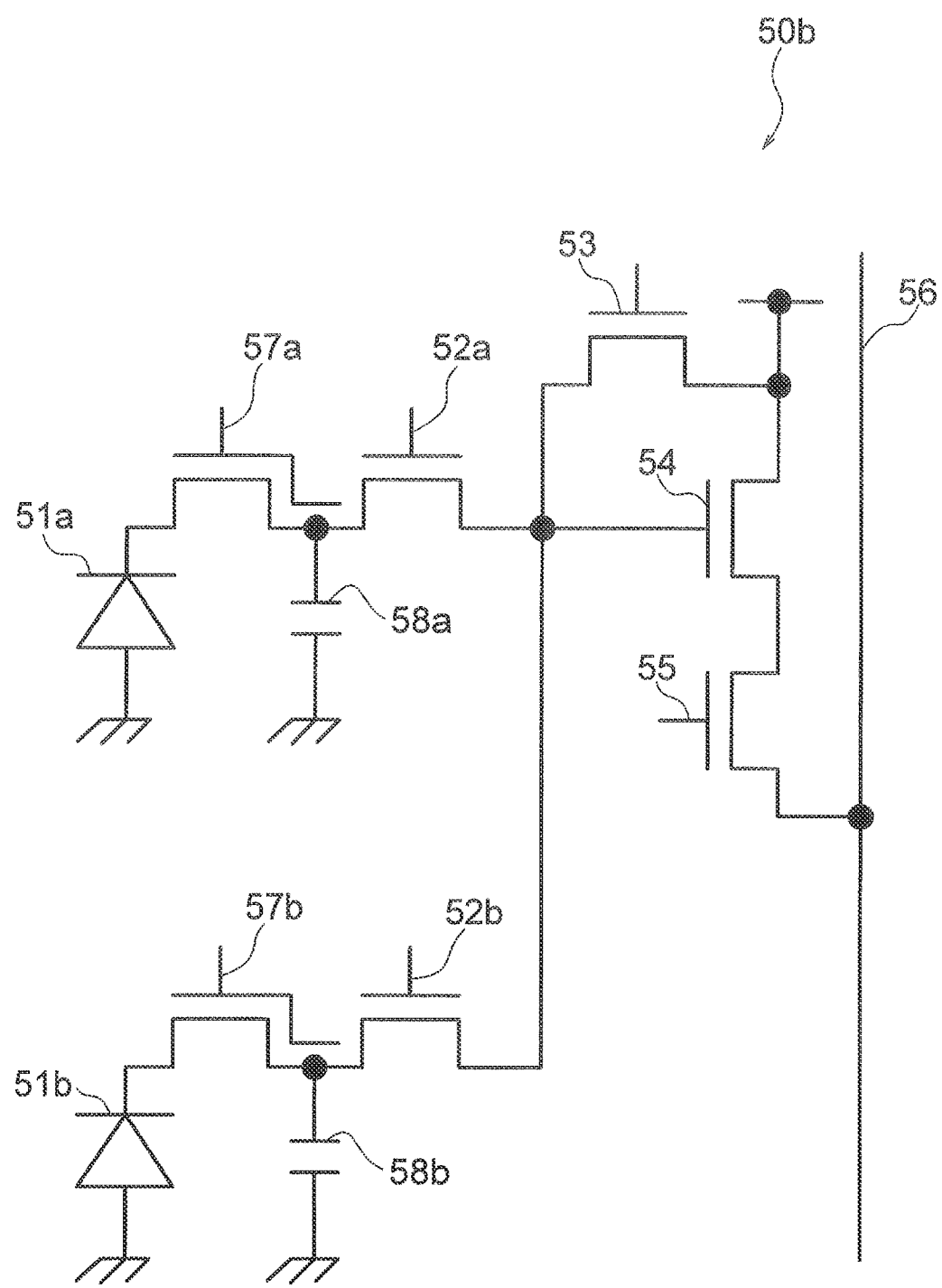
FIG. 5B is a diagram illustrating an example of an equivalent circuit diagram of pixels arrayed in the pixel array unit.

A pixel 50b illustrated in FIG. 5B includes two photodiodes 51a and 51b. A charge generated by photoelectric conversion of the photodiode 51a is temporarily held in a memory transistor 57a and a capacitor 58a. The held charge is transferred to the amplification transistor 54 by a transfer transistor 52a. In contrast, a charge generated by photoelectric conversion of the photodiode 51b is temporarily held in a memory transistor 57b and a capacitor 58b. The held charge is transferred to the amplification transistor 54 by a transfer transistor 52b.

The amplification transistor 54 outputs the pixel signal S12 corresponding to the amount of charge transferred from the transfer transistor 52a or the transfer transistor 52b to the selection transistor 55. The selection transistor 55 outputs the pixel signal S12 to the read wiring 56. The pixel signal S12 is transmitted to the pixel signal processing circuit 13 via the read wiring 56. A potential of each of the photodiodes 51a and 51b is reset by the reset transistor 53.

Figure 5C:
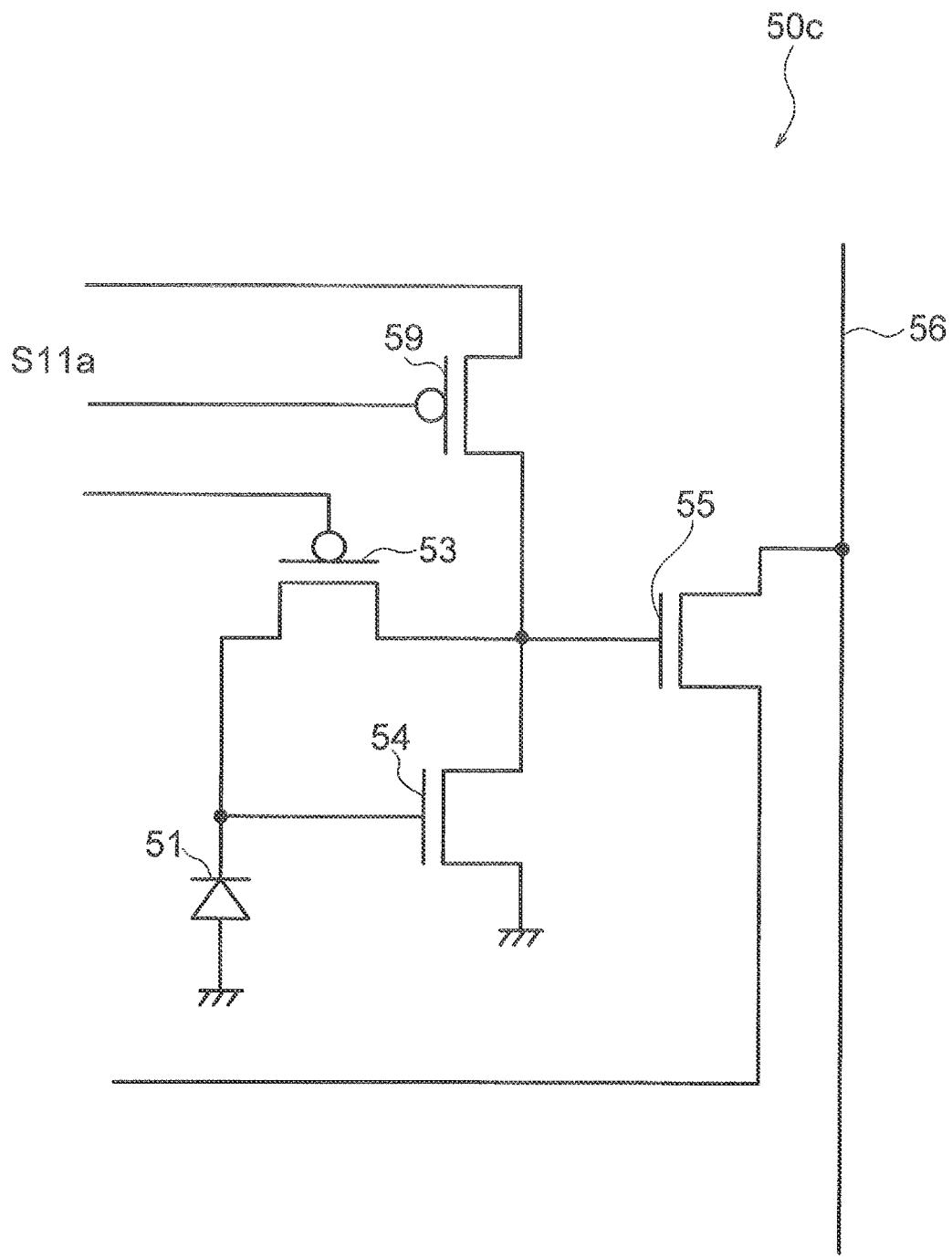
FIG. 5C is a diagram illustrating an example of an equivalent circuit diagram of pixels arrayed in the pixel array unit.

A pixel 50c illustrated in FIG. 5C is an example of a so-called pulse wide modulation (PWM) pixel. In the pixel 50c, a slope signal S11a, which is one of the pixel control signals S11, is input to a gate of a P-channel MOS transistor 59. The MOS transistor 59 is connected in series with the amplification transistor 54. The selection transistor 55 outputs a PWM pixel signal S12 indicating a comparison result between an output of the MOS transistor 59 and an output of the amplification transistor 54 to the read wiring 56. The pixel signal S12 is transmitted to the pixel signal processing circuit 13 via the read wiring 56.

Figure 5D:
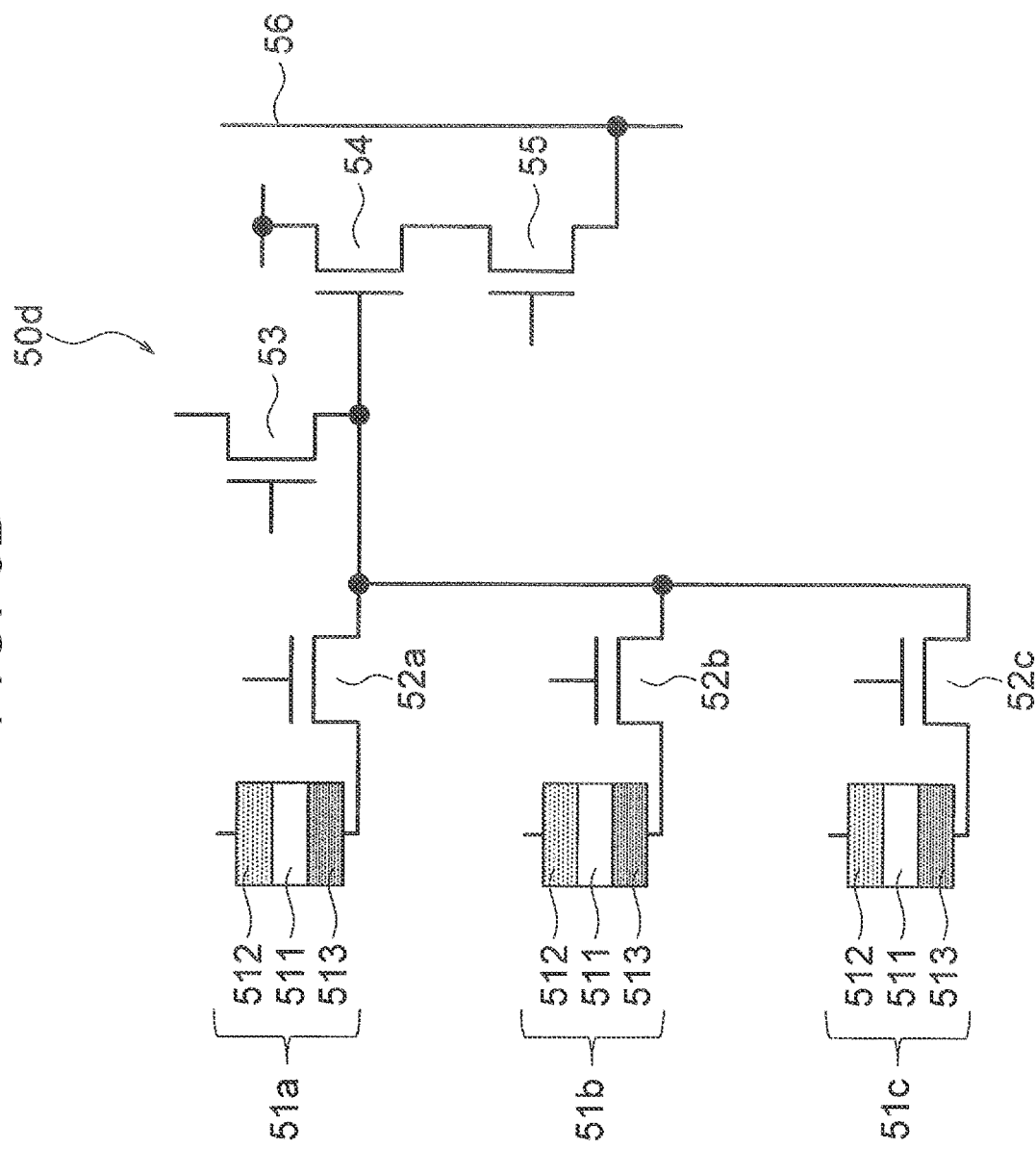
FIG. 5D is a diagram illustrating an example of an equivalent circuit diagram of pixels arrayed in the pixel array unit.

In a pixel 50d illustrated in FIG. 5D, photodiodes 51a to 51c each include a photoelectric conversion film 511, a transparent electrode 512, and a lower electrode 513. The photoelectric conversion film 511 is an organic photoelectric conversion film or an inorganic photoelectric conversion film. The transparent electrode 512 is arranged on an upper surface of the photoelectric conversion film 511. The lower electrode 513 is arranged on the upper surface of the photoelectric conversion film 511. That is, the transparent electrode 512 is interposed between the transparent electrode 512 and the lower electrode 513. For example, the photoelectric conversion film 511 controls a voltage of the transparent electrode 512 to implement a global shutter.

Charges photoelectrically converted by the photoelectric conversion film 511 of the photodiodes 51a to 51c are transferred to the amplification transistor 54 by the transfer transistors 52a to 52c, respectively. The amplification transistor 54 outputs the pixel signal S12 according to an amount of charge accumulated in the photodiode 51 to the selection transistor 55. The selection transistor 55 outputs the pixel signal S12 to the read wiring 56. The pixel signal S12 is transmitted to the pixel signal processing circuit 13 via the read wiring 56. A potential of each photodiode is reset by the reset transistor 53.

Figure 5E:
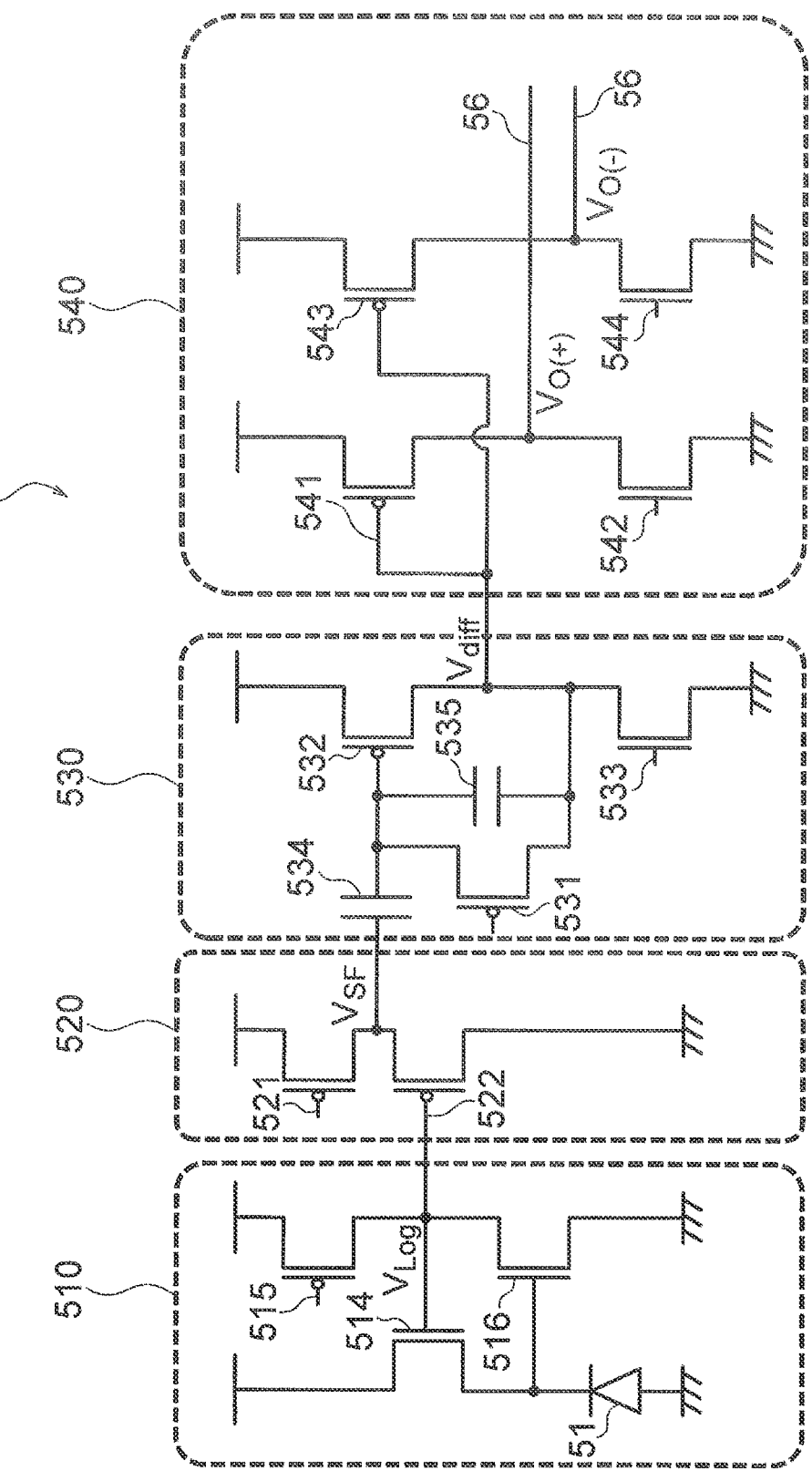
FIG. 5E is a diagram illustrating an example of an equivalent circuit diagram of pixels arrayed in the pixel array unit.

A pixel 50e illustrated in FIG. 5E is an example of a dynamic vision sensor (DVS) pixel that outputs a change in brightness. The pixel 50e includes a logarithmic conversion circuit 510, a buffer circuit 520, a subtraction circuit 530, and a quantization circuit 540.

The logarithmic conversion circuit 510 includes the photodiode 51, an N-channel MOS transistor 514, a P-channel MOS transistor 515, and an N-channel MOS transistor 516. The photodiode 51 and the MOS transistor 514 are connected in series. Furthermore, the MOS transistor 515 and the MOS transistor 516 are also connected in series. Moreover, a gate of the MOS transistor 514 is connected to a drain of the MOS transistor 515 and a drain of the MOS transistor 516. In the logarithmic conversion circuit 510, the charge photoelectrically converted by the photodiode 51 is converted into a logarithmic output voltage Vlog.

The buffer circuit 520 includes a P-channel MOS transistor 521 and a P-channel MOS transistor 522. The MOS transistor 521 and the MOS transistor 522 are connected in series. The buffer circuit 520 outputs a source follower voltage VSF obtained by performing impedance conversion on the voltage Vlog input to a gate of the MOS transistor 522.

The subtraction circuit 530 includes a P-channel MOS transistor 531, a P-channel MOS transistor 532, an N-channel MOS transistor 533, and capacitors 534 and 535. The MOS transistor 532 and the MOS transistor 533 are connected in series. The capacitor 534 is connected to a gate of the MOS transistor 532. The MOS transistor 531 and the capacitor 535 are connected in parallel between the gate and a drain of the MOS transistor 532. The subtraction circuit 530 outputs a differential voltage Vdiff from a previous signal.

The quantization circuit 540 includes a P-channel MOS transistor 541, an N-channel MOS transistor 542, a P-channel MOS transistor 543, and an N-channel MOS transistor 544. The MOS transistor 541 and the MOS transistor 542 are connected in series. Furthermore, the MOS transistor 543 and the MOS transistor 544 are also connected in series. In the quantization circuit 540, the differential voltage Vdiff input to a gate of each of the MOS transistor 541 and the MOS transistor 543 is compared with two thresholds. Thereafter, a comparison result (VO(+) and VO(−)) is transmitted as the pixel signal S12 to the pixel signal processing circuit 13 via the read wiring 56. The pixel signal processing circuit 13 determines "+1", "0", and "−1" on the basis of the pixel signal S12.

The pixels arrayed in the pixel array unit 11 are not limited to the pixels 50a to 50e illustrated in FIGS. 5A to 5E. For example, in the pixel array unit 11, a so-called convolution pixel to add the pixel signals S12 of the respective pixels may be arrayed. Furthermore, in addition to the CMOS image sensor and the DVS described above, a polarization sensor or a multispectral sensor may be arrayed in the pixel array unit 11.

The polarization sensor further includes a diffraction element that polarizes light incident on the photodiode 51. In contrast, the multispectral sensor further includes a color filter that color-separates the light incident on the photodiode 51.

Figure 6:
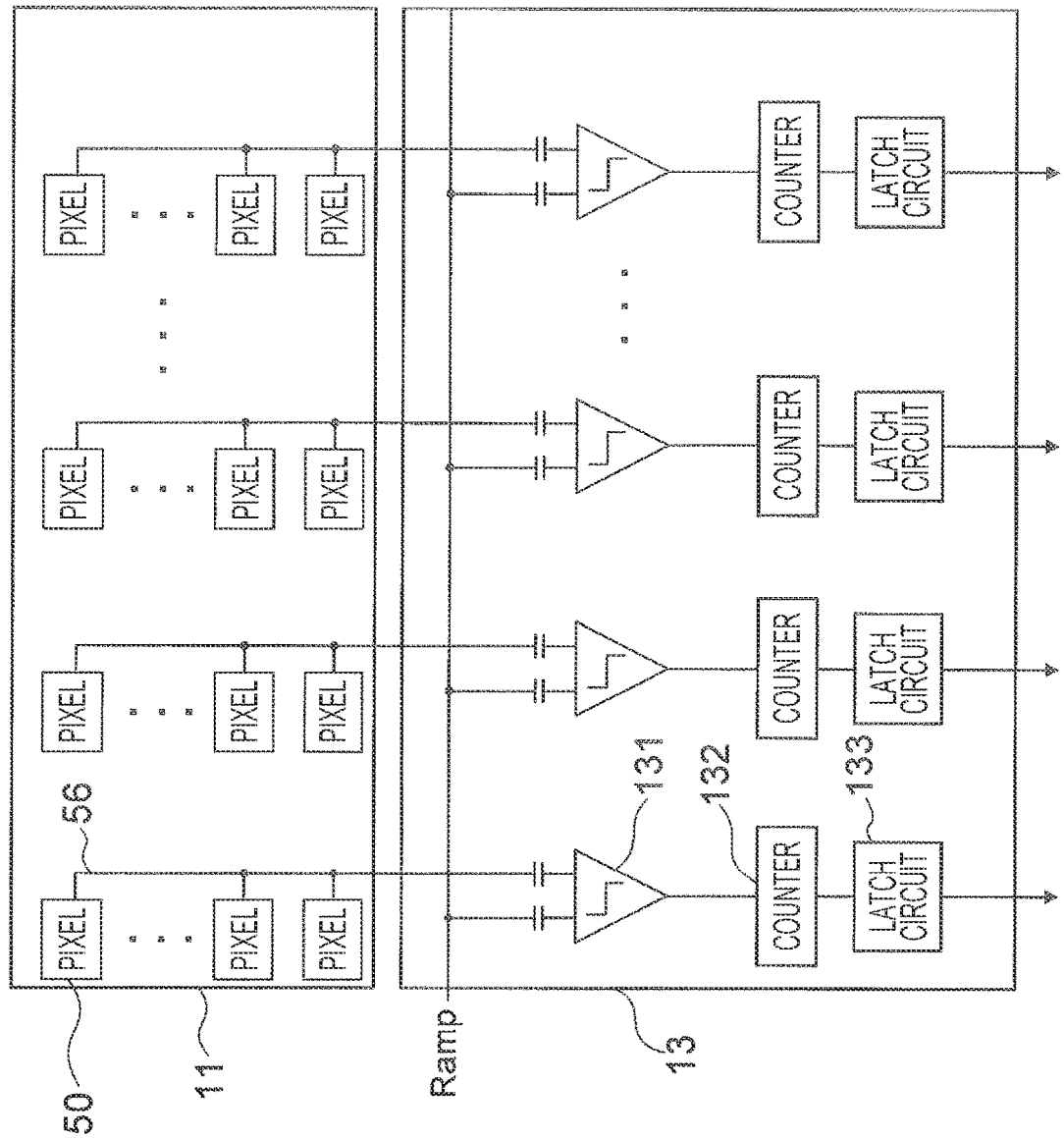
FIG. 6 is a diagram illustrating an example of a circuit configuration of an ADC included in a pixel signal processing circuit.

FIG. 6 is a diagram illustrating an example of a circuit configuration of an analog to digital converter (ADC) included in the pixel signal processing circuit 13. The ADC illustrated in FIG. 6 includes a plurality of comparators 131, a plurality of counters 132, and a plurality of latch circuits 133.

The pixel signal S12 of the pixel 50 corresponding to any one of the pixels 50a to 50e described above is input to a non-inverted input terminal of the comparator 131. A ramp signal RAMP of a triangular wave is input to an inverted input terminal. Each comparator 131 outputs a comparison result between the pixel signal S12 and the ramp signal RAMP. Each counter 132 is connected to an output terminal of the comparator 131. Each counter 132 counts a change time of an output level of the comparator 131. Each latch circuit 133 holds a count result of each counter 132.

Note that, the ADC included in the pixel signal processing circuit 13 is not limited to a single-slope ADC illustrated in FIG. 6. The pixel signal processing circuit 13 may include, for example, a pixel ADC that processes the pixel signal S12 for each pixel, a column ADC that counts a comparison time of a plurality of comparators 131 with one counter 132, a double integration ADC including an integration circuit, a successive approximation (SAR) ADC, a ΔΣ ADC or the like. Furthermore, resolution of the ADC may be appropriately selected within a range of 1 bit to 12 bits, for example.

FIG. 7 is a diagram illustrating a schematic circuit configuration of the memory array unit 21. As illustrated in FIG. 7, in the memory array unit 21, a plurality of memory cells 71 is arranged in a two-dimensional manner. Each memory cell 71 is arranged in the vicinity of an intersection of signal wiring 72 and read wiring 73. Note that, the memory cells 71 may be arranged in a three-dimensional manner. In this case, a plurality of memory cells 71 is arranged in the X direction, the Y direction, and the Z direction.

As the memory cell 71, for example, a resistive random access memory (ReRAM), a phase change memory (PCM), a magnetoresistive random memory (MRAM), a ferroelectric random access memory (FeRAM) or the like may be applied. Furthermore, the memory cell 71 may be a static random access memory (SRAM) or a nonvolatile memory.

The memory cell 71 holds the memory value (for example, +1, −1, 0.5). The memory array unit 21 multiplies the memory value of each memory cell 71 by a signal value of the memory cell control signal S14 input as the input signal from the CIM input control circuit 22 via the signal wiring 72. Subsequently, the memory array unit 21 sequentially adds multiplication results in units of rows or columns via the read wiring 73. Therefore, a digital convolution signal S15 indicating a product-sum operation result is read to the CIM read circuit 23. In a case where the convolution signal S15 is of an analog type, the input signal via the signal wiring 72 is multiplied by the memory value, and then the charge is added thereto on the read wiring 73, and the convolution signal S15 is read to the CIM read circuit 23. At that time, the input signals may be collectively input to the entire signal wiring 72, and in a case where the CIM read circuit 23 is a column ADC, the convolution signals S15 may be collectively read from the entire read wiring 73.

FIG. 8A is a cross-sectional view illustrating an example of an arrangement relationship of the read wiring 56 of the pixel signal S12 and the read wiring 73 of the convolution signal S15. In FIG. 8A, the read wiring 56 is arranged on a bottom surface (rear surface) side of the first substrate 101, and the read wiring 73 is arranged on an upper surface (front surface) side of the second substrate 102. Therefore, the read wiring 56 and the read wiring 73 are arranged in such a manner that they are partially opposed to each other in the stacking direction (Z direction), FIG. 8B is a cross-sectional view illustrating another example of an arrangement relationship of the read wiring 56 of the pixel signal S12 and the read wiring 73 of the convolution signal S15. In FIG. 8B, the read wiring 56 is arranged on the bottom surface (rear surface) side of the first substrate 101, whereas the read wiring 73 is arranged on a bottom surface (rear surface) side of the second substrate 102. Therefore, the read wiring 73 is arranged so as to be opposed to the read wiring 56 with the second substrate 102 interposed therebetween. In FIG. 8B, in a case where the second substrate 102 is an insulating substrate such as a glass substrate, a shield is preferably provided. Furthermore, since the first substrate 101 and the second substrate 102 are stacked, the second substrate 102 is preferably thin in order to make the imaging device 1 compact. However, it is preferable that the second substrate 102 is formed by using a material suitable for shielding interference noise between the read wiring 56 and the read wiring 73, and a thickness sufficient for noise shielding is secured.

According to this embodiment described above, the first substrate 101 on which the pixel array unit 11 is formed and the second substrate 102 on which the memory array unit 21 is formed are stacked. A transmission distance of the pixel signal S12 from the pixel array unit 11 to the memory array unit 21 is shortened by a stacked arrangement of the pixel array unit 11 and the memory array unit 21. Therefore, reduction in power of the imaging device 1 may be implemented. Furthermore, the above-described stacked arrangement contributes to downsizing of the layout of an entire chip, and this downsizing also contributes to the reduction in power of the imaging device 1.

In contrast, when the pixel array unit 11 and the memory array unit 21 are arranged in a stacked manner, there is a possibility that interference noise occurs between the read wiring 56 of the pixel signal S12 and the read wiring 73 of the convolution signal S15.

Therefore, in this embodiment, the read wiring 56 and the read wiring 73 are arranged so as to intersect each other. That is, the output direction of the pixel signal S12 is made intersect the output direction of the convolution signal S15. Therefore, the interference noise between the read wiring 56 and the read wiring 73 may be reduced. As a result, a quality of both the pixel signal S12 and the convolution signal S15 is improved, so that operation accuracy of DNN may be improved.

Second Embodiment

Hereinafter, a second embodiment will be described focusing on differences from the first embodiment. In this embodiment, components similar to those of the first embodiment are denoted by the same reference numerals, and are not described in detail.

FIGS. 9A to 9G are diagrams illustrating an example of a circuit layout of an imaging device according to the second embodiment. Note that, only the pixel control circuit 12, the pixel signal processing circuit 13, the logic circuit 15, the CIM input control circuit 22, and the CIM read circuit 23 are illustrated on the second substrate 102 in each drawing for convenience of space, and other circuits are not illustrated.

In this embodiment, as illustrated in FIGS. 9A to 9G, the output direction of the pixel signal S12 is parallel to the output direction of the convolution signal S15. That is, the read wiring 56 (output wiring) of the pixel signal S12 is parallel to the read wiring 73 (output wiring) of the convolution signal S15.

Moreover, in this embodiment, metal shield wiring 81 is arranged between the first substrate 101 and the second substrate 102 in order to suppress the interference noise generated between the read wiring 56 of the pixel signal S12 and the read wiring 73 of the convolution signal S15. The metal shield wiring 81 includes metal such as aluminum (Al), copper (Cu), or tungsten (W), for example. A potential of the metal shield wiring 81 may be a power supply potential of the first substrate 101 or the second substrate 102, or may be a ground potential. In consideration of power supply noise, the metal shield wiring 81 is preferably grounded.

Comparing the layout illustrated in FIG. 9A with the layout illustrated in FIG. 2A, the position of the CIM input control circuit 22 and the position of the CIM read circuit 23 are switched on the second substrate 102.

Figure 9B:
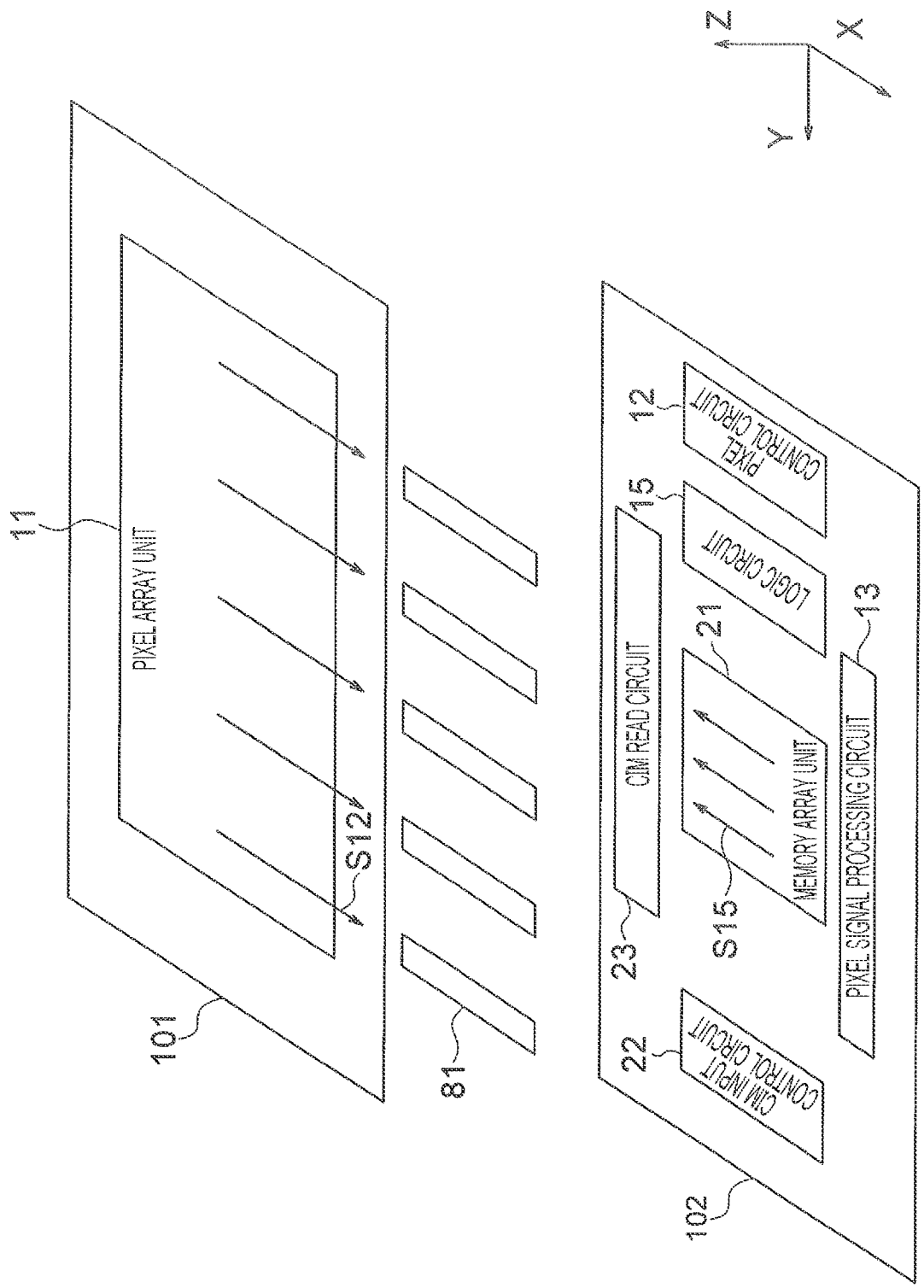
FIG. 9B is a diagram illustrating an example of a circuit layout of the imaging device according to the second embodiment.

Comparing the layout illustrated in FIG. 9B with the layout illustrated in FIG. 2B, the position of the CIM input control circuit 22 and the position of the CIM read circuit 23 are switched on the second substrate 102.

Furthermore, in FIG. 9B, a shape of the plane region of the memory array unit 21 is different from that in the layout illustrated in FIG. 9A. In FIG. 9A, the plane region of the memory array unit 21 is a rectangle with a short side in the X direction and a long side in the Y direction. In contrast, regarding the plane region illustrated in FIG. 9B, the plane region of the memory array unit 21 is a rectangle with a long side in the X direction and a short side in the Y direction.

In this embodiment also, the plane region of the memory array unit 21 may be a square, and is determined according to a specification of the product-sum operation. For example, in a case where the number of output channels of the convolution signal S15 is large, a large number of lines of the read wiring 73 are required. In this case, the rectangle of the memory array unit 21 illustrated in FIG. 9A is preferable.

Comparing the layout illustrated in FIG. 9C with the layout illustrated in FIG. 2C, the position of the CIM input control circuit 22 and the position of the CIM read circuit 23 are switched on the second substrate 102. In this layout also, the center of the memory array unit 21 is shifted in the X direction from the center of the pixel array unit 11, but the center position of the pixel array unit 11 and the center position of the memory array unit 21 are only required to be optimized according to the layout of the signal wiring and power supply wiring.

Figure 9D:
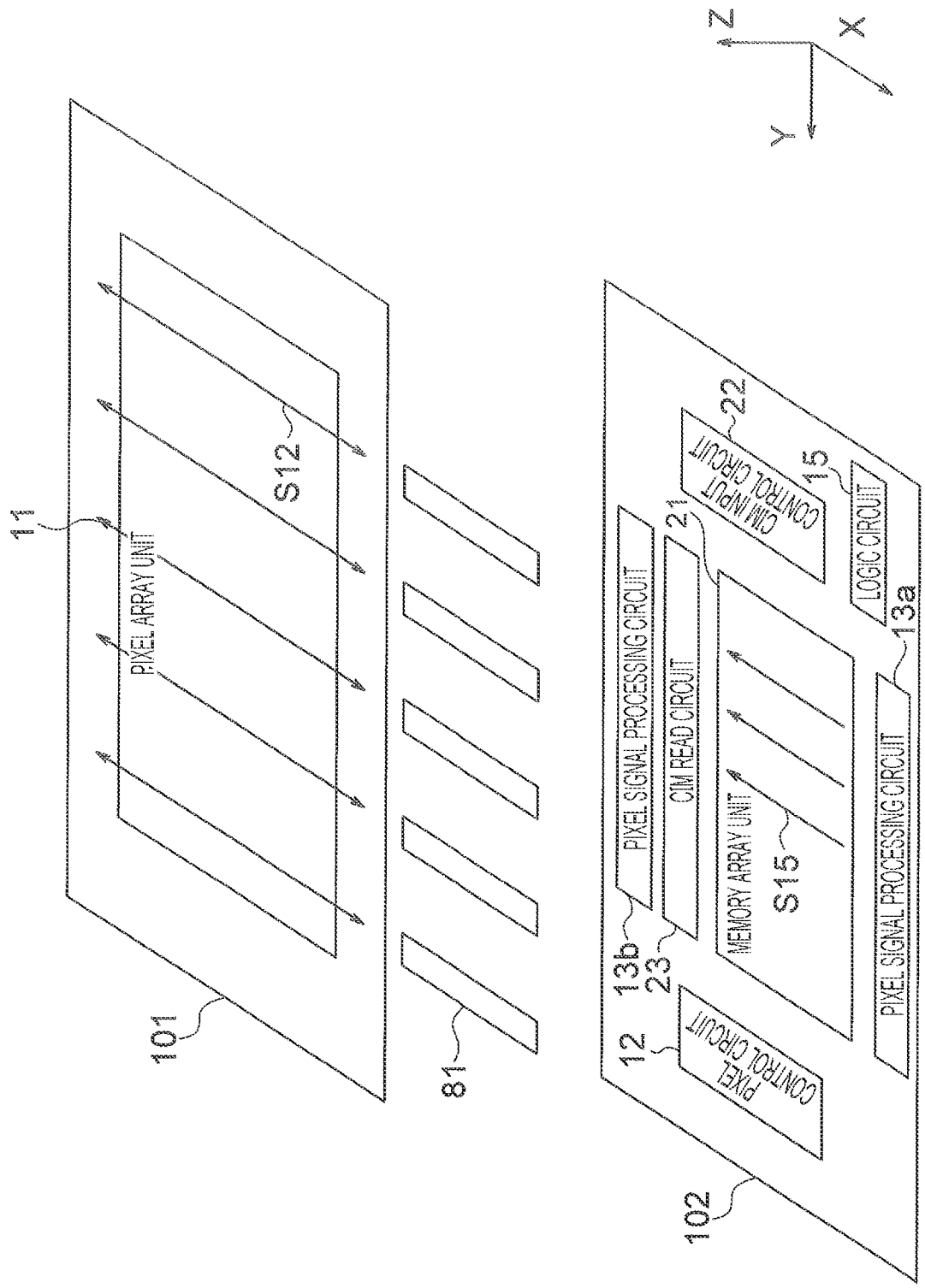
FIG. 9D is a diagram illustrating an example of a circuit layout of the imaging device according to the second embodiment.

Comparing the layout illustrated in FIG. 9D with the layout illustrated in FIG. 2D, the position of the CIM input control circuit 22 and the position of the CIM read circuit 23 are different on the second substrate 102. The CIM input control circuit 22 is arranged in the output direction of the convolution signal S15. In contrast, the CIM read circuit 23 is arranged between the memory array unit 21 and the pixel signal processing circuit 13b. In this embodiment also, the output direction of the pixel signal S12 may be multiple directions including the +X direction and the −X direction. Furthermore, the processing of the pixel signal S12 may be distributed to the pixel signal processing circuit 13a and the pixel signal processing circuit 13b according to the output direction of the pixel signal S12.

Comparing the layout illustrated in FIG. 9E with the layout illustrated in FIG. 2E, the position of the CIM input control circuit 22 and the position of the CIM read circuit 23 are switched on the second substrate 102. In this embodiment also, as illustrated in this layout, the output directions of the pixel signal S12 and the convolution signal S15 may be multiple directions.

In FIG. 9F, as in the layout illustrated in FIG. 2F, the pixel signal S12 is transmitted toward a central portion of the pixel array unit 11, that is, toward a central portion of the first substrate 1010. Furthermore, the pixel signal processing circuit 13 is arranged in a central portion of the second substrate 102. Therefore, the pixel array unit 11 and the pixel signal processing circuit 13 are electrically connected to each other at the central portion of the first substrate 101 and the second substrate 102, respectively.

Figure 9G:
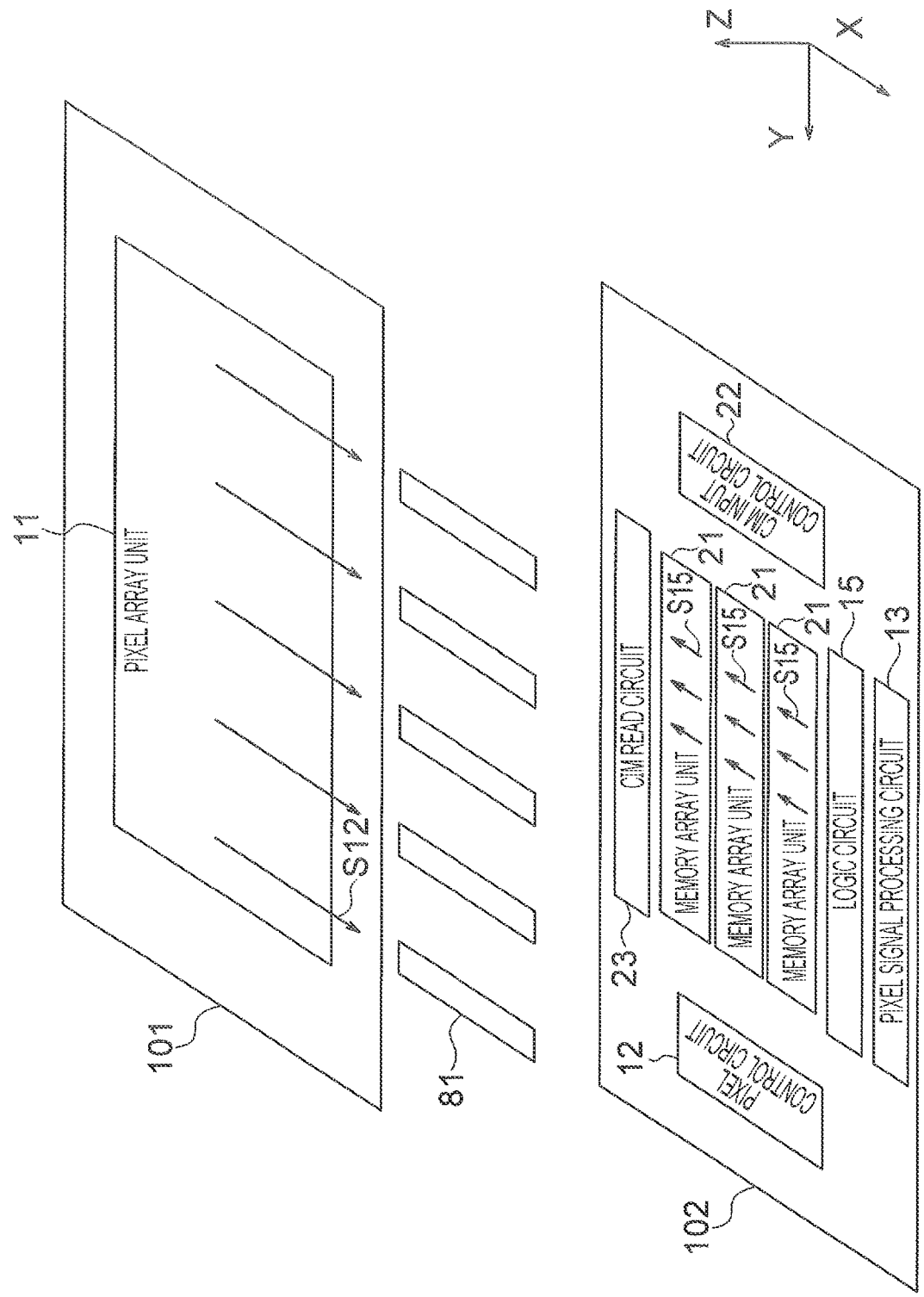
FIG. 9G is a diagram illustrating an example of a circuit layout of the imaging device according to the second embodiment.

Comparing the layout illustrated in FIG. 9G with the layout illustrated in FIG. 2G, the position of the CIM input control circuit 22 and the position of the CIM read circuit 23 are switched on the second substrate 102. In this embodiment also, a tiling structure in which a plurality of memory array units 21 is arrayed in the Y direction on the second substrate 102 may be adopted. Furthermore, in this embodiment also, a tiling structure in which the plurality of memory array units 21 is arrayed not only in the Y direction but also in the X direction may be adopted (refer to FIG. 3A), and the CIM read circuit 23 may be provided for each memory array unit 21 (refer to FIG. 3B).

FIGS. 10A to 10F are cross-sectional views illustrating an example of an arrangement relationship of the metal shield wiring 81 with respect to the read wiring 56 of the pixel signal S12 and the read wiring 73 of the convolution signal S15.

In FIG. 10A, a width W1 of the read wiring 56 is wider than a width W2 of the read wiring 73. Therefore, a width W3 of the metal shield wiring 81 is the same as that of the wider read wiring 56. Note that, in a case where the width W2 of the read wiring 73 is wider than the width W1 of the read wiring 56, the width W3 of the metal shield wiring 81 is the same as the width W2 of the read wiring 73.

In FIG. 10B, the width W3 of the metal shield wiring 81 is the widest among the read wiring 56, the read wiring 73, and the metal shield wiring 81. In this case, the interference noise may be further reduced as compared with the read wiring 73 illustrated in FIG. 10A.

In FIG. 10C, the metal shield wiring 81 is multilayer wiring in which metal shield wiring 81a and metal shield wiring 81b are stacked. The metal shield wiring 81a and the metal shield wiring 81b are arranged so as to be shifted from each other in the Y direction in such a manner that they are partially overlap each other. Therefore, a gap between the metal shield wiring and the metal shield wiring is eliminated between the read wiring 56 and the read wiring 73. In this case, the interference noise may be further reduced as compared with the read wiring 73 illustrated in FIG. 10B. Note that, the number of layers of the metal shield wiring 81 is not limited to two, and may be three or more.

In FIG. 10D, the number of lines of the read wiring 56 is larger than that of the read wiring 73. Furthermore, the width W2 of the read wiring 73 is wider than the width W1 of the read wiring 56. In a case where the number of lines is different between the read wiring 56 and the read wiring 73 in this manner, the width W3 of the metal shield wiring 81 is the same as or wider than the width of the wider read wiring (the read wiring 73 in FIG. 10D) in which the interference noise is likely to occur. As a result, the interference noise may be effectively reduced even when the number of lines is different between the read wiring 56 and the read wiring 73.

In FIG. 10E, a center pitch P1 of the read wiring 56 is smaller than a center pitch P2 of the read wiring 73. Furthermore, the width W2 of the read wiring 73 is wider than the width W1 of the read wiring 56. In a case where the center pitch is different between the read wiring 56 and the read wiring 73 in this manner, the width W3 of the metal shield wiring 81 is the same as or wider than the width of the wider read wiring (the read wiring 73 in FIG. 10E) in which the interference noise is likely to occur. Moreover, a center pitch P3 of the metal shield wiring 81 is also the same as the center pitch of the wider read wiring. As a result, the interference noise may be effectively reduced even when the center pitch is different between the read wiring 56 and the read wiring 73.

In FIG. 10F, the width W2 of the read wiring 73 is wider than the width W1 of the read wiring 56. Moreover, an interval D1 between the read wiring 56 and the metal shield wiring 81 is larger than an interval D2 between the read wiring 73 and the metal shield wiring 81. In a case where the width is different between the read wiring 56 and the read wiring 73 in this manner, the metal shield wiring 81 is arranged near the wider read wiring (the read wiring 73 in FIG. 10E) in which the interference noise is likely to occur. As a result, the interference noise may be more effectively reduced as compared to a case where the interval D1 is equal to the interval D2, that is, as compared with a mode in which the metal shield wiring 81 is arranged between the read wiring 56 and the read wiring 73.

FIG. 11 is a plane view illustrating another example of the arrangement relationship of the metal shield wiring 81 with respect to the read wiring 56 of the pixel signal S12 and the read wiring 73 of the convolution signal S15.

In FIG. 10C described above, the metal shield wiring 81b and the metal shield wiring 81b extend in the X direction in parallel to the read wiring 56 and the read wiring 73. In contrast, in FIG. 11, the metal shield wiring 81a and the metal shield wiring 81b extend in the Y direction perpendicular to the read wiring 56 and the read wiring 73. That is, the metal shield wiring 81a and the metal shield wiring 81b are perpendicular to the output direction of the image signal S13 and the convolution signal S15.

Furthermore, in FIG. 11, the metal shield wiring 81a and the metal shield wiring 81b are arranged so as to be shifted from each other in the X direction in such a manner that they are partially overlap each other. Therefore, a gap between the metal shield wiring and the metal shield wiring is eliminated between the read wiring 56 and the read wiring 73. Accordingly, the interference noise may be further reduced.

FIG. 12A is a cross-sectional view illustrating an example of an arrangement relationship of the read wiring 56 of the pixel signal S12 and the read wiring 73 of the convolution signal S15 in this embodiment. In FIG. 12A, the read wiring 56 is arranged on a bottom surface side of the first substrate 101, and the read wiring 73 is arranged on an upper surface side of the second substrate 102. Therefore, the read wiring 56 and the read wiring 73 are arranged so as to be opposed to each other in the stacking direction (Z direction) with the metal shield wiring 81 interposed therebetween.

FIG. 12B is a cross-sectional view illustrating another example of an arrangement relationship of the read wiring 56 of the pixel signal S12 and the read wiring 73 of the convolution signal S15. In FIG. 12B, the read wiring 56 is arranged on the bottom surface (rear surface) side of the first substrate 101, whereas the read wiring 73 is arranged on a bottom surface (rear surface) side of the second substrate 102. Therefore, the read wiring 73 is arranged so as to be opposed to the read wiring 56 with the second substrate 102 and the metal shield wiring 81 interposed therebetween. In this case also, it is preferable that the second substrate 102 is formed by using a material suitable for shielding the interference noise between the read wiring 56 and the read wiring 73, and a thickness sufficient for noise shielding is secured as in the arrangement illustrated in FIG. 8B.

In this embodiment described above also, since the first substrate 101 and the second substrate 102 are stacked as in the first embodiment, the transmission distance of the pixel signal S12 from the pixel array unit 11 to the memory array unit 21 is shortened. Therefore, reduction in power of the imaging device 1 may be implemented. Furthermore, the above-described stacked arrangement contributes to downsizing of the layout of an entire chip, and this downsizing also contributes to the reduction in power of the imaging device 1.

In contrast, in this embodiment, since the read wiring 56 of the pixel signal S12 and the read wiring 73 of the convolution signal S15 are parallel to each other, there is a possibility that interference noise occurs between the read wiring 56 and the read wiring 73.

Therefore, in this embodiment, the metal shield wiring 81 is arranged between the read wiring 56 and the read wiring 73. Therefore, interference noise between the read wiring 56 and the read wiring 73 may be reduced. As a result, a quality of both the pixel signal S12 and the convolution signal S15 is improved, so that operation accuracy of DNN may be improved.

Note that, the metal shield wiring 81 described in the second embodiment may be provided in the imaging device 1 according to the first embodiment described above. In this case, the interference noise between the read wiring 56 and the read wiring 73 may be further reduced.

Third Embodiment

Hereinafter, a third embodiment will be described focusing on differences from the first embodiment. In this embodiment, components similar to those of the first embodiment are denoted by the same reference numerals, and are not described in detail.

FIGS. 13A to 13D are diagrams illustrating an example of a circuit layout of an imaging device according to the third embodiment.

In FIGS. 13A to 13D, the pixel array unit 11 is arranged on the first substrate 101. Furthermore, on the second substrate 102, the memory array unit 21, the CIM input control circuit 22, and the CIM read circuit 23 are arranged. Moreover, the imaging device according to this embodiment also includes a third substrate 103. On the third substrate 103, the pixel control circuit 12, the pixel signal processing circuit 13, and the logic circuit 15 are arranged.

Figure 13A:
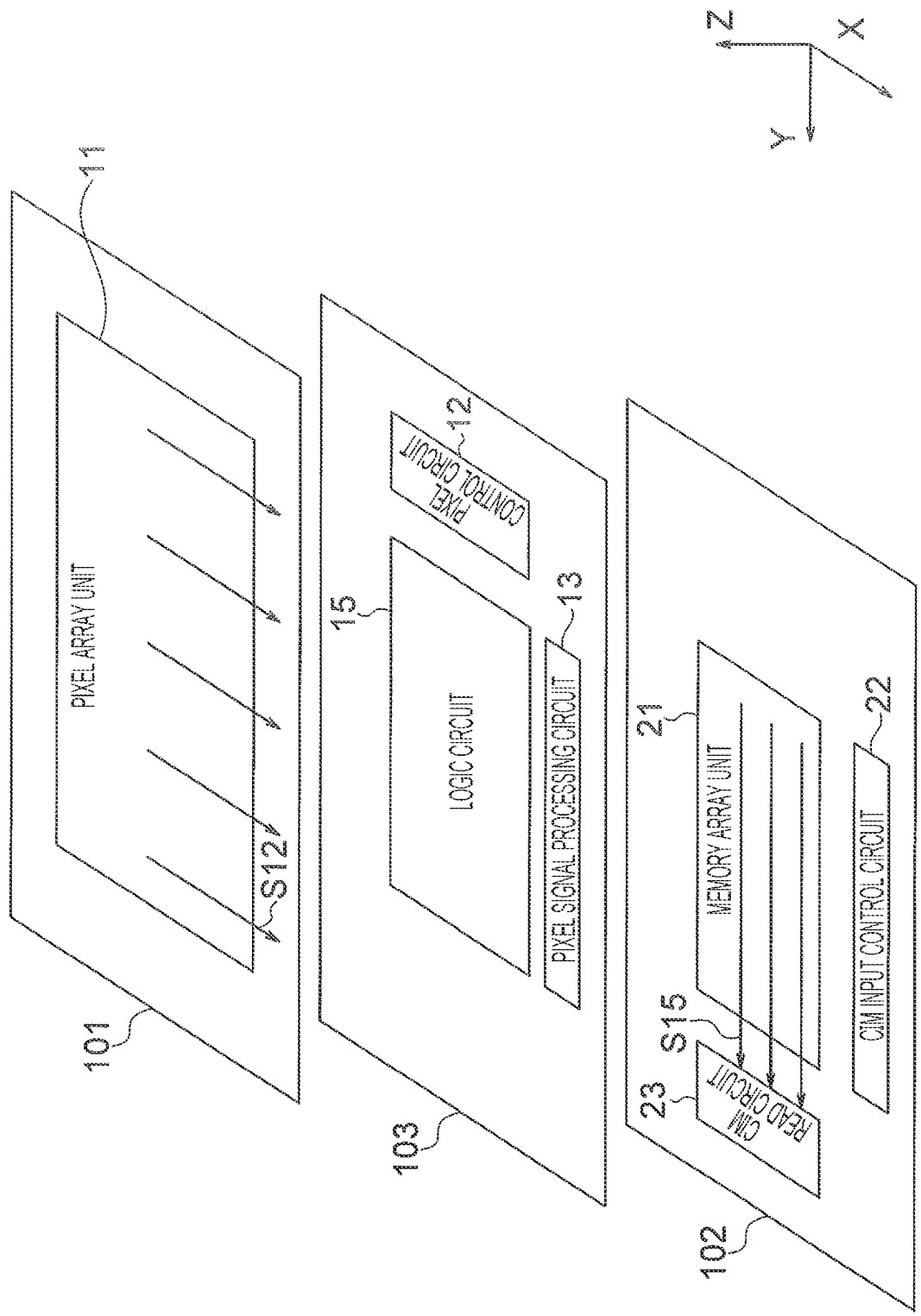
FIG. 13A is a diagram illustrating an example of a circuit layout of an imaging device according to a third embodiment.

In FIG. 13A, third substrate 103 is stacked between the first substrate 101 and the second substrate 102. Furthermore, the pixel signal processing circuit 13 includes a single-slope ADC that processes the pixel signal processing circuit 13 in units of pixel columns.

Figure 13B:
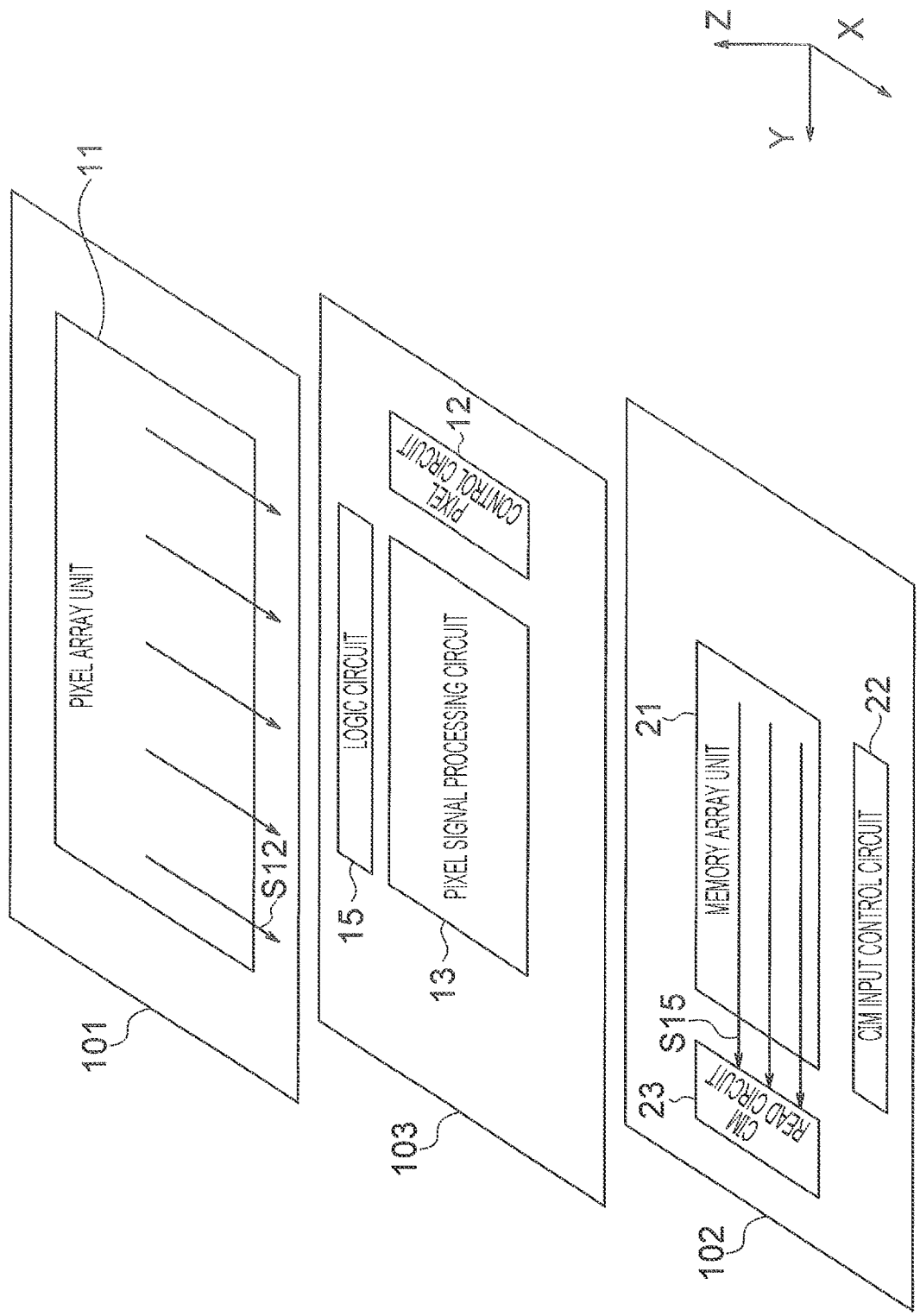
FIG. 13B is a diagram illustrating an example of a circuit layout of the imaging device according to the third embodiment.

Also in FIG. 13B, similarly to FIG. 13A, the third substrate 103 is stacked between the first substrate 101 and the second substrate 102. In contrast, the pixel signal processing circuit 13 includes a pixel ADC that processes the pixel signal processing circuit 13 for each pixel. Therefore, an area of the pixel signal processing circuit 13 in the third substrate 103 is larger than the area of the pixel signal processing circuit 13 illustrated in FIG. 13A.

Figure 13C:
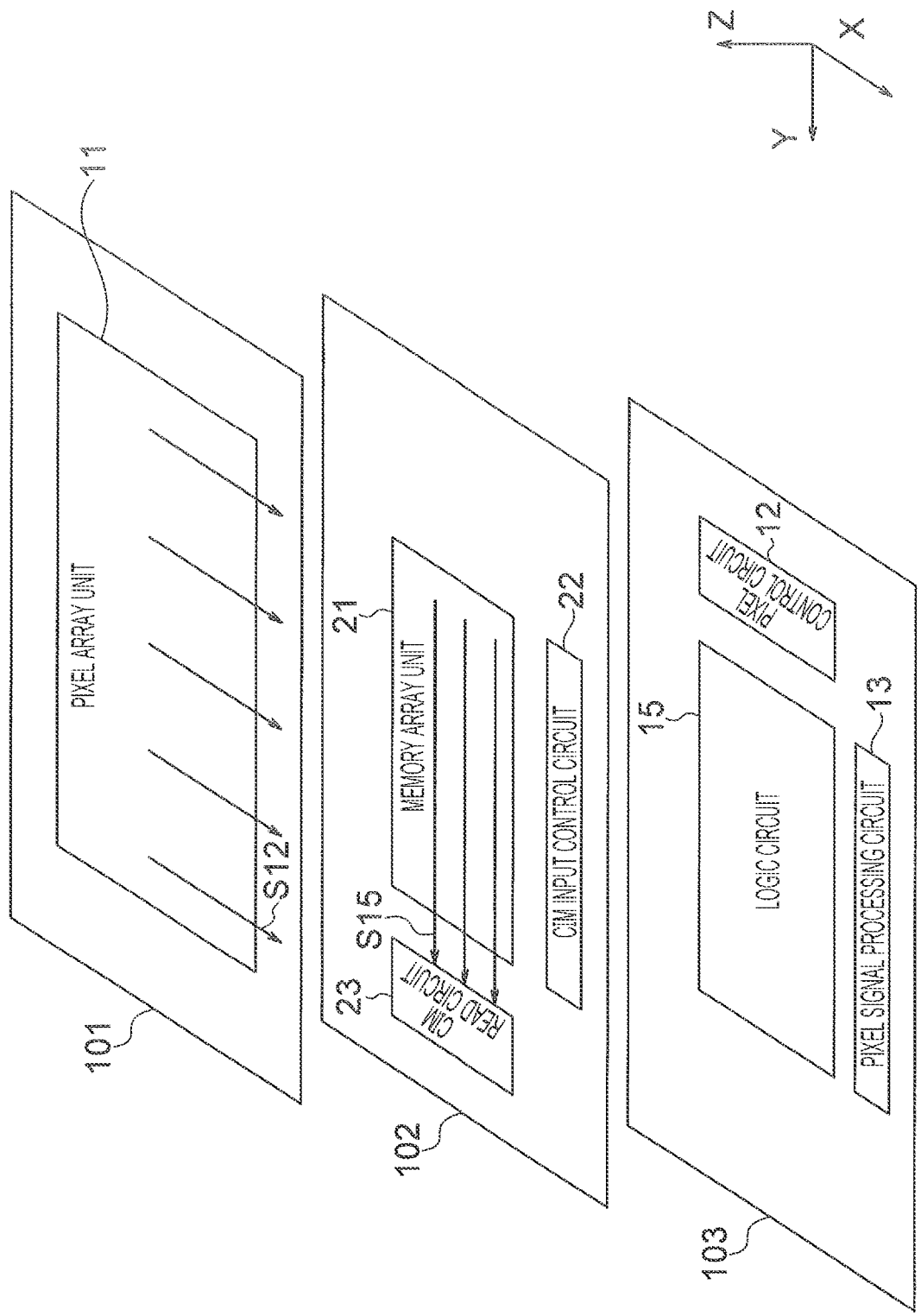
FIG. 13C is a diagram illustrating an example of a circuit layout of the imaging device according to the third embodiment.

FIG. 13C is the same as FIG. 13A except that the positions of the second substrate 102 and the third substrate 103 are switched. That is, in FIG. 13C, the second substrate 102 is stacked between the first substrate 101 and the third substrate 103.

Figure 13D:
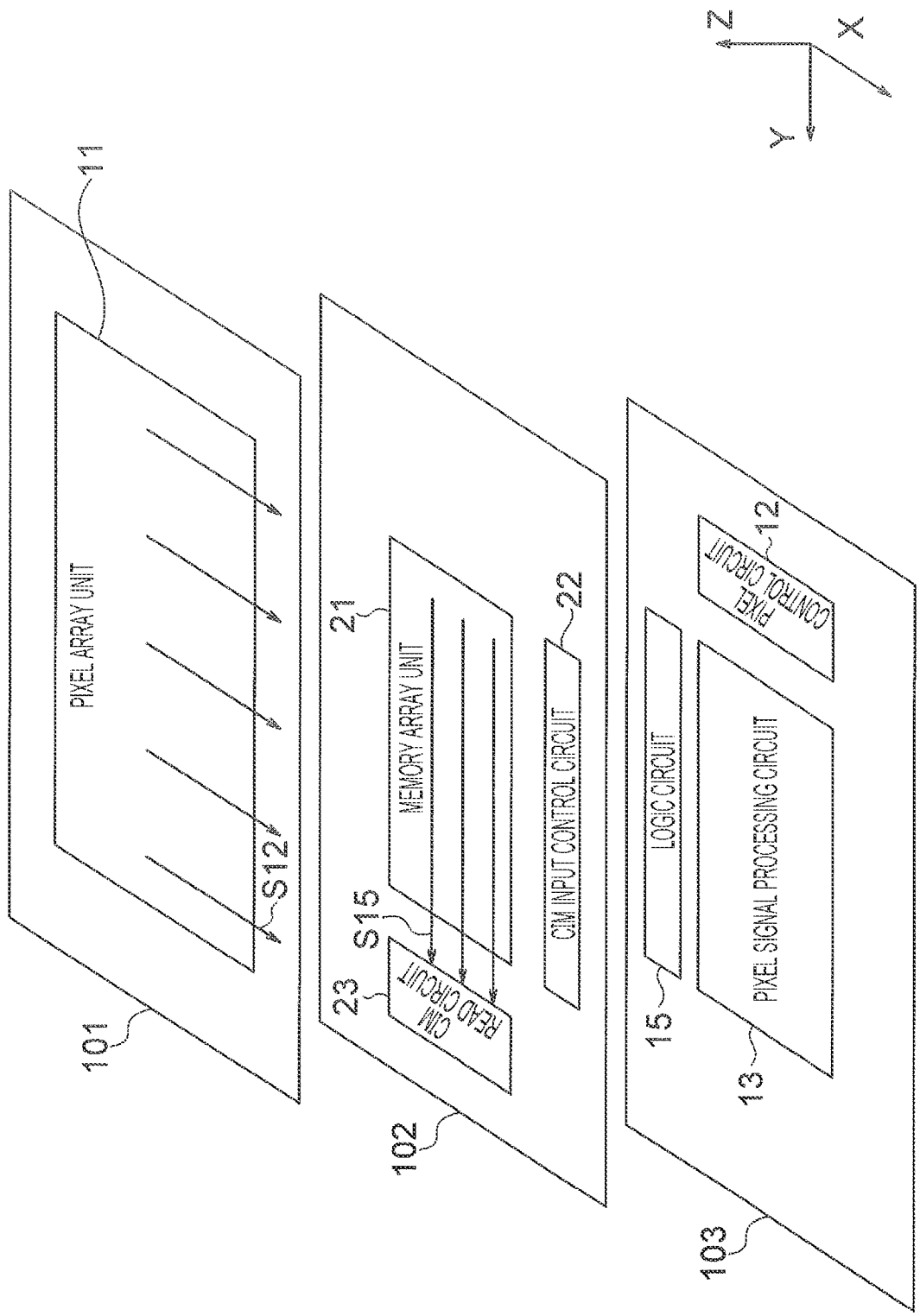
FIG. 13D is a diagram illustrating an example of a circuit layout of the imaging device according to the third embodiment.

FIG. 13D is the same as FIG. 13B except that the positions of the second substrate 102 and the third substrate 103 are switched. In this embodiment, as long as the first substrate 101 on which the pixel array unit 11 is mounted is arranged in the uppermost layer, the stacking order of the second substrate 102 and the third substrate 103 may be switched.

FIG. 14A is a cross-sectional view illustrating an example of an arrangement relationship of the read wiring 56 of the pixel signal S12 and the read wiring 73 of the convolution signal S15 in this embodiment. As illustrated in FIGS. 13A and 13B, in a case where the third substrate 103 is stacked between the first substrate 101 and the second substrate 102, as illustrated in FIG. 14A, the read wiring 56 and the read wiring 73 are arranged in such a manner that they are partially opposed to each other in the stacking direction with the third substrate 103 interposed therebetween.

Furthermore, on the third substrate 103, the signal wiring 80 for transmitting the image signal S13 processed by the pixel signal processing circuit 13 to the CIM input control circuit 22 is formed. In order to reduce interference noise between the signal wiring 80 and the read wiring 73, the signal wiring 80 is also preferably perpendicular to the read wiring 73 similarly to the read wiring 56.

FIG. 14B is a cross-sectional view illustrating another example of an arrangement relationship of the read wiring 56 of the pixel signal S12 and the read wiring 73 of the convolution signal S15 in this embodiment. As illustrated in FIGS. 13C and 13D, in a case where the second substrate 102 is stacked between the first substrate 101 and the third substrate 103, the read wiring 56 and the read wiring 73 are arranged in such a manner that they are partially opposed to each other in the stacking direction (Z direction). Note that, in this case also, similarly to the read wiring 56, the signal wiring 80 is preferably perpendicular to the read wiring 73. Therefore, the interference noise between the signal wiring 80 and the read wiring 73 may be reduced. Note that, in this embodiment, the circuit elements forming the imaging device may be arranged on four or more substrates stacked on one another. In this case, if the first substrate 101 on which the pixel array unit 11 is mounted is arranged in the uppermost layer, the arrangement of other substrates may be in random order.

According to this embodiment described above, since the first substrate 101, the second substrate 102, and the third substrate 103 are stacked, the transmission distance of the pixel signal S12 from the pixel array unit 11 to the memory array unit 21 is shortened. Therefore, reduction in power of the imaging device 1 may be implemented.

Furthermore, in this embodiment, as in the first embodiment, since the read wiring 56 and the read wiring 73 intersect each other, the interference noise between the read wiring 56 and the read wiring 73 may be reduced. As a result, especially, a quality of both the pixel signal S12 and the convolution signal S15 is improved, so that operation accuracy of DNN may be improved.

Fourth Embodiment

Figure 15:
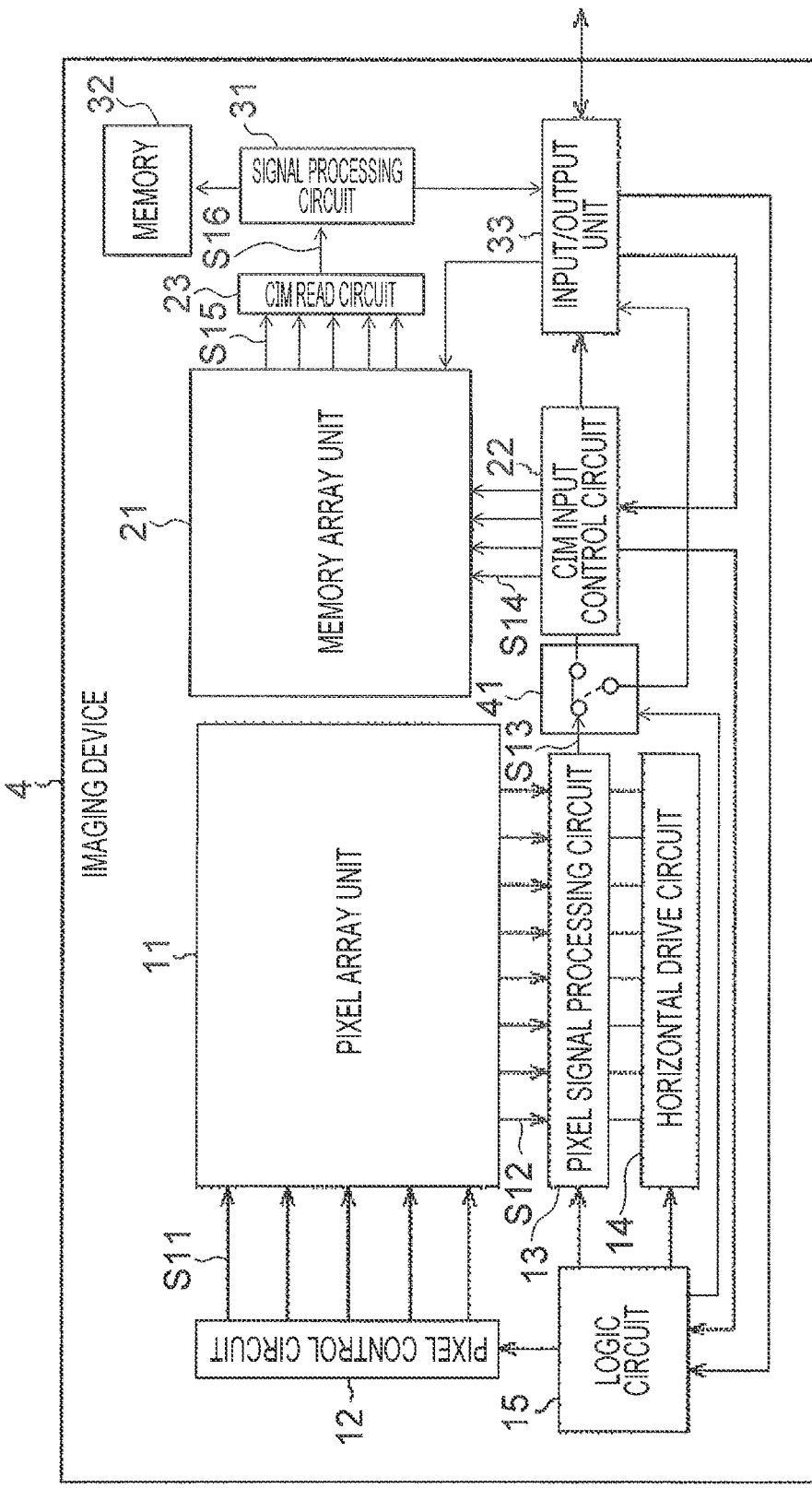
FIG. 15 is a block diagram illustrating a configuration of an imaging device according to a fourth embodiment.

FIG. 15 is a block diagram illustrating a configuration of an imaging device according to a fourth embodiment. An imaging device 4 according to this embodiment further includes a switch 41 in addition to the components of the imaging device 1 according to the first embodiment.

The switch 41 is arranged between the pixel signal processing circuit 13 and the CIM input control circuit 22.

In a case where a product-sum operation is performed on image data, the switch 41 connects the pixel signal processing circuit 13 to the CIM input control circuit 22 on the basis of the control of the logic circuit 15. Furthermore, in a case where the image signal S13 is output to the outside of the imaging device 4, the switch 41 connects the pixel signal processing circuit 13 to the input/output unit 33 on the basis of the control of the logic circuit 15. In this case, the image signal S13 is output to the outside via the input/output unit 33. Note that, in this embodiment, the switch 41 is provided between the pixel signal processing circuit 13 and the CIM input control circuit 22, but may be provided in the CIM input control circuit 22.

In this embodiment described above, the switch 41 may switch an output destination of the image signal S13 generated by the pixel signal processing circuit 13 to the CIM input control circuit 22 or the input/output unit 33. Therefore, a destination of the image signal S13 may be selected according to a purpose of use.

Fifth Embodiment

Figure 16:
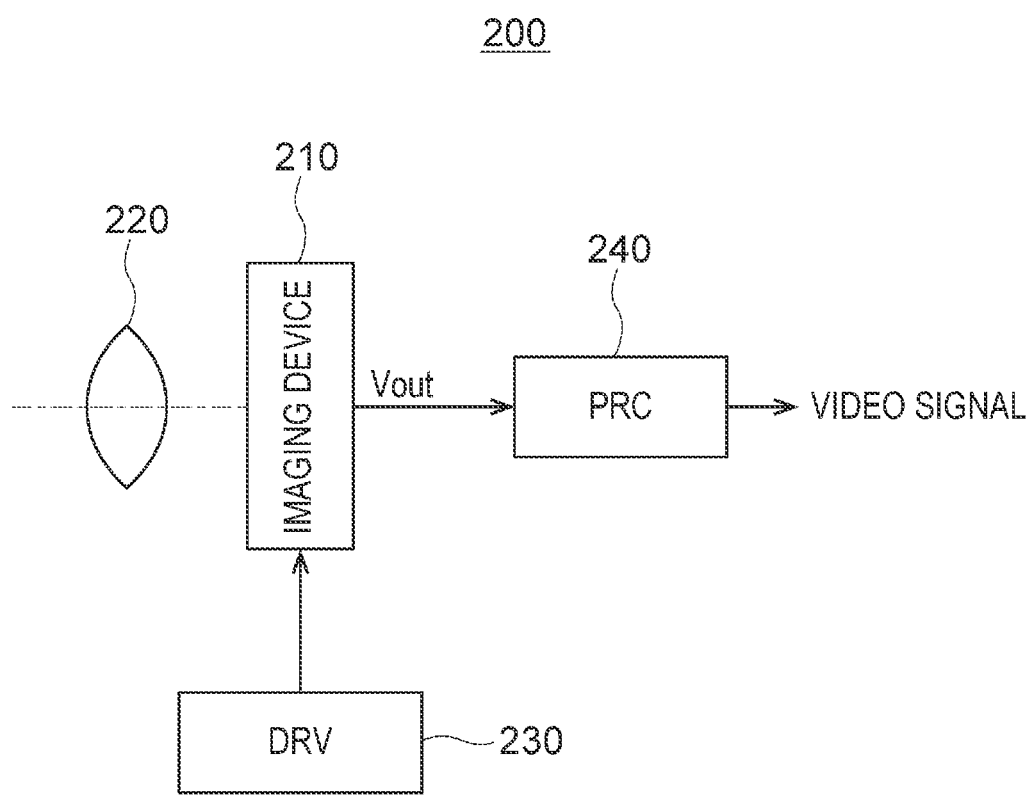
FIG. 16 is a diagram illustrating an example of a configuration of an electronic device according to a fifth embodiment.

FIG. 16 is a diagram illustrating an example of a configuration of an electronic device according to a fifth embodiment. An electronic device 200 according to this embodiment is a camera system, and includes an imaging device 210, a lens 220, a drive circuit (DRV) 230, and a signal processing circuit (PRC) 240 as illustrated in FIG. 16.

Any one of the imaging devices according to the first to fourth embodiments described above may be applied to the imaging device 210. The lens 220 forms an image of incident light (image light) on an imaging surface.

The drive circuit 230 includes a timing generator (not illustrated) that generates various timing signals including a start pulse and a clock pulse that drive a circuit in the imaging device 210, and drives the imaging device 210 with a predetermined timing signal.

Furthermore, the signal processing circuit 240 performs predetermined signal processing on an output signal of the imaging device 210. The image signal processed by the signal processing circuit 240 is recorded in a recording medium such as a memory, for example. Image information recorded on the recording medium is hard-copied by a printer or the like. Furthermore, the image signal processed by the signal processing circuit 240 is displayed as a moving image on a monitor including a liquid crystal display or the like.

According to this embodiment described above, in the electronic device 200 such as a digital still camera, the imaging device according to each of the embodiments described above may be mounted as the imaging device 210, thereby implementing a highly accurate imaging function.

Application Example to Mobile Body

The technology according to an embodiment of the present disclosure (the present technology) may be applied to various products. For example, the technology according to an embodiment of the present disclosure may also be implemented as a device mounted on any type of mobile body such as an automobile, an electric automobile, a hybrid electric automobile, a motorcycle, a bicycle, a personal mobility, an airplane, a drone, a ship, and a robot.

Figure 17:
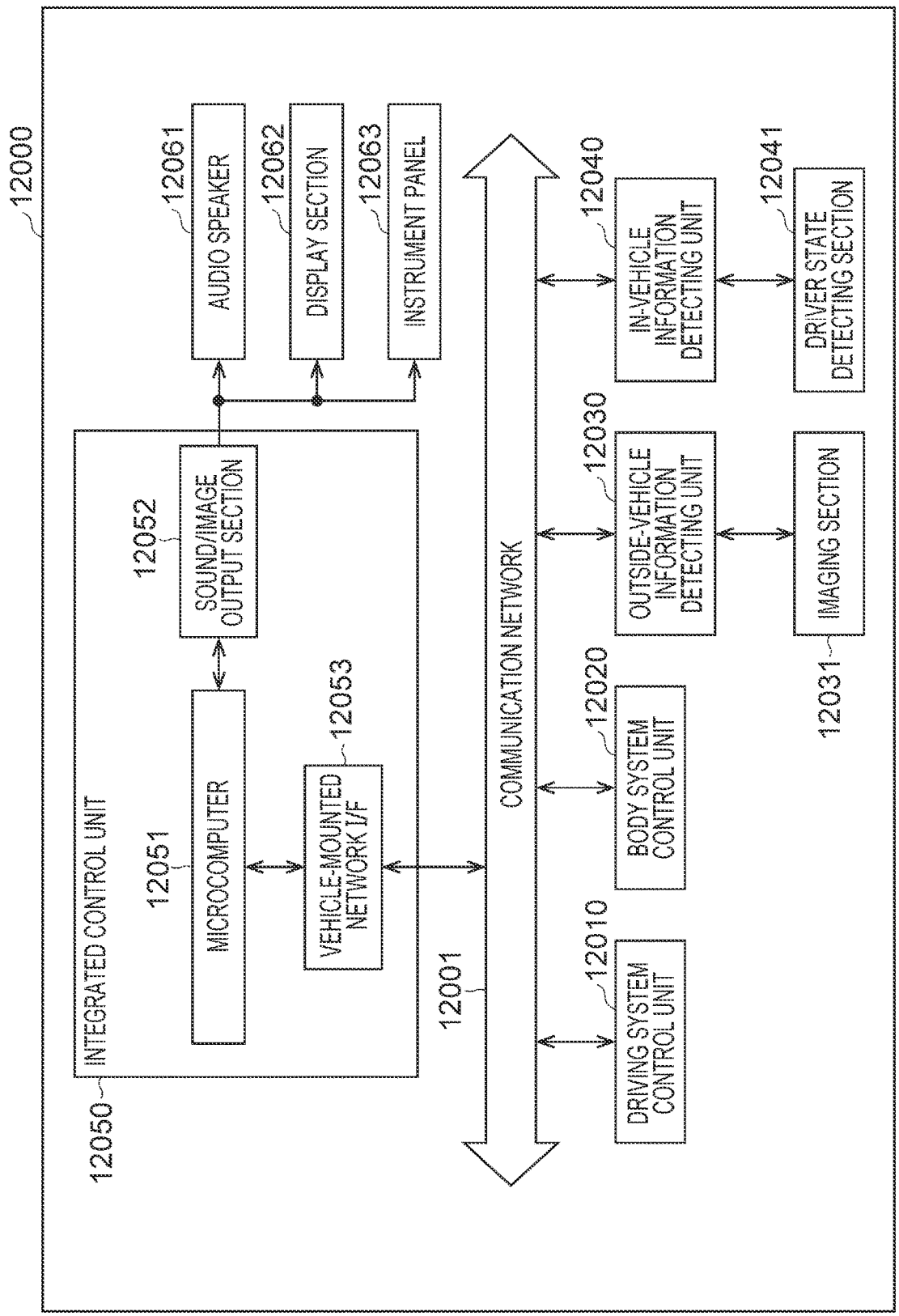
FIG. 17 is a block diagram depicting an example of schematic configuration of a vehicle control system.

FIG. 17 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. Furthermore, as a functional configuration of the integrated control unit 12050, a microcomputer 12051, a sound/image output section 12052, and an in-vehicle network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example in FIG. 17, an audio speaker 12061, a display section 12062, and an instrument panel 12063 are illustrated as the output device. The display section 12062 may, for example, include at least one of an on-board display or a head-up display.

Figure 18:
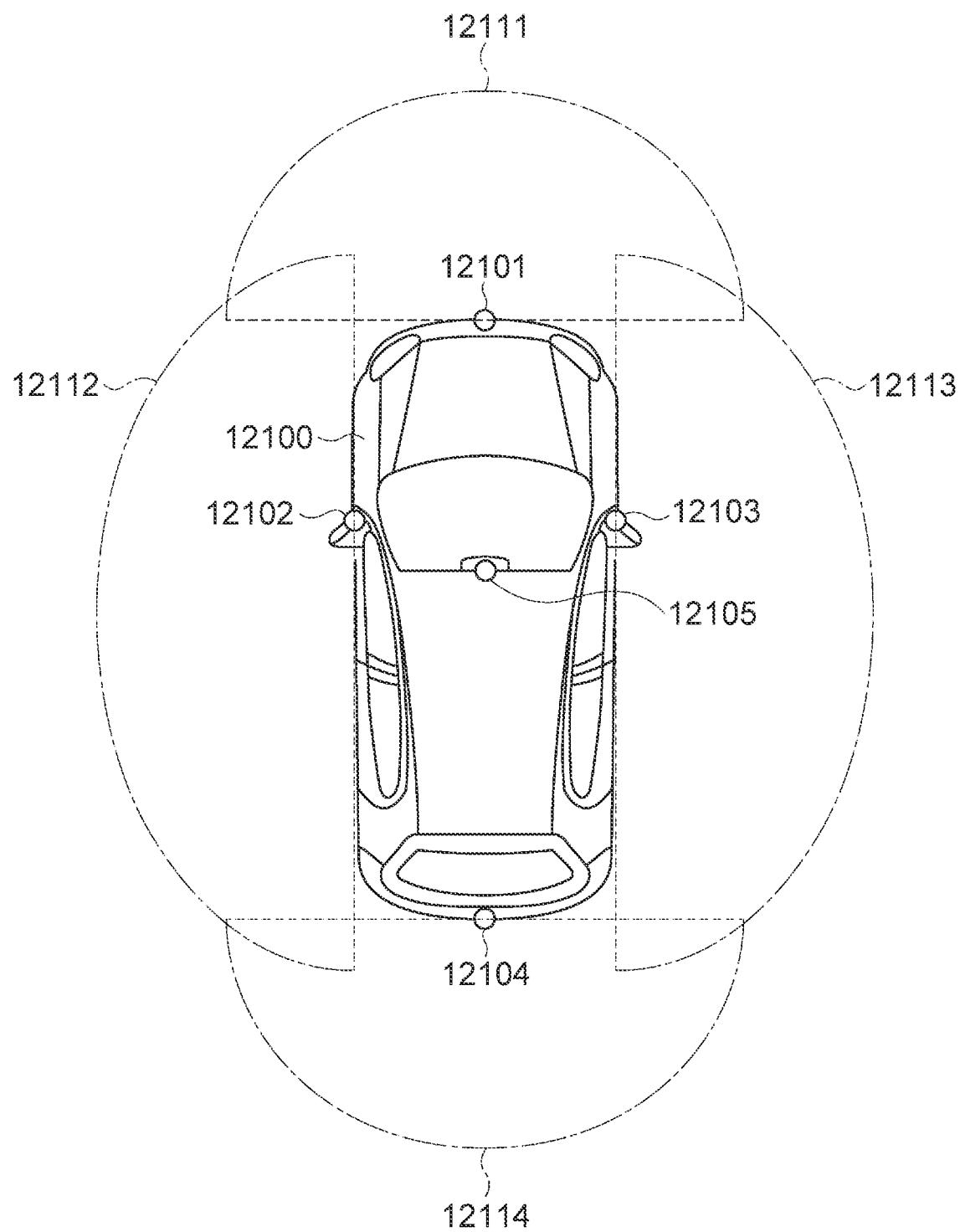
FIG. 18 is an explanatory diagram depicting an example of installation positions of an outside-vehicle information detecting section and an imaging section.

FIG. 18 is a diagram depicting an example of the installation position of the imaging section 12031.

In FIG. 18, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 18 depicts an example of photographing ranges of the imaging sections 12101 to 12104. An imaging range 12111 represents the imaging range of the imaging section 12101 provided to the front nose. Imaging ranges 1211212113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to an embodiment of the present disclosure can be applied has been described above. The technology according to an embodiment of the present disclosure can be applied to, for example, the imaging section 12031 in the configuration described above. Specifically, the imaging devices according to the first to fourth embodiments may be applied to the imaging section 12031. By applying the technology according to an embodiment of the present disclosure, an imaged image with an imaging performance of low noise may be obtained, so that an image quality may be improved.

Note that, the present technology may have the following configurations.

(1) An imaging device including:
 a first substrate on which a pixel array unit that outputs a pixel signal obtained by photoelectrically converting incident light in a first direction is arranged; and
 a second substrate on which a memory array unit that outputs a convolution signal indicating a result of a product-sum operation of an input signal based on the pixel signal in a second direction is arranged, in which
 the first substrate and the second substrate at least partially overlap each other.

(2) The imaging device according to (1), in which the first direction intersects the second direction.

(3) The imaging device according to (1), in which
 the first direction is parallel to the second direction,
 the imaging device further including: metal shield wiring arranged between the first substrate and the second substrate.

(4) The imaging device according to any one of (1) to (3), in which at least one of the pixel signal or the convolution signal is an analog signal.

(5) The imaging device according to any one of (1) to (4), further including:
 a pixel control circuit that controls the pixel array unit;
 a pixel signal processing circuit that processes the pixel signal read from the pixel array unit;
 a CIM input control circuit that controls the memory array unit; and
 a CIM read circuit that processes the convolution signal read from the memory array unit.

(6) The imaging device according to (5), in which
 the pixel control circuit is arranged in a direction parallel to the first direction,
 the pixel signal processing circuit is arranged in a direction perpendicular to the first direction,
 the CIM input control circuit is arranged in a direction parallel to the second direction, and
 the CIM read circuit is arranged in a direction perpendicular to the second direction.

(7) The imaging device according to (5), further including: a third substrate on which the pixel control circuit and the pixel signal processing circuit are arranged.

(8) The imaging device according to (7), in which the third substrate is arranged between the first substrate and the second substrate, or the second substrate is arranged between the first substrate and the third substrate.

(9) The imaging device according to (5), in which on the second substrate, the pixel control circuit and the CIM read circuit are arranged so as to be opposed to each other with the memory array unit interposed between the pixel control circuit and the CIM read circuit, and the pixel signal processing circuit and the CIM input control circuit are arranged so as to be opposed to each other with the memory array unit interposed between the pixel signal processing circuit and the CIM input control circuit.

(10) The imaging device according to any one of (1) to (9), in which a plurality of the memory array units is arrayed in at least one of the first direction or the second direction.

(11) The imaging device according to (2), in which a plane region of the memory array unit is a rectangle, and the second direction is a long side direction of the rectangle.

(12) The imaging device according to (3), in which a plane region of the memory array unit is a rectangle, and the second direction is a short side direction of the rectangle.

(13) The imaging device according to (5), in which the pixel array unit and the pixel signal processing circuit are electrically connected to each other at a central portion of the first substrate and a central portion of the second substrate, respectively.

(14) The imaging device according to (3), in which
 a width of first read wiring for reading the pixel signal is different from a width of second read wiring for reading the convolution signal, and
 a width of the metal shield wiring is the same as or wider than a width of wider read wiring between the first read wiring and the second read wiring.

(15) The imaging device according to (14), in which the metal shield wiring is multilayer wiring, and each metal shield wiring partially overlaps with each metal shield wiring.

(16) The imaging device according to (14), in which the metal shield wiring is arranged near wider read wiring between the first read wiring and the second read wiring.

(17) The imaging device according to claim (14), in which the metal shield wiring is perpendicular to the first read wiring and the second read wiring.

(18) The imaging device according to (5), further including:
 an input/output unit that inputs and outputs a signal; and a switch that switches an output destination of an image signal generated by the pixel signal processing circuit to the CIM input control circuit or the input/output unit.

(19) An electronic device including: an imaging device including a first substrate on which a pixel array unit that outputs a pixel signal obtained by photoelectrically converting incident light in a first direction is arranged, and a second substrate on which a memory array unit that outputs a convolution signal indicating a result of a product-sum operation of an input signal based on the pixel signal in a second direction is arranged, in which the first substrate and the second substrate at least partially overlap each other.

(20) A signal processing method including:
outputting a pixel signal obtained by photoelectrically converting incident light in a first direction by a pixel array unit arranged on a first substrate; and
outputting a convolution signal indicating a result of a product-sum operation of an input signal based on the pixel signal in a second direction by a memory array unit arranged on a second substrate at least partially overlapping the first substrate.

REFERENCE SIGNS LIST 1, 4 Imaging device
11 Pixel array unit
12 Pixel control circuit
13 Pixel signal processing circuit
21 Memory array unit
22 CIM input control circuit
23 CIM read circuit
33 Input/output unit
41 Switch
56 Read wiring
73 Read wiring
81 Metal shield wiring
101 First substrate
102 Second substrate
103 Third substrate

The invention claimed is:

1. An imaging device comprising:
a first substrate on which a pixel array that outputs a pixel signal obtained by photoelectrically converting incident light in a first direction is arranged; and
a second substrate on which a memory array that outputs a convolution signal indicating a result of a product-sum operation of an input signal based on the pixel signal in a second direction is arranged, wherein the first substrate and the second substrate at least partially overlap each other;
a pixel control circuit that controls the pixel array;
a pixel signal processing circuit that processes the pixel signal read from the pixel array;
a computer in memory (CIM) input control circuit that controls the memory array; and
a CIM read circuit that processes the convolution signal read from the memory array, wherein
on the second substrate, the pixel control circuit and the CIM read circuit are arranged so as to be opposed to each other with the memory array interposed between the pixel control circuit and the CIM read circuit, and
the pixel signal processing circuit and the CIM input control circuit are arranged so as to be opposed to each other with the memory array interposed between the pixel signal processing circuit and the CIM input control circuit.

2. The imaging device according to claim 1, wherein the first direction intersects the second direction.

3. The imaging device according to claim 1, wherein the first direction is parallel to the second direction, and the imaging device further comprises:
metal shield wiring arranged between the first substrate and the second substrate.

4. The imaging device according to claim 1, wherein at least one of the pixel signal or the convolution signal is an analog signal.

5. The imaging device according to claim 1, wherein
the pixel control circuit is arranged in a direction parallel to the first direction,
the pixel signal processing circuit is arranged in a direction perpendicular to the first direction,
the CIM input control circuit is arranged in a direction parallel to the second direction, and
the CIM read circuit is arranged in a direction perpendicular to the second direction.

6. The imaging device according to claim 1, further comprising: a third substrate on which the pixel control circuit and the pixel signal processing circuit are arranged.

7. The imaging device according to claim 6, wherein the third substrate is arranged between the first substrate and the second substrate, or the second substrate is arranged between the first substrate and the third substrate.

8. The imaging device according to claim 1, wherein the memory array is one of a plurality memory arrays arrayed in at least one of the first direction or the second direction.

9. The imaging device according to claim 2, wherein a plane region of the memory array is a rectangle, and the second direction is parallel to a long side of the rectangle, the long side being longer than a short side of the rectangle.

10. The imaging device according to claim 3, wherein a plane region of the memory array is a rectangle, and the second direction is parallel to a short side of the rectangle, the short side being shorter than a long side of the rectangle.

11. The imaging device according to claim 1, wherein the pixel array and the pixel signal processing circuit are electrically connected to each other at a central portion of the first substrate and a central portion of the second substrate, respectively.

12. The imaging device according to claim 3, wherein
a width of first read wiring for reading the pixel signal is different from a width of second read wiring for reading the convolution signal, and
a width of the metal shield wiring is the same as or wider than a width of wider read wiring between the first read wiring and the second read wiring.

13. The imaging device according to claim 12, wherein the metal shield wiring is multilayer wiring, and each metal shield wiring partially overlaps with each metal shield wiring.

14. The imaging device according to claim 12, wherein the metal shield wiring is arranged near wider read wiring between the first read wiring and the second read wiring.

15. The imaging device according to claim 12, wherein the metal shield wiring is perpendicular to the first read wiring and the second read wiring.

16. The imaging device according to claim 1, further comprising:
an input/output circuit that inputs and outputs a signal; and
a switch that switches an output destination of an image signal generated by the pixel signal processing circuit to the CIM input control circuit or the input/output circuit.

17. An electronic device comprising an imaging device according to claim 1.

18. A signal processing method comprising:
outputting a pixel signal obtained by photoelectrically converting incident light in a first direction by a pixel array arranged on a first substrate; and
outputting a convolution signal indicating a result of a product-sum operation of an input signal based on the pixel signal in a second direction by a memory array arranged on a second substrate at least partially overlapping the first substrate;
controlling, by a pixel control circuit, the pixel array;
processing, by a pixel signal processing circuit, the pixel signal read from the pixel array;
controlling, by a computer in memory (CIM) input control circuit, the memory array; and
processing, by a CIM read circuit, the convolution signal read from the memory array, wherein
on the second substrate, the pixel control circuit and the CIM read circuit are arranged so as to be opposed to each other with the memory array interposed between the pixel control circuit and the CIM read circuit, and
the pixel signal processing circuit and the CIM input control circuit are arranged so as to be opposed to each other with the memory array interposed between the pixel signal processing circuit and the CIM input control circuit.

* * * * *